(12) United States Patent
Lee et al.

(10) Patent No.: US 12,250,873 B2
(45) Date of Patent: Mar. 11, 2025

(54) LIGHT EMITTING DEVICE

(71) Applicant: Samsung Display Co., Ltd., Yongin-si (KR)

(72) Inventors: Yoonkyoo Lee, Seoul (KR); Jin-Won Sun, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 716 days.

(21) Appl. No.: 17/445,472

(22) Filed: Aug. 19, 2021

(65) Prior Publication Data
US 2022/0173339 A1    Jun. 2, 2022

(30) Foreign Application Priority Data

Dec. 2, 2020   (KR) .................. 10-2020-0166842

(51) Int. Cl.
| | |
|---|---|
| *H01L 51/50* | (2006.01) |
| *H10K 85/30* | (2023.01) |
| *H10K 85/40* | (2023.01) |
| *H10K 85/60* | (2023.01) |
| *H10K 50/11* | (2023.01) |
| *H10K 101/10* | (2023.01) |

(52) U.S. Cl.
CPC .......... *H10K 85/346* (2023.02); *H10K 85/40* (2023.02); *H10K 85/654* (2023.02); *H10K 85/6572* (2023.02); *H10K 85/6574* (2023.02); *H10K 50/11* (2023.02); *H10K 2101/10* (2023.02)

(58) Field of Classification Search
None
See application file for complete search history.

(56) References Cited

U.S. PATENT DOCUMENTS

| | | |
|---|---|---|
| 6,645,645 B1 | 11/2003 | Adachi et al. |
| 10,361,378 B2 | 7/2019 | Tada et al. |
| 2007/0012915 A1* | 1/2007 | Lee .................. H10K 85/631 |
| | | 257/40 |
| 2019/0165292 A1* | 5/2019 | Hong .................. H10K 50/11 |
| 2020/0308209 A1 | 10/2020 | Yoon et al. |

FOREIGN PATENT DOCUMENTS

| | | |
|---|---|---|
| KR | 10-2015-0097703 A | 8/2015 |
| KR | 10-1556822 B1 | 10/2015 |
| KR | 10-2016-0080090 A | 7/2016 |
| KR | 10-2072211 B1 | 1/2020 |
| KR | 10-2020-0115890 A | 10/2020 |

\* cited by examiner

*Primary Examiner* — Gregory D Clark
(74) *Attorney, Agent, or Firm* — Womble Bond Dickinson (US) LLP

(57) ABSTRACT

A light emitting device includes a first electrode, a second electrode disposed on the first electrode, and an emission layer disposed between the first electrode and the second electrode, wherein the emission layer includes a first host represented by Formula 1, a second host different from the first host, and a dopant containing an organometallic complex, and thereby an improved service life characteristic may be exhibited:

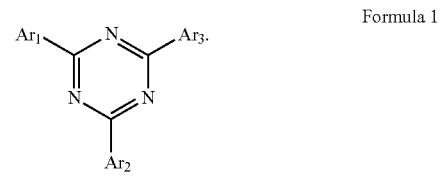

Formula 1

18 Claims, 6 Drawing Sheets

LIGHT EMITTING DEVICE

CROSS-REFERENCE TO RELATED APPLICATION

This application claims priority to and the benefit of Korean Patent Application No. 10-2020-0166842, filed on Dec. 2, 2020, the entire content of which is hereby incorporated by reference.

BACKGROUND

One or more aspects of embodiments of the present disclosure relate to a light emitting device, and for example, to a light emitting device including a dopant and a plurality of hosts in an emission layer.

Recently, organic electroluminescence displays are being actively developed as image display apparatuses. An organic electroluminescence display includes a so-called self-luminescent light emitting device, in which holes and electrons respectively injected from a first electrode and a second electrode recombine in an emission layer, and a luminescent material of the emission layer emits light to implement display.

In the application of a light emitting device to a display apparatus, there is a demand for a light emitting device having a low driving voltage, a high luminous efficiency, and/or a long service life (e.g., lifespan), and new materials for a light emitting device capable of stably attaining such characteristics are desired.

Studies are being conducted on combinations of various emission layer materials and improving the stability of these materials in order to implement a light emitting device having a high efficiency and/or a long service life.

SUMMARY

One or more aspects of embodiments of the present disclosure are directed toward a light emitting device having good or suitable luminous efficiency and exhibiting a long service life characteristic.

One or more embodiments of the present disclosure provide a light emitting device including: a first electrode; a second electrode disposed on the first electrode; and an emission layer that is disposed between the first electrode and the second electrode, and includes a first host represented by Formula 1, a second host different from the first host, and a dopant containing an organometallic complex:

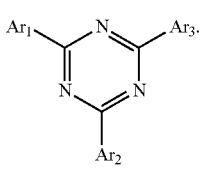

Formula 1

In Formula 1 above, $Ar_1$ to $Ar_3$ may each independently be a substituted or unsubstituted aryl group having 6 to 30 ring-forming carbon atoms, or a substituted or unsubstituted heteroaryl group having 2 to 30 ring-forming carbon, and at least one among $Ar_1$ to $Ar_3$ may be a substituted or unsubstituted aryl group having 6 to 30 ring-forming carbon atoms and containing a halogen atom or a cyano group as a substituent, or a hexagonal (e.g., six-membered) heterocycle containing a nitrogen atom as a ring-forming atom.

In an embodiment, at least one among $Ar_1$ to $Ar_3$ may be represented by any one among EW-1 to EW-5:

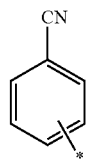

EW-1

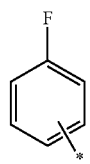

EW-2

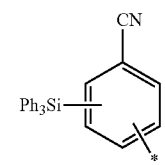

EW-3

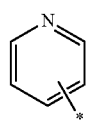

EW-4

EW-5

In an embodiment, the second host may be represented by Formula 2:

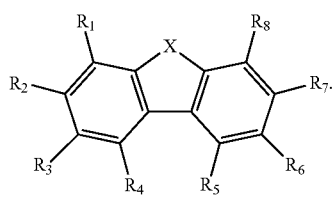

Formula 2

In Formula 2 above, X may be $NR_a$, O, or $CR_bR_c$, and $R_1$ to $R_8$, $R_a$, $R_b$, and $R_c$ may each independently be a hydrogen atom, a deuterium atom, a substituted or unsubstituted silyl group, a substituted or unsubstituted alkyl group having 1 to 20 carbon atoms, a substituted or unsubstituted aryl group having 6 to 60 ring-forming carbon atoms, or a substituted or unsubstituted heterocycle having 2 to 60 ring-forming carbon atoms. At least one of $R_a$, $R_b$, or $R_c$ may be represented by Formula A:

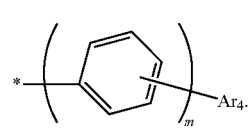

Formula A

In Formula A, m may be an integer of 0 to 2, and $Ar_4$ may be a substituted or unsubstituted silyl group, a substituted or unsubstituted aryl group having 6 to 60 ring-forming carbon atoms, or a substituted or unsubstituted heterocycle having 2 to 60 ring-forming carbon atoms.

In an embodiment, the dopant may be represented by Formula 3:

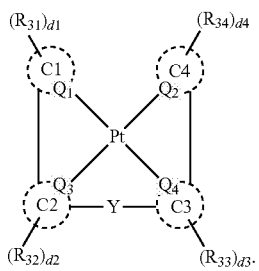

Formula 3

In Formula 3, $Q_1$ to $Q_4$ may each independently be C or N, and rings C1 to C4 may each independently be a substituted or unsubstituted hydrocarbon ring having 5 to 30 ring-forming carbon atoms, or a substituted or unsubstituted heterocycle having 2 to 30 ring-forming carbon atoms. Y may be O or S, d1 to d4 may each independently be an integer of 0 to 4, and $R_{31}$ to $R_{34}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or may be bonded to an adjacent group to form a ring.

In an embodiment, the dopant represented by Formula 3 may be represented by Formula 3-1:

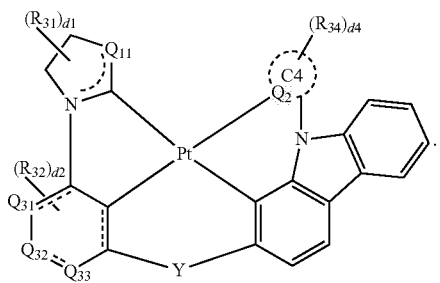

Formula 3-1

In Formula 3-1, $Q_{11}$, $Q_{31}$, $Q_{32}$, and $Q_{33}$ may each independently be N, $NR_{11}$, $CR_{12}$, $CR_{12}R_{13}$, $BR_{14}$, or $BR_{14}R_{15}$, and $R_{11}$ to $R_{15}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or may be bonded to an adjacent group to form a ring. Y, ring C4, $R_{31}$, $R_{32}$, $R_{33}$, d1, d2 and d4 may each independently be the same as defined in Formula 3.

In an embodiment, a weight ratio of the first host and the second host may be about 3:7 to about 7:3.

In an embodiment, the emission layer may be to emit blue phosphorescence.

In an embodiment, the light emitting device may further include a capping layer having a refractive index of about 1.6 or more disposed on the second electrode.

One or more embodiments of the present disclosure provide a light emitting device including a first electrode; a second electrode disposed on the first electrode; and an emission layer that is disposed between the first electrode and the second electrode, and contains a first host and a second host that are different from each other and a dopant containing an organometallic complex, wherein the first host contains a triazine core, and at least one electron-accepting substituent substituted at (e.g., on) the triazine core, and the electron-accepting substituent is an aryl group substituted with a cyano group or a halogen atom, or is a hexagonal heterocycle containing a nitrogen atom as a ring-forming atom.

In an embodiment, the electron-accepting substituent may be represented by any one among EW-1 to EW-5:

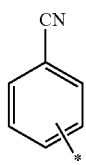
EW-1

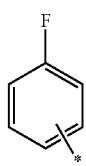
EW-2

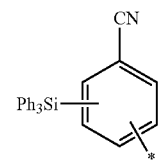
EW-3

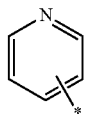
EW-4

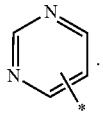
EW-5

In an embodiment, the first host may be represented by Formula 1:

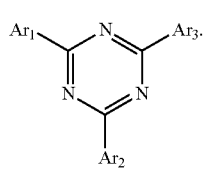

Formula 1

In Formula 1, $Ar_1$ to $Ar_3$ may each independently be a substituted or unsubstituted aryl group having 6 to 30 ring-forming carbon atoms, or a substituted or unsubstituted heteroaryl group having 2 to 30 ring-forming carbon, and at least one among $Ar_1$ to $Ar_3$ may be a substituted or unsubstituted aryl group having 6 to 30 ring-forming carbon atoms and containing a halogen atom or a cyano group as a substituent, or is a hexagonal heterocycle containing a nitrogen atom as a ring-forming atom.

In an embodiment, the second host may be represented by Formula 2:

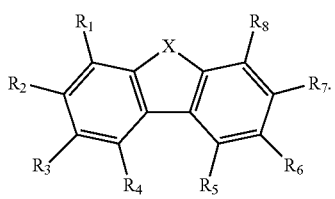

Formula 2

In Formula 2, X may be $NR_a$, O, or $CR_bR_c$, and $R_1$ to $R_8$, $R_a$, $R_b$, and $R_c$ may each independently be a hydrogen atom, a deuterium atom, a substituted or unsubstituted silyl group, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms. At least one of $R_a$, $R_b$, or $R_c$ may be represented by Formula A:

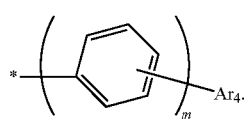

Formula A

In Formula A, m may be an integer of 0 to 2, and $Ar_4$ may be a substituted or unsubstituted silyl group, a substituted or unsubstituted aryl group having 6 to 60 ring-forming carbon atoms, or a substituted or unsubstituted heterocycle having 2 to 60 ring-forming carbon atoms.

In an embodiment, the dopant may be represented by Formula 3:

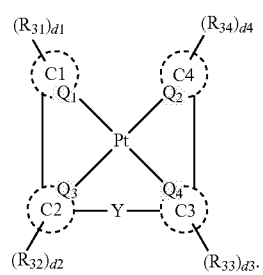

Formula 3

In Formula 3, $Q_1$ to $Q_4$ may each independently be C or N, and rings C1 to C4 may each independently be a substituted or unsubstituted hydrocarbon ring having 5 to 30 ring-forming carbon atoms, or a substituted or unsubstituted heterocycle having 2 to 30 ring-forming carbon atoms. Y may be O or S, d1 to d4 may each independently be an integer of 0 to 4, and $R_{31}$ to $R_{34}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or may be bonded to an adjacent group to form a ring.

In an embodiment, the emission layer may be to emit blue phosphorescence.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
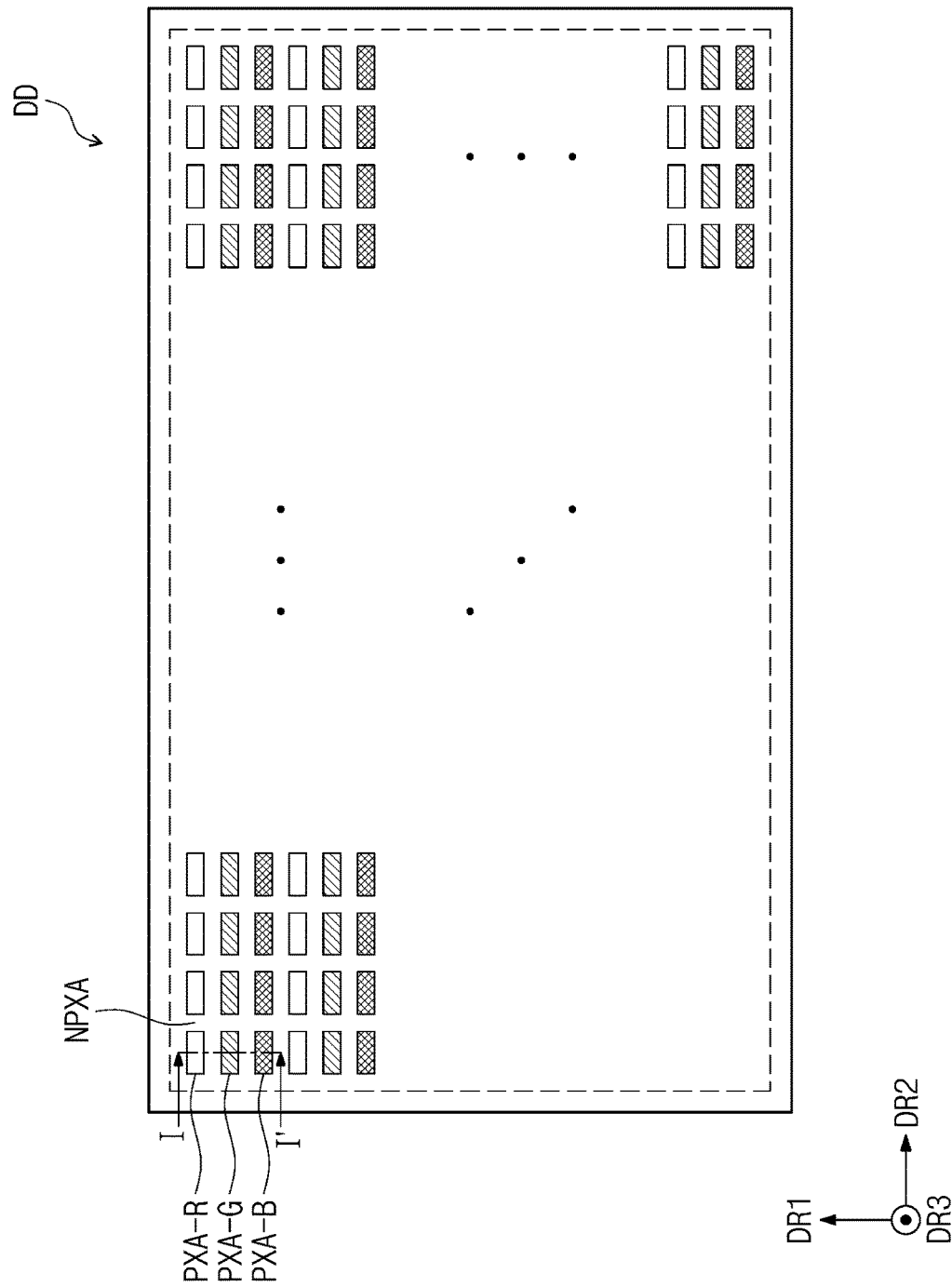
FIG. 1 is a plan view illustrating a display apparatus according to an embodiment of the present disclosure.

The present disclosure may be modified in many alternate forms, and selected embodiments will be shown in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

When explaining the drawings, like reference numbers refer to like elements throughout, and duplicative descriptions thereof may not be provided. In the accompanying drawings, the dimensions of each structure may be exaggerated for clarity of the present disclosure. It will be understood that, although the terms "first," "second," etc. may be used herein to describe various elements, these elements should not be limited by these terms. These terms are only used to distinguish one element from another. For example, a first element may be referred to as a second element, and, similarly, the second element may be referred to as the first element, without departing from the scope of the present disclosure. The singular forms include the plural forms unless the context clearly indicates otherwise.

In the present application, it will be understood that the terms "include," "have" etc., specify the presence of a feature, a fixed number, a step, an operation, an element, a component, or a combination thereof disclosed in the specification, but do not exclude the possibility of presence or addition of one or more other features, fixed numbers, steps, operations, elements, components, or combination thereof.

In the present application, when a part such as a layer, a film, a region, or a plate is referred to as being "on" or "above" another part, it can be directly on the other part, or an intervening part may be present. Similarly, when a part such as a layer, a film, a region, or a plate is referred to as being "under" or "below" another part, it can be directly under the other part, or an intervening part may be present. When an element is referred to as being "directly on," "directly above," "directly under," or "directly below" another element, there are no intervening elements present. It will be understood that when a part is referred to as being "on" another part, it can be disposed on the other part, or disposed under the other part as well.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

In the specification, the term "substituted or unsubstituted" may refer to being unsubstituted, or substituted or with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the listed substituents may be further substituted or unsubstituted. For example, a biphenyl group may be interpreted as a named aryl group or as a phenyl group substituted with a phenyl group.

In the specification, the term "bonded to an adjacent group to form a ring" may refer to being bonded to an adjacent group to form a substituted or unsubstituted hydrocarbon ring, or a substituted or unsubstituted heterocycle. The term "hydrocarbon ring" includes an aliphatic hydrocarbon ring and an aromatic hydrocarbon ring. The term "heterocycle" includes an aliphatic heterocycle and an aromatic heterocycle. The hydrocarbon ring and the heterocycle may each independently be monocyclic or polycyclic. In some embodiments, the rings formed by being bonded to each other may be connected to another ring to form a spiro structure.

In the specification, the term "adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In some embodiments, two methyl groups in 4,5-dimethylphenanthrene may be interpreted as "adjacent groups" to each other.

In the specification, examples of the halogen atom may include a fluorine atom, a chlorine atom, a bromine atom, or an iodine atom.

In the specification, the alkyl group may be a linear, branched or cyclic alkyl. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

The term "hydrocarbon ring group" herein refers to any functional group or substituent derived from an aliphatic hydrocarbon ring. The hydrocarbon ring group may be a saturated hydrocarbon ring group having 5 to 20 ring-forming carbon atoms.

The term "aryl group" herein refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments of the present disclosure are not limited thereto.

In the specification, the fluorenyl group may be substituted, and two substituents may be bonded to each other to form a spiro structure. Examples of cases where the fluorenyl group is substituted may include the following. However, embodiments of the present disclosure are not limited thereto.

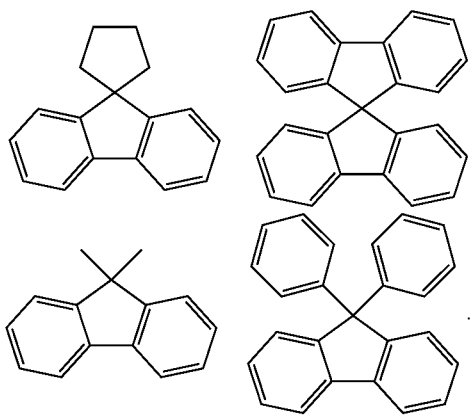

In the specification, the term "heterocyclic group" refers to any functional group or substituent derived from a ring containing at least one of boron (B), oxygen (O), nitrogen (N), phosphorus (P), silicon (Si), or sulfur (S) as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the specification, the heterocyclic group may include at least one of B, O, N, P, Si or S as a heteroatom. When the heterocyclic group includes two or more heteroatoms, the two or more heteroatoms may be the same as or different from each other. The heterocyclic group may be a monocyclic heterocyclic group or a polycyclic heterocyclic group and in some embodiments may be a heteroaryl group. The number of ring-forming carbon atoms in the heterocyclic group may be 2 to 30, 2 to 20, or 2 to 10.

In the specification, the term "aliphatic heterocyclic group" may include one or more among B, O, N, P, Si and S as heteroatoms. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but embodiments of the present disclosure are not limited thereto.

In the specification, the heteroaryl group may include at least one of B, O, N, P, Si, or S as a heteroatom. When the heteroaryl group contains two or more hetero atoms, the two or more hetero atoms may be the same as or different from each other. The heteroaryl group may be a monocyclic heterocyclic group or a polycyclic heterocyclic group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridly group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments of the present disclosure are not limited thereto.

In the specification, the above description with respect to the aryl group may be applied to an arylene group except that the arylene group is a divalent group. The explanation on the aforementioned heteroaryl group may be applied to the heteroarylene group except that the heteroarylene group is a divalent group.

In the specification, the silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the specification, the number of carbon atoms in the amino group is not specifically limited, but may be 1 to 30. The term "amino group" may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but are not limited thereto.

In the specification, the number of ring-forming carbon atoms in the carbonyl group may be 1 to 40, 1 to 30, or 1 to 20. For example, the carbonyl group may have the following structures, but embodiments of the present disclosure are not limited thereto.

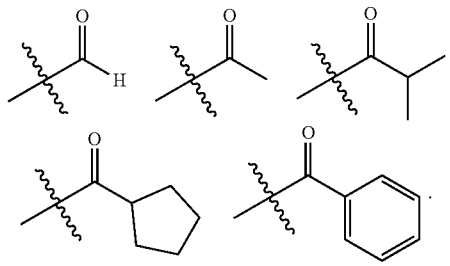

In the specification, the number of carbon atoms in the sulfinyl group and the sulfonyl group is not particularly limited, but may be 1 to 30. The term "sulfinyl group" may include an alkyl sulfinyl group and an aryl sulfinyl group. The sulfonyl group may include an alkyl sulfonyl group and an aryl sulfonyl group.

In the specification, the term "thiol group" may include an alkylthio group and an arylthio group. The term "thiol group" may refer to a sulfur atom bonded to the alkyl group or the aryl group as defined above. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments of the present disclosure are not limited thereto.

The term "oxy group" herein may refer to an oxygen atom bonded to the alkyl group or the aryl group as defined above. The term "oxy group" may include an alkoxy group and an aryl oxy group. The alkoxy group may be a linear chain, a branched chain or a ring chain. The number of carbon atoms in the alkoxy group is not specifically limited, but may be, for example, 1 to 20 or 1 to 10. Examples of an oxy group may include methoxy, ethoxy, n-propoxy, isopropoxy, butoxy, pentyloxy, hexyloxy, octyloxy, nonyloxy, decyloxy, benzyloxy, etc., but embodiments of the present disclosure are not limited thereto.

The term "boron group" herein may refer to a boron atom bonded to the alkyl group or the aryl group as defined above. The term "boron group" includes an alkyl boron group and an aryl boron group. Examples of the boron group may include a trimethylboron group, a triethylboron group, a t-butyldimethylboron group, a triphenylboron group, a diphenylboron group, a phenylboron group, etc., but embodiments of the present disclosure are not limited thereto.

In the specification, the alkenyl group may be linear or branched. The number of carbon atoms in the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but embodiments of the present disclosure are not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, etc., but embodiments of the present disclosure are not limited thereto.

In the specification, the alkyl group in the alkylthio group, alkylsulfoxy group, alkylaryl group, alkylamino group, alkyl boron group, alkyl silyl group, and/or alkyl amine group may be substantially the same as the examples of the alkyl group described above.

In the specification, the aryl group in the aryloxy group, arylthio group, arylsulfoxy group, arylamino group, arylboron group, arylsilyl group, and/or arylamine group may be substantially the same as the examples of the aryl group described above.

A direct linkage herein may refer to a single bond.
In the specification,

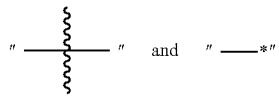

refer to a position to be connected.

Hereinafter, embodiments of the present disclosure will be described with reference to the accompanying drawings.

Figure 2:
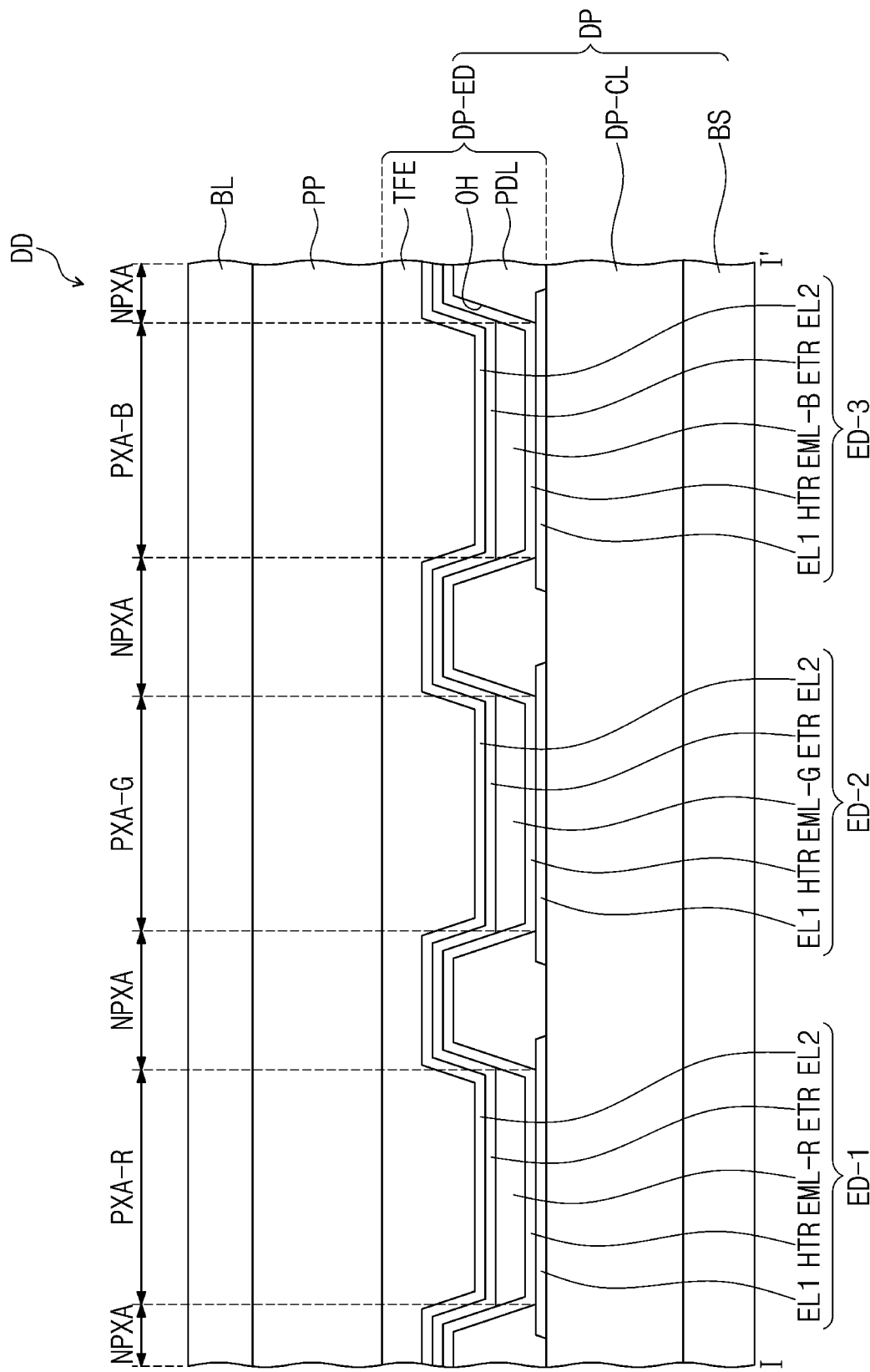
FIG. 2 is a cross-sectional view of a display apparatus according to an embodiment of the present disclosure.

FIG. 1 is a plan view illustrating an embodiment of a display apparatus DD. FIG. 2 is a cross-sectional view of the display apparatus DD of the embodiment. FIG. 2 is a cross-sectional view along line I-I' of FIG. 1.

The display apparatus DD may include a display panel DP and an optical layer PP disposed on the display panel DP.

The display panel DP includes light emitting devices ED-1, ED-2, and ED-3. The display apparatus DD may include a plurality of light emitting devices ED-1, ED-2, and ED-3. The optical layer PP may be disposed on the display panel DP and may control or reduce reflection of external light in the display panel DP. The optical layer PP may include, for example, a polarization layer and/or a color filter layer. In some embodiments, the optical layer PP may be omitted from the display apparatus DD of an embodiment.

A base substrate BL may be disposed on the optical layer PP. The base substrate BL may provide a base surface on which the optical layer PP disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In some embodiments, the base substrate BL may be omitted.

In some embodiments, the display apparatus DD according to an embodiment may further include a filling layer. The filling layer may be disposed between a display device layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 disposed between portions of the pixel defining film PDL, and an encapsulation layer TFE disposed on the light emitting devices ED-1, ED-2, and ED-3.

The base layer BS may provide a base surface on which the display device layer DP-ED is disposed. The base layer BS may be a glass substrate, a metal substrate, a plastic substrate, etc. However, embodiments of the present disclosure are not limited thereto, and the base layer BS may be an inorganic layer, an organic layer, or a composite material layer.

In an embodiment, the circuit layer DP-CL is disposed on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described later. Each of the light emitting devices ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting devices ED-1, ED-2, and ED-3 are disposed in the openings OH defined in the pixel defining film PDL, and the hole transport region HTR, the electron transport region ETR, and the second electrode EL2 are provided as a common layer in the entire light emitting devices ED-1, ED-2, and ED-3. However, embodiments of the present disclosure are not limited thereto, and for example, the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR of the light emitting devices ED-1, ED-2, and ED-3 in an embodiment may be provided by being patterned in an inkjet printing method.

The encapsulation layer TFE may cover the light emitting devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film may protect the display device layer DP-ED from moisture/oxygen, and the encapsulation-organic film protects the display device layer DP-ED from foreign substances (such as dust particles). The encapsulation-inorganic film may include silicon nitride, silicon oxynitride, silicon oxide, titanium oxide, aluminum oxide, and/or the like, but embodiments of the present disclosure are not particularly limited thereto. The encapsulation-organic film may include an acrylic-based compound, an epoxy-based compound, and/or the like. The encapsulation-organic film may include a photopolymerizable organic material, but embodiments of the present disclosure are not particularly limited thereto.

The encapsulation layer TFE may be disposed on the second electrode EL2, and may be disposed to fill the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B may each be to emit light generated from the light emitting devices ED-1, ED-2 and ED-3, respectively. The light emitting regions PXA-R, PXA-G, and PXA-B may be spaced apart from each other in a plane.

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In some embodiments, in the specification, each of the light emitting regions PXA-R, PXA-G, and PXA-B may correspond to a pixel. The pixel defining film PDL may separate the light emitting devices ED-1, ED-2, and ED-3. The emission layers EML-R, EML-G and EML-B of the light emitting devices ED-1, ED-2 and ED-3 may be disposed in openings OH defined by the pixel defining film PDL and separated from each other.

The light emitting regions PXA-R, PXA-G and PXA-B may be divided into a plurality of groups according to the color of light generated from the light emitting devices ED-1, ED-2 and ED-3. In the display apparatus DD of an embodiment shown in FIGS. 1 and 2, three light emitting regions PXA-R, PXA-G, and PXA-B, which respectively emit red light, green light, and blue light, are illustrated. For example, the display apparatus DD of an embodiment may include the red light emitting region PXA-R, the green light emitting region PXA-G, and the blue light emitting region PXA-B, which are separated from one another.

In the display apparatus DD according to an embodiment, the plurality of light emitting devices ED-1, ED-2 and ED-3 may be to emit light beams having wavelengths different from one another. For example, in an embodiment, the display apparatus DD may include a first light emitting device ED-1 that emits red light, a second light emitting device ED-2 that emits green light, and a third light emitting device ED-3 that emits blue light. For example, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, the embodiment of the present disclosure is not limited thereto, and the first to third light emitting devices ED-1, ED-2, and ED-3 may be to emit light (light beams) in the same wavelength range or at least one light emitting device may be to emit light (a light beam) in a wavelength range different from the others. For example, the first to third light emitting devices ED-1, ED-2, and ED-3 may all be to emit blue light.

The light emitting regions PXA-R, PXA-G, and PXA-B in the display apparatus DD according to an embodiment may be arranged in a stripe form. Referring to FIG. 1, the plurality of red light emitting regions PXA-R may be arranged with each other along a second directional axis DR2, the plurality of green light emitting regions PXA-G may be arranged with each other along the second directional axis DR2, and the plurality of blue light emitting regions PXA-B may be arranged with each other along the second directional axis DR2. In addition, a red light emitting region PXA-R, a green light emitting region PXA-G, and a blue light emitting region PXA-B may be alternatingly arranged with each other in this order along a first directional axis DR1.

FIGS. 1 and 2 illustrate that all the light emitting regions PXA-R, PXA-G, and PXA-B have a similar area, but embodiments of the present disclosure are not limited thereto, and the light emitting regions PXA-R, PXA-G, and PXA-B may have different areas from each other according to a wavelength range of the emitted light. In this case, the areas of the light emitting regions PXA-R, PXA-G, and PXA-B may refer to areas when viewed in a plane defined by the first directional axis DR1 and the second directional axis DR2 (e.g., in a plan view).

The arrangement form (e.g., pattern) of the light emitting regions PXA-R, PXA-G, and PXA-B is not limited to that illustrated in FIG. 1, and the order in which the red light emitting region PXA-R, the green light emitting region PXA-G, and the blue light emitting region PXA-B are arranged may be variously combined according to the desired characteristics of the display apparatus DD. For example, the arrangement form of the light emitting regions PXA-R, PXA-G, and PXA-B may be a PENTILE® arrangement form or a diamond arrangement form.

In some embodiments, the areas of the light emitting regions PXA-R, PXA-G, and PXA-B may be different from each other. For example, in an embodiment, the area of the green light emitting region PXA-G may be smaller than that of the blue light emitting region PXA-B, but embodiments of the present disclosure are not limited thereto.

Hereinafter, FIGS. 3 to 6 are cross-sectional views schematically illustrating light emitting devices according to embodiments. The light emitting devices ED according to embodiments may each include a first electrode EL1, a second electrode EL2 facing the first electrode EL1, and at least one functional layer disposed between the first electrode EL1 and the second electrode EL2. The at least one functional layer may include a hole transport region HTR, an emission layer EML, and an electron transport region ETR that are sequentially stacked. For example, each of the light emitting devices ED of embodiments may include the first electrode EL1, the hole transport region HTR, the emission layer EML, the electron transport region ETR, and the second electrode EL2 that are sequentially stacked.

Figure 3:
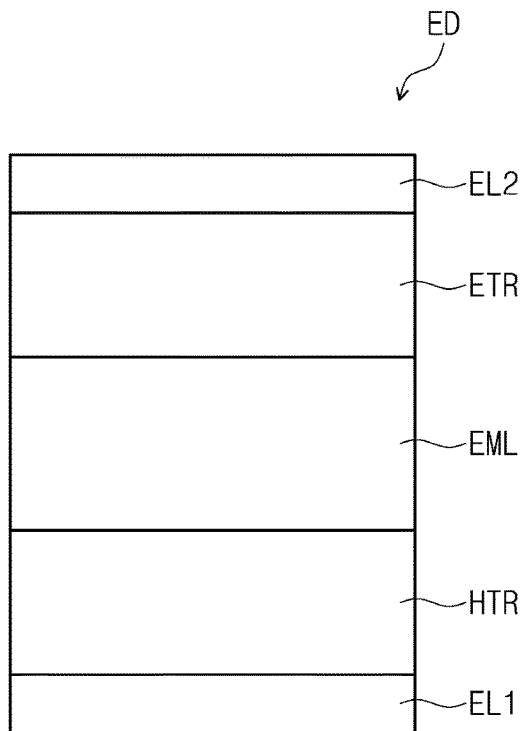
FIG. 3 is a cross-sectional view schematically illustrating a light emitting device according to an embodiment of the present disclosure.
Figure 4:
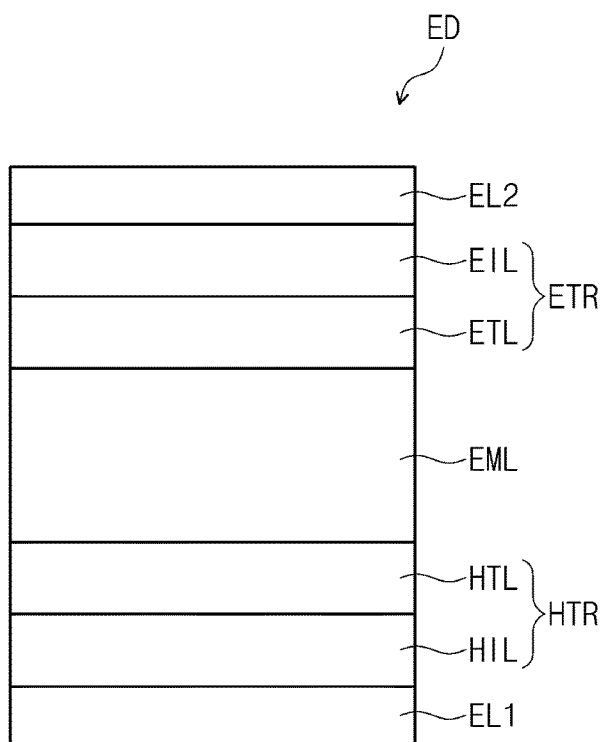
FIG. 4 is a cross-sectional view schematically illustrating a light emitting device according to an embodiment of the present disclosure.
Figure 5:
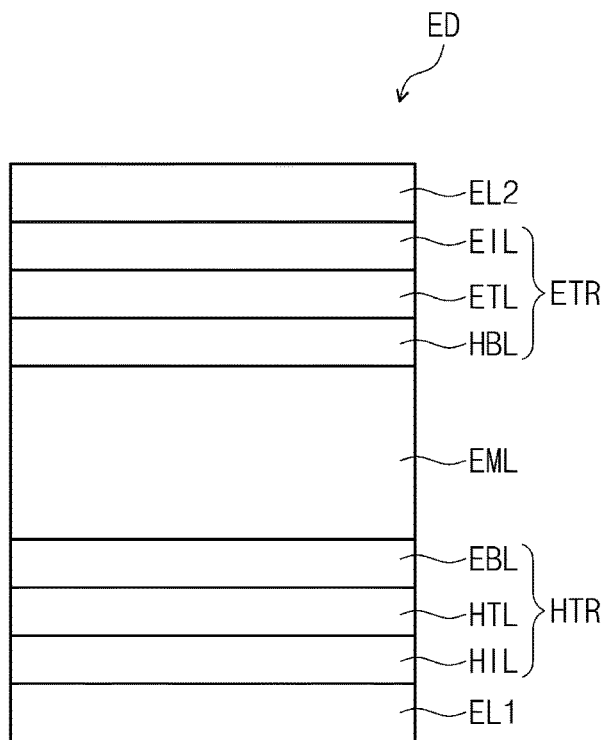
FIG. 5 is a cross-sectional view schematically illustrating a light emitting device according to an embodiment of the present disclosure.
Figure 6:
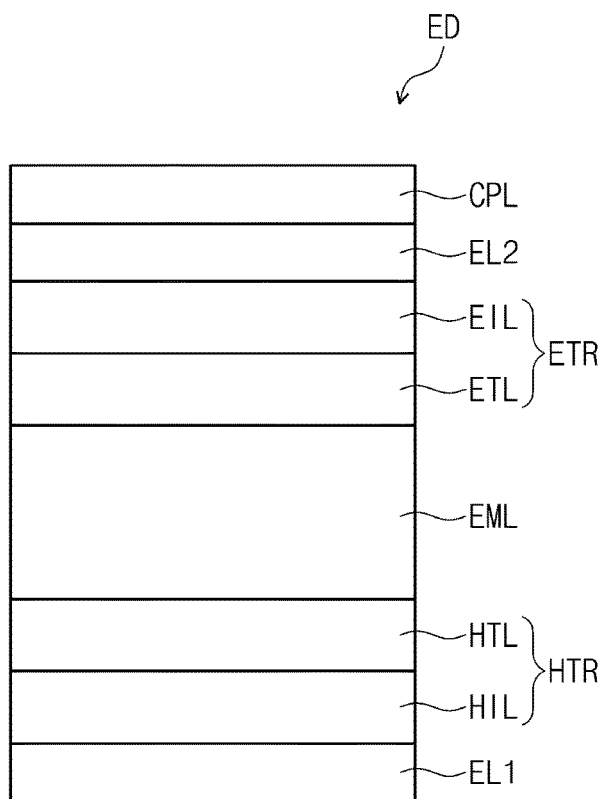
FIG. 6 is a cross-sectional view schematically illustrating a light emitting device according to an embodiment of the present disclosure.

Compared to FIG. 3, FIG. 4 illustrates a cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. Compared to FIG. 3, FIG. 5 illustrates a cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting device ED of an embodiment including a capping layer CPL disposed on a second electrode EL2.

The emission layer EML of the light emitting device ED of an embodiment may include an organometallic complex dopant, and a plurality of hosts that are different from each other.

In the light emitting device ED according to an embodiment, the first electrode EL1 has conductivity (e.g., may be conductive). The first electrode EL1 may be formed of a metal material, a metal alloy, or a conductive compound. The first electrode EL1 may be an anode or a cathode. However, embodiments of the present disclosure are not limited thereto. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may be formed utilizing a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In some embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments of the present disclosure are not limited thereto. In some embodiments, the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer or an emission-auxiliary layer, or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, and may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but embodiments of the present disclosure are not limited thereto.

The hole transport region HTR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

The hole transport region HTR in the light emitting device ED of an embodiment may include materials of the hole transport region, which will be described below.

The hole transport region HTR may include a compound represented by Formula H-1:

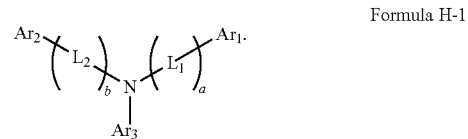

Formula H-1

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer of 0 to 10. In some embodiments, when a or b is an integer of 2 or greater, a plurality of $L_1$'s and $L_2$'s may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In some embodiments, in Formula H-1, $Ar_3$ may be a substituted or unsubstituted aryl group having 6 to 30 ring-forming carbon atoms, or a substituted or unsubstituted heteroaryl group having 2 to 30 ring-forming carbon atoms.

The compound represented by Formula H-1 may be a monoamine compound (e.g., may include only one amine functional group). In some embodiments, the compound represented by Formula H-1 above may be a diamine compound (e.g., may include two amine functional groups) in which at least one among $Ar_1$ to $Ar_3$ includes an amine group as a substituent. In some embodiments, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one among the compounds of Compound Group H. However, the compounds listed in Compound Group H are examples, and the compounds represented by Formula H-1 are not limited to those represented by Compound Group H:

Compound Group H

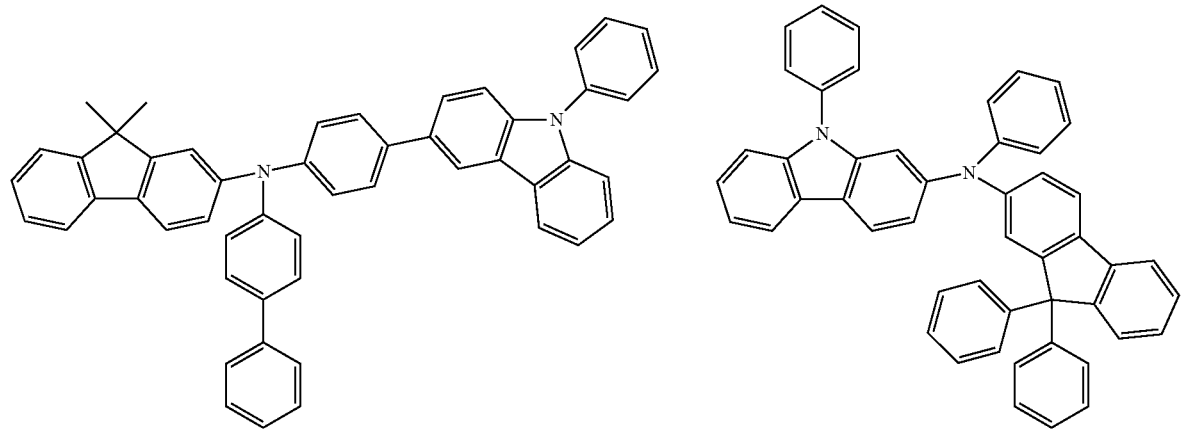

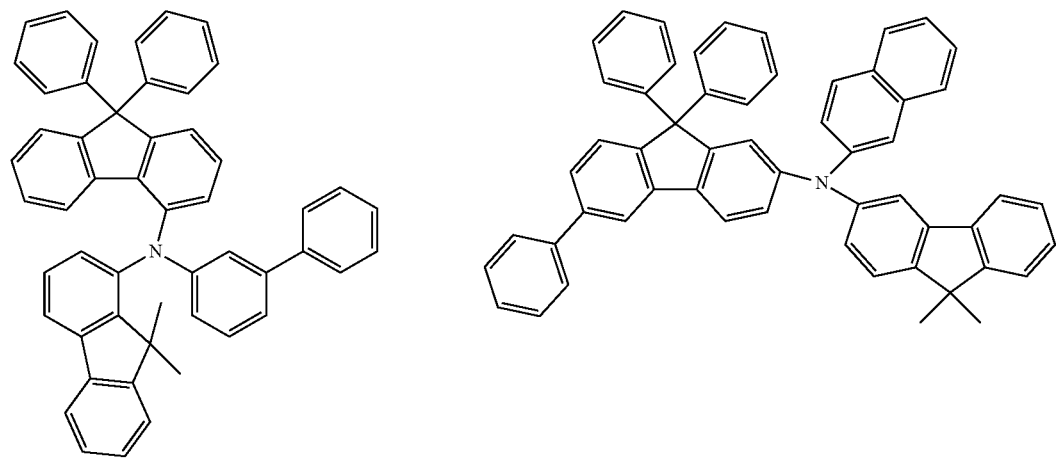

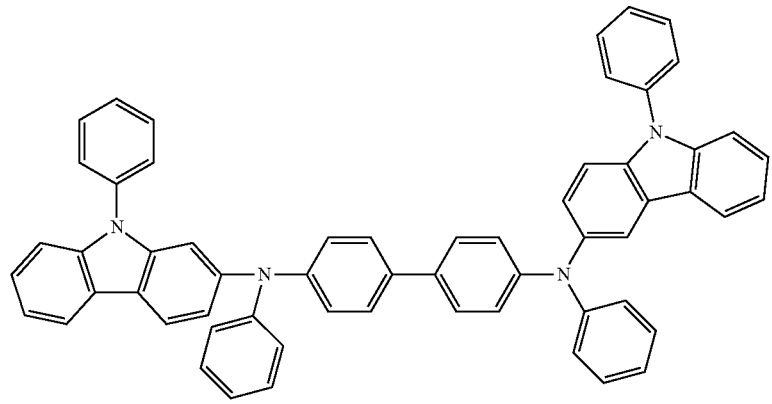

-continued
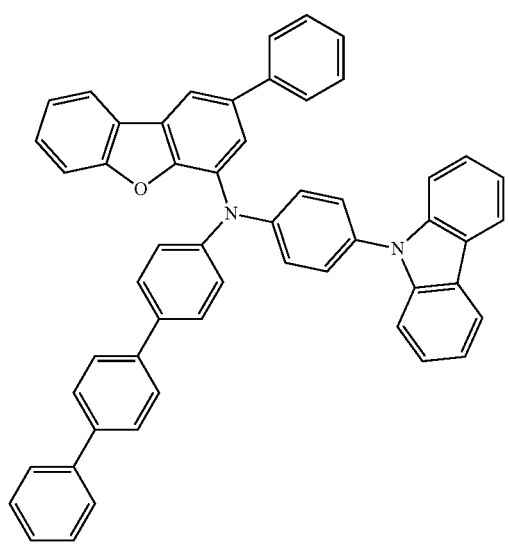
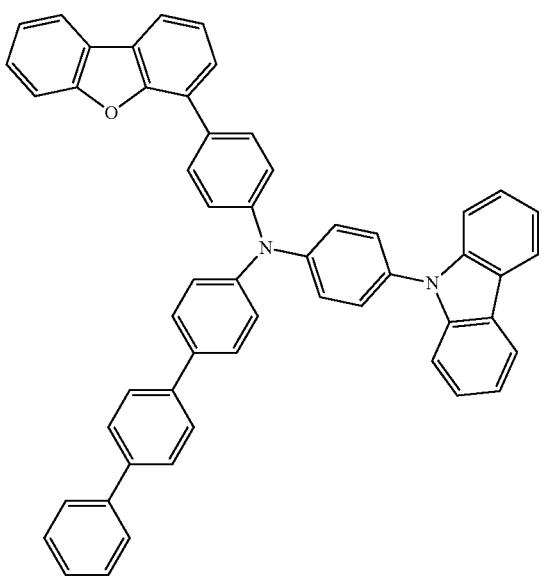
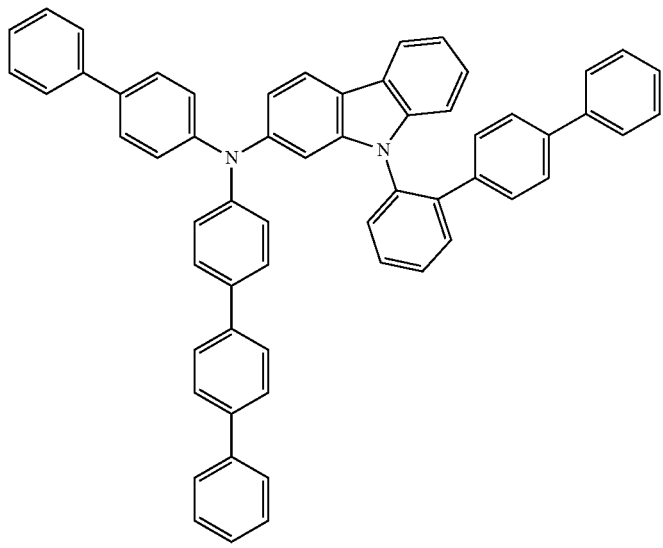
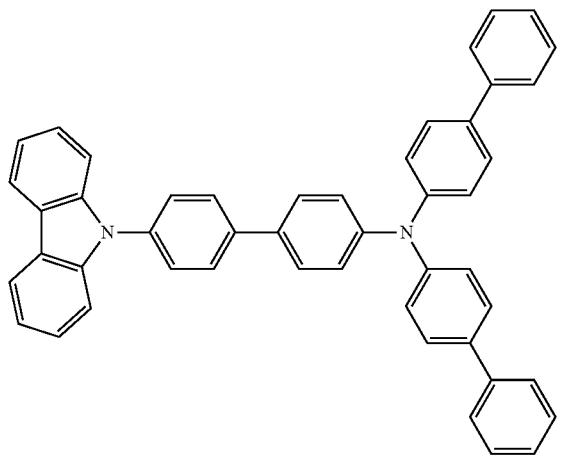
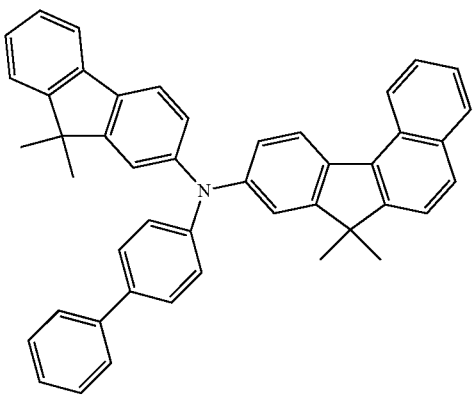

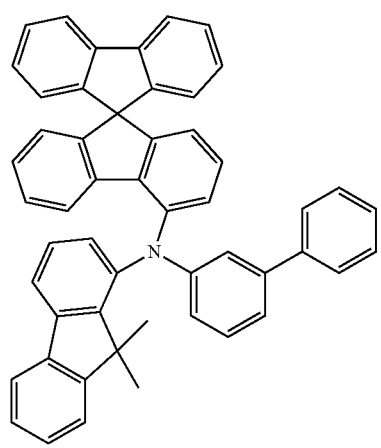
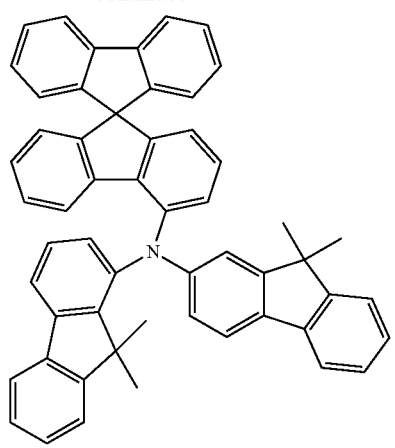
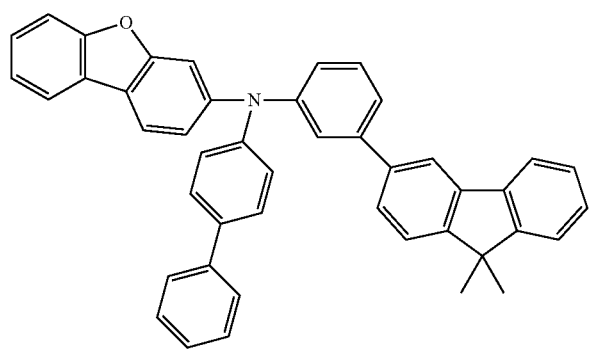
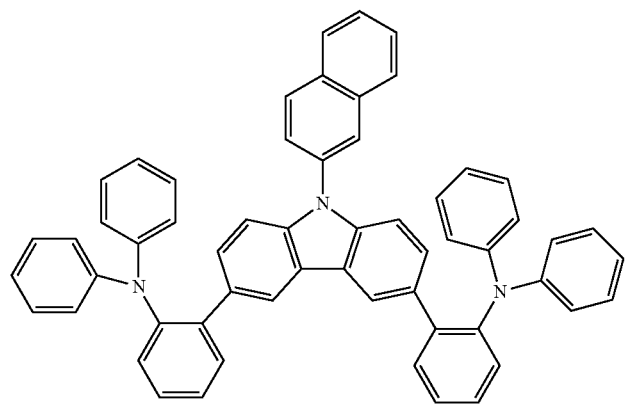

23
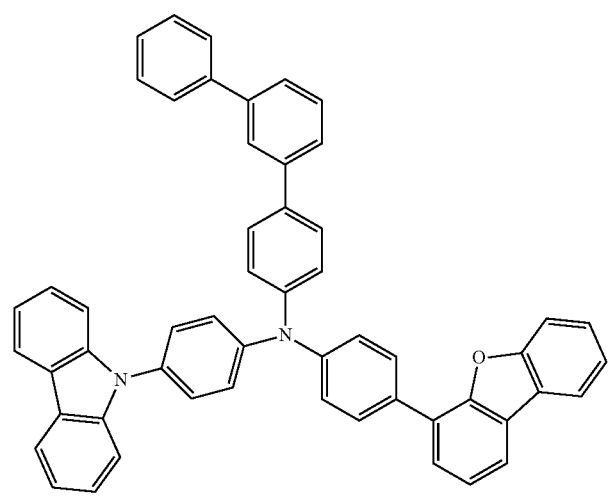
24
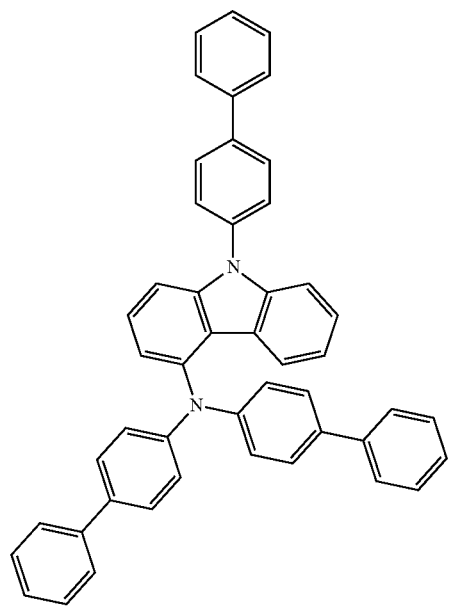
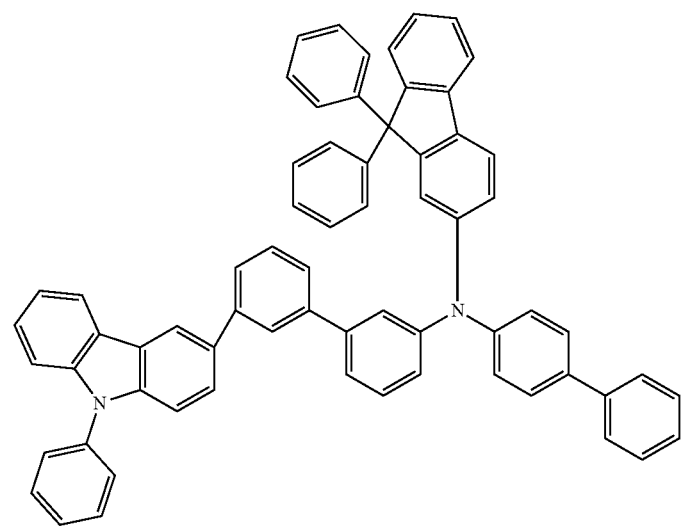
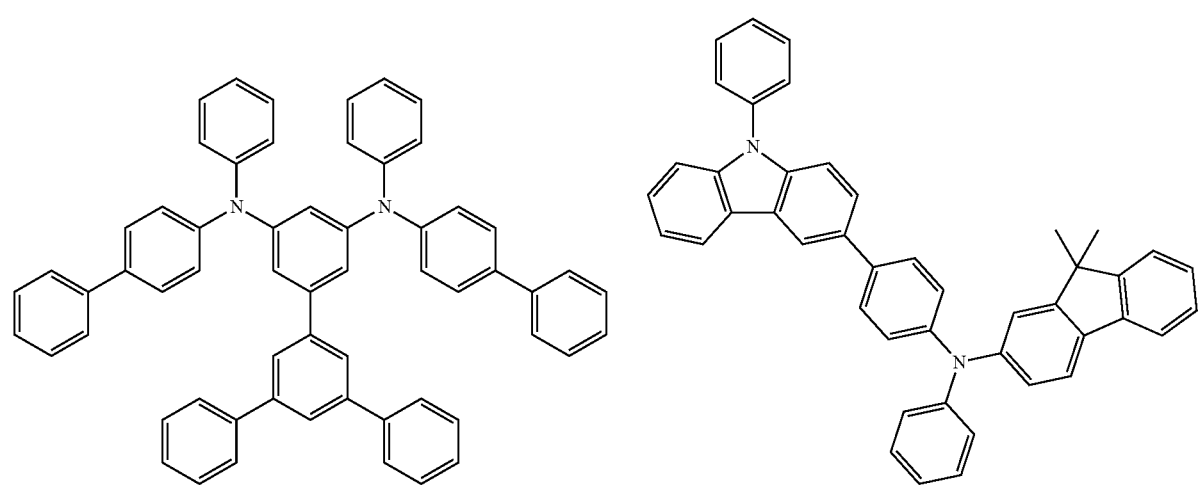

-continued
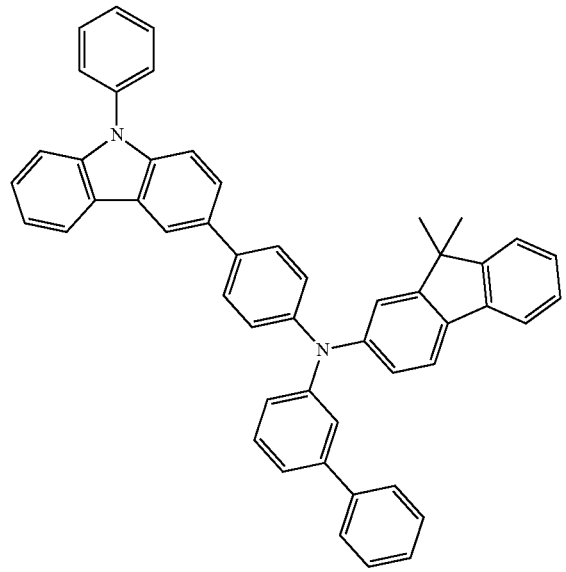
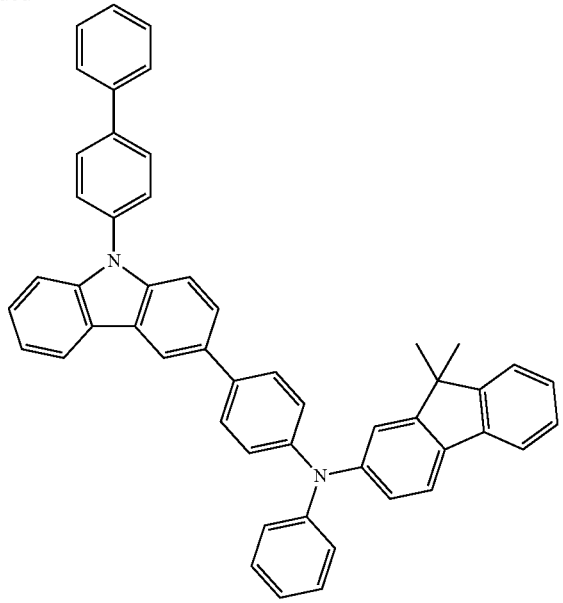
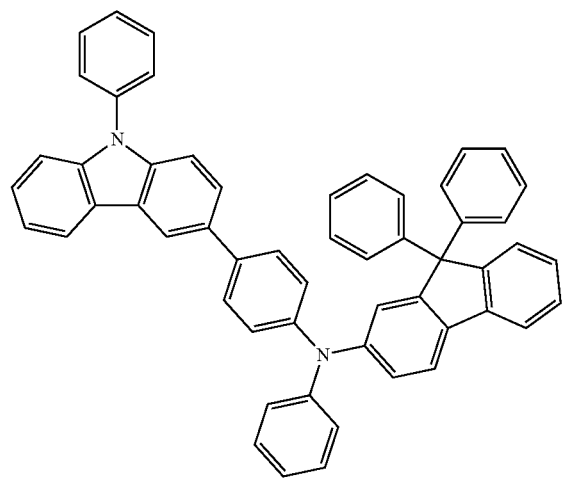
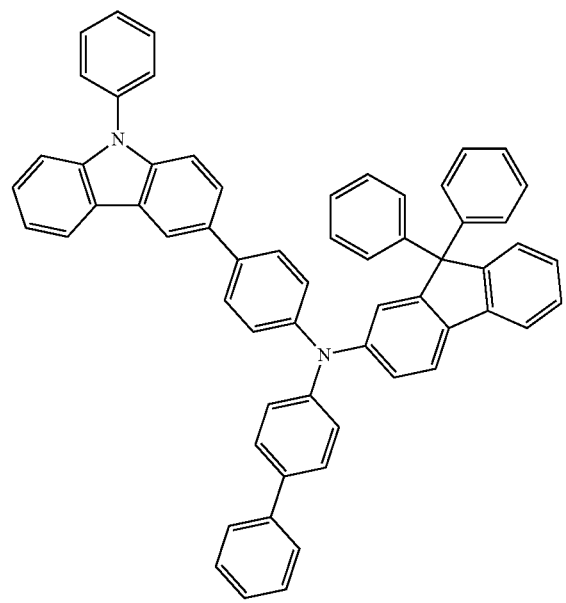

-continued
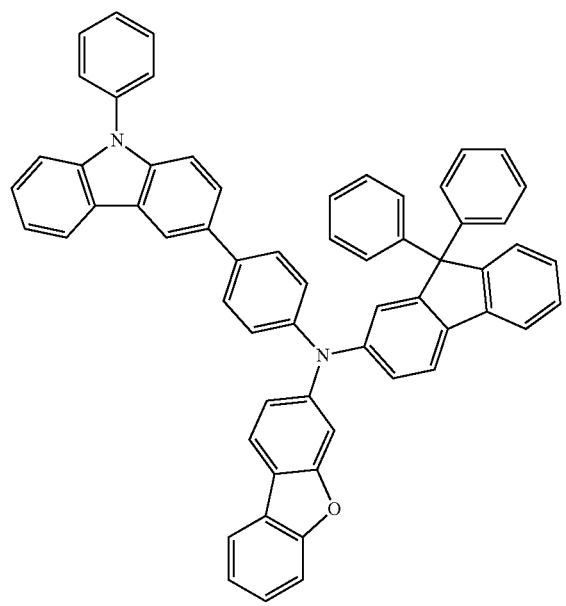
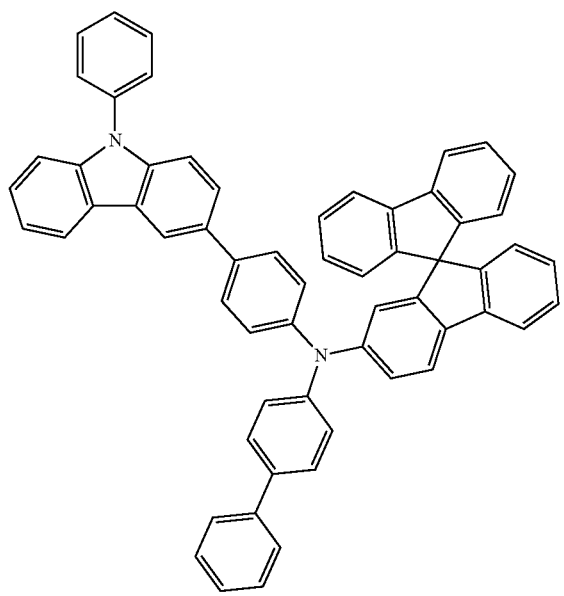
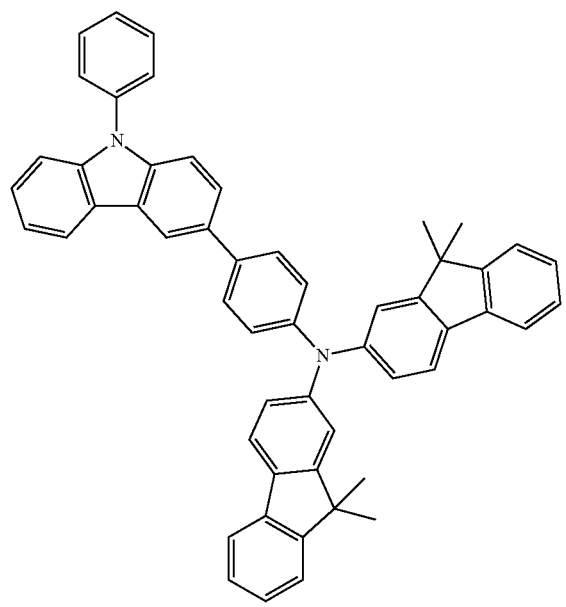
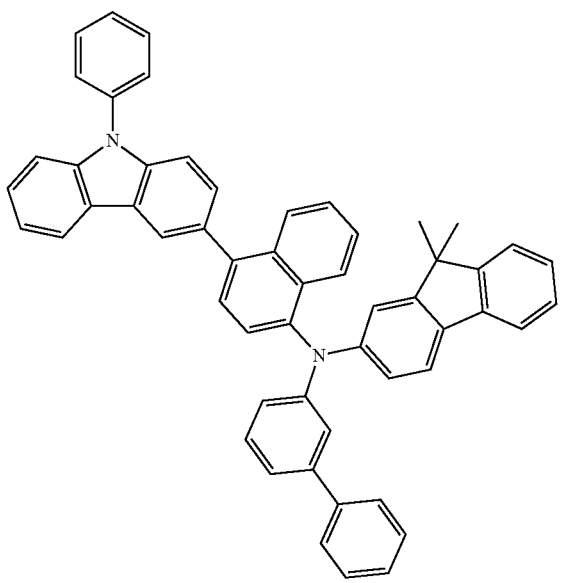

-continued
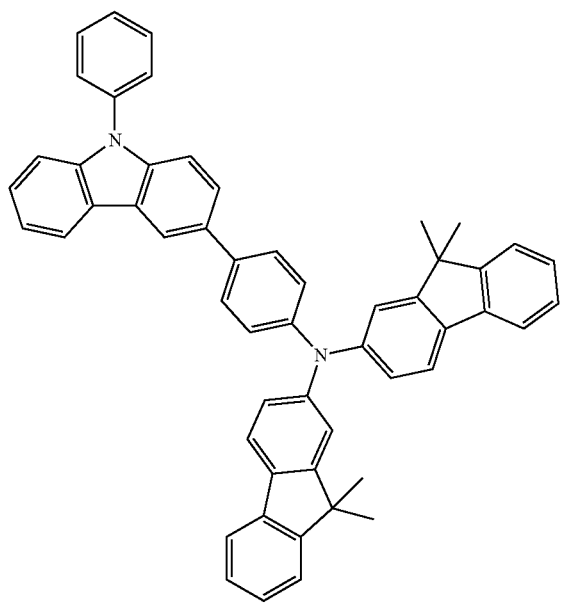
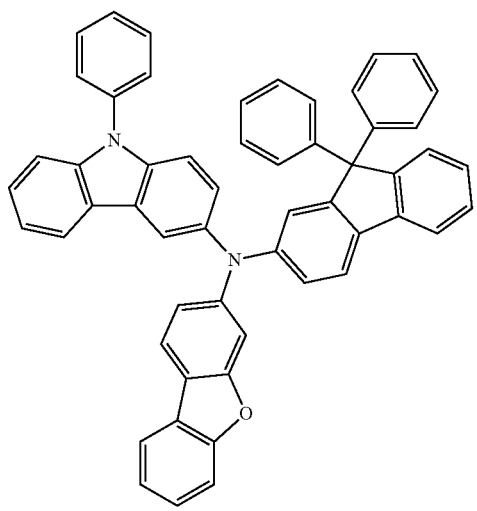
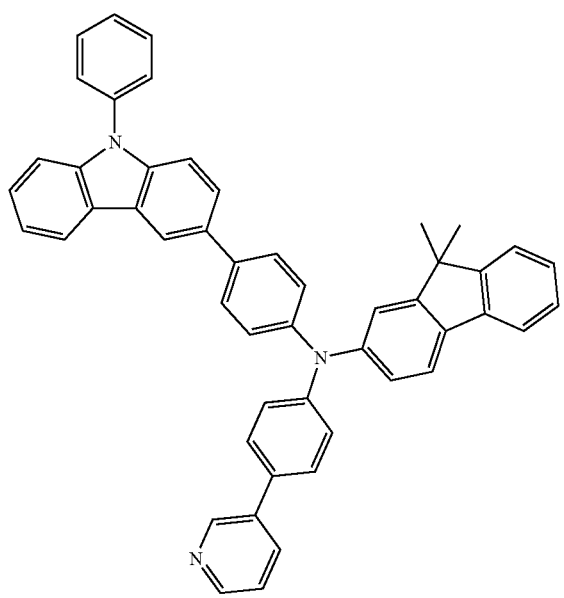
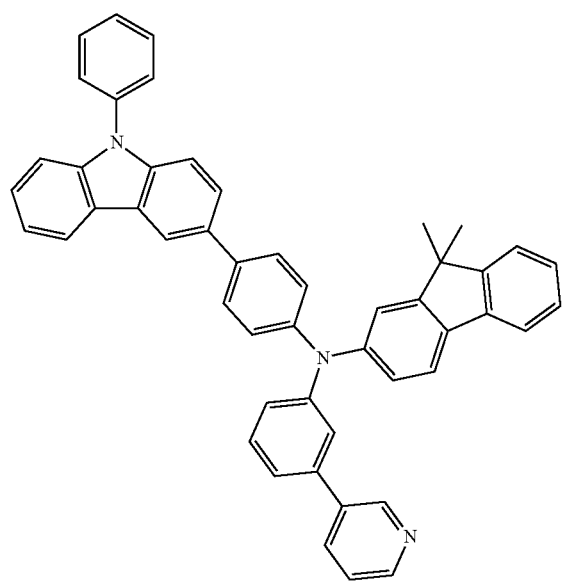
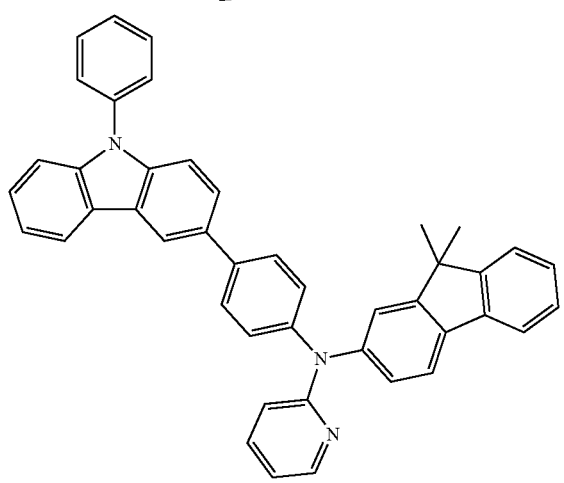
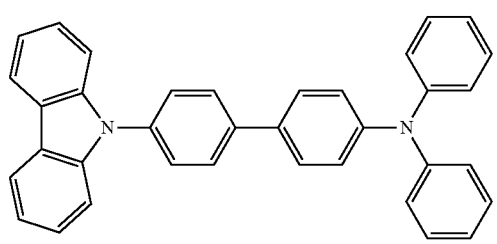

-continued
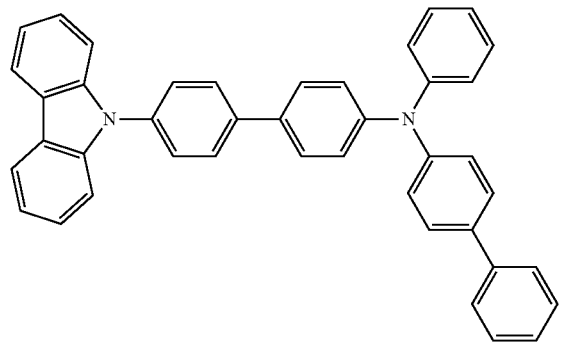
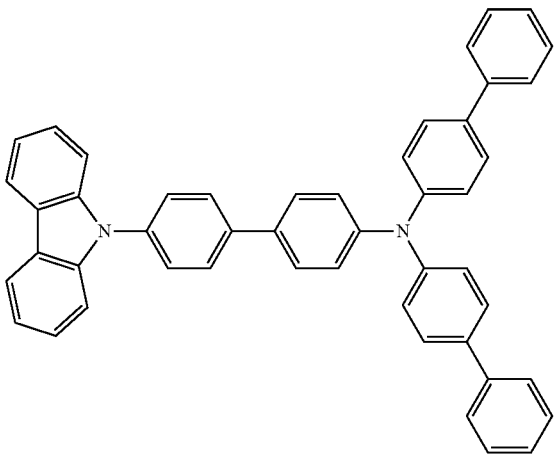
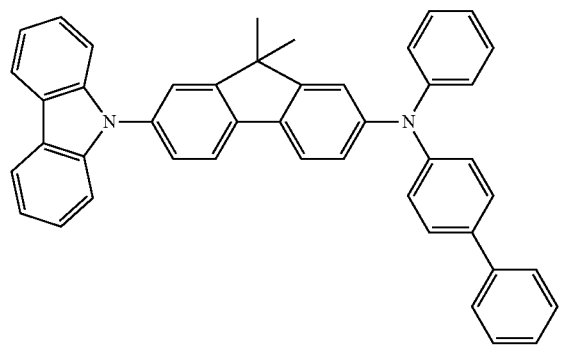
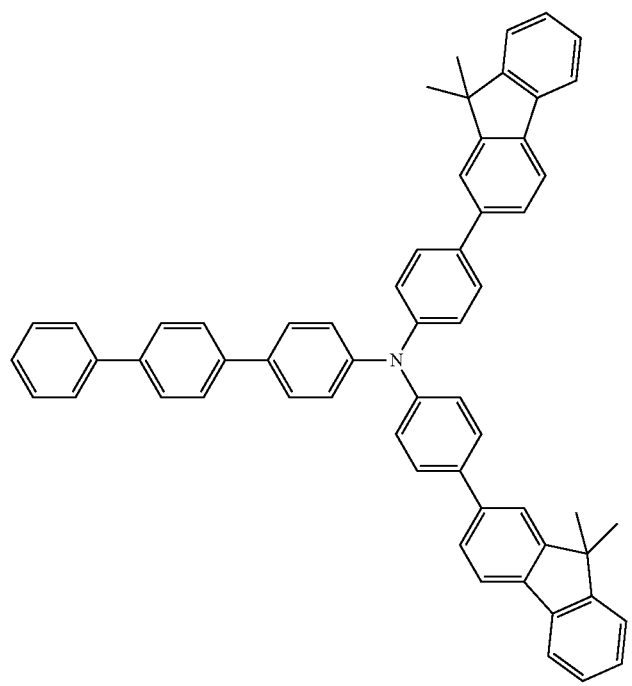
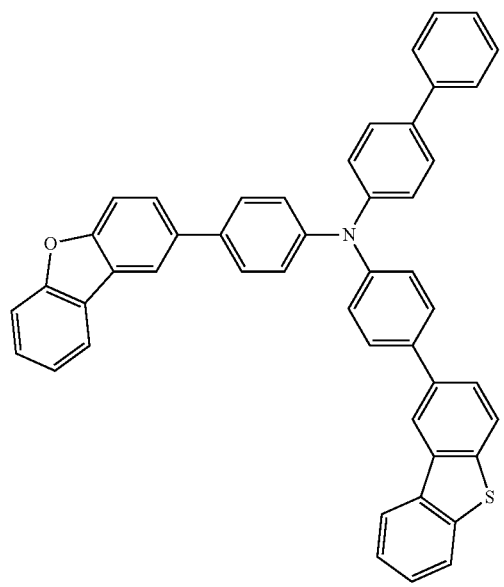

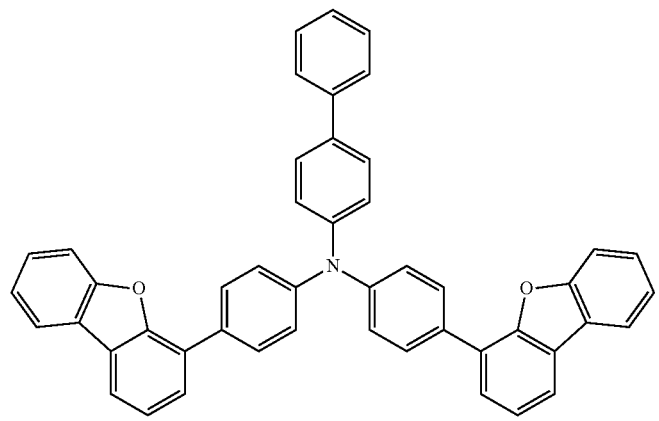
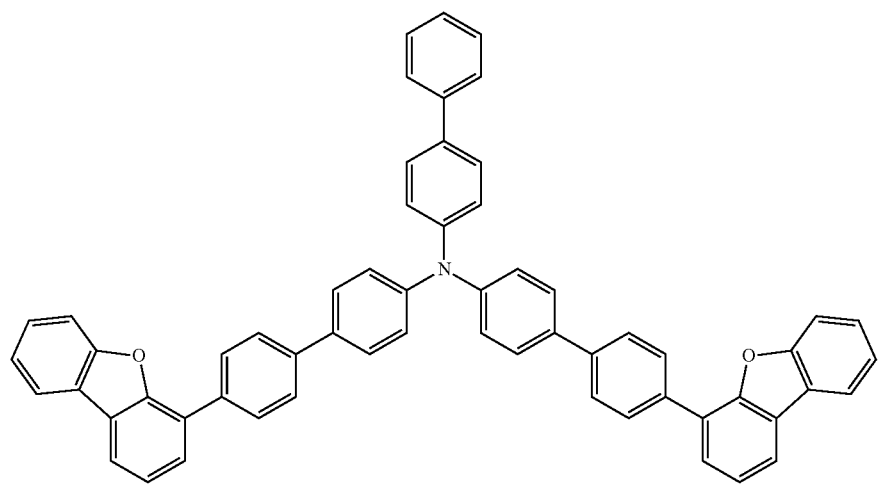
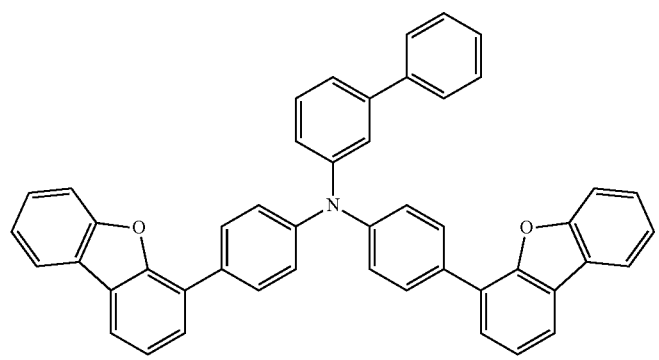

35 36
-continued
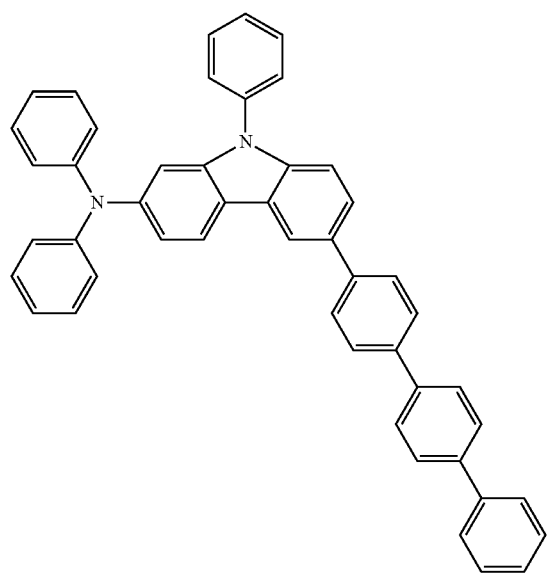
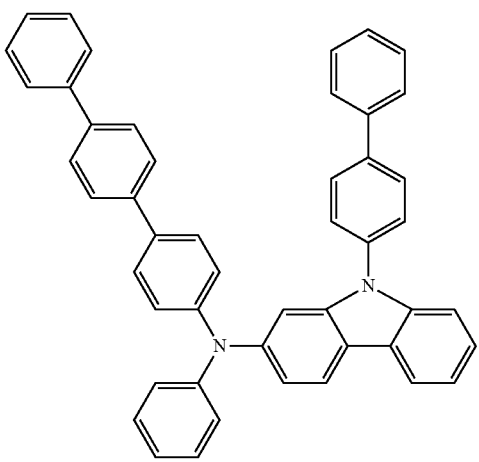
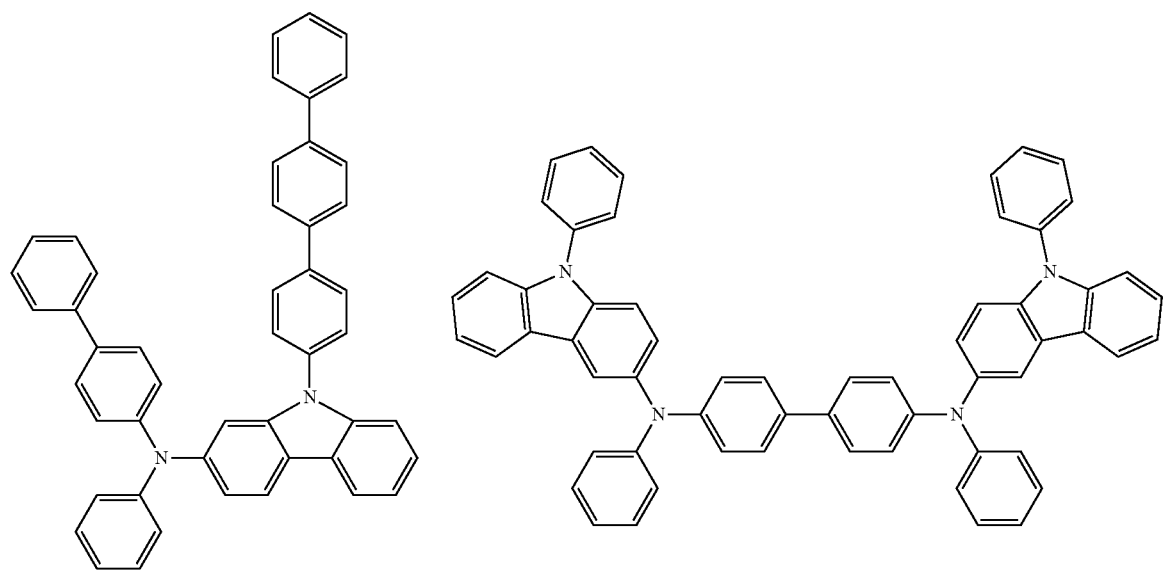
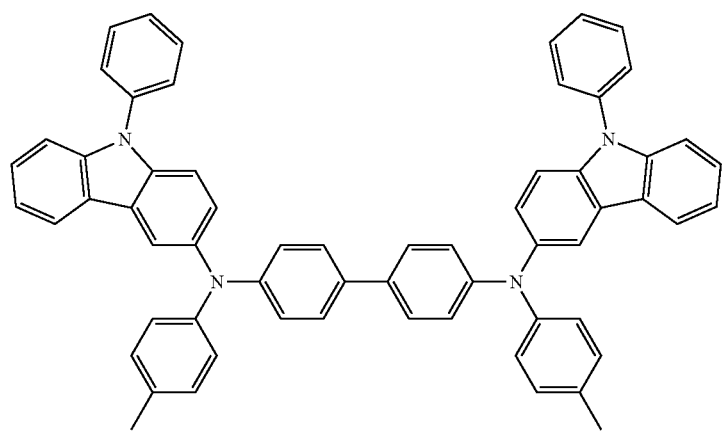

-continued
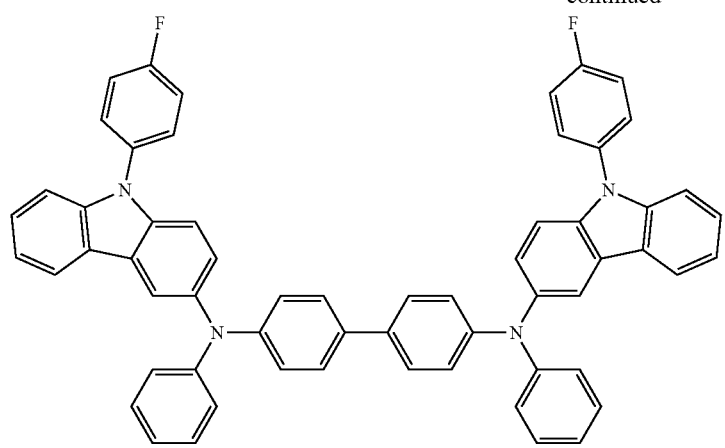
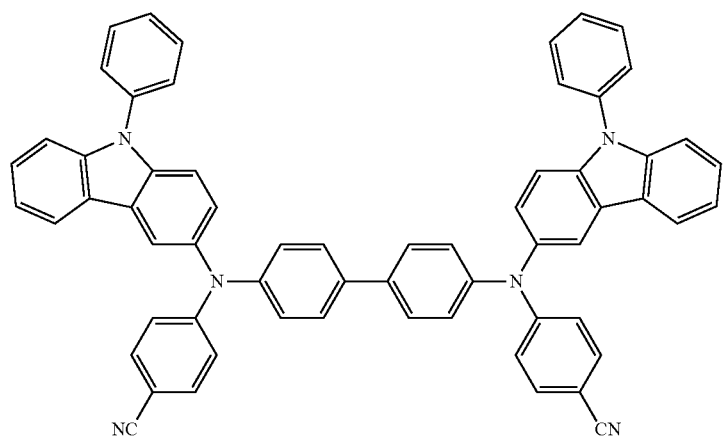
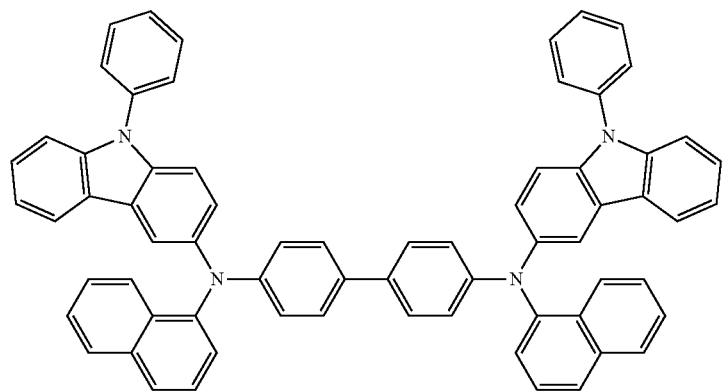

-continued
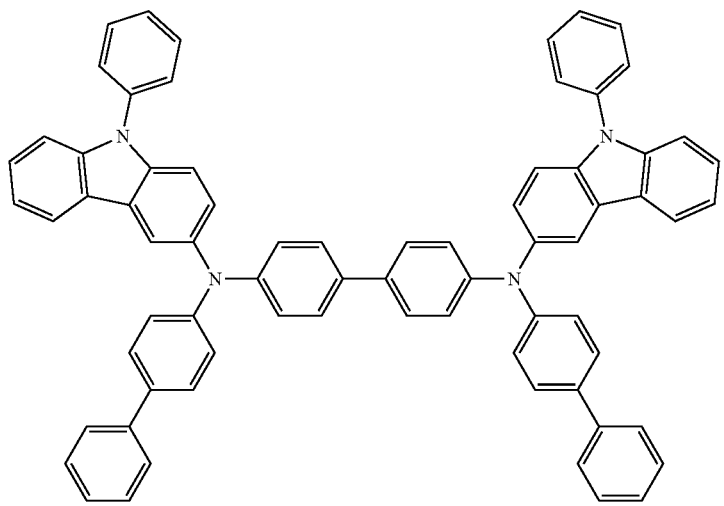
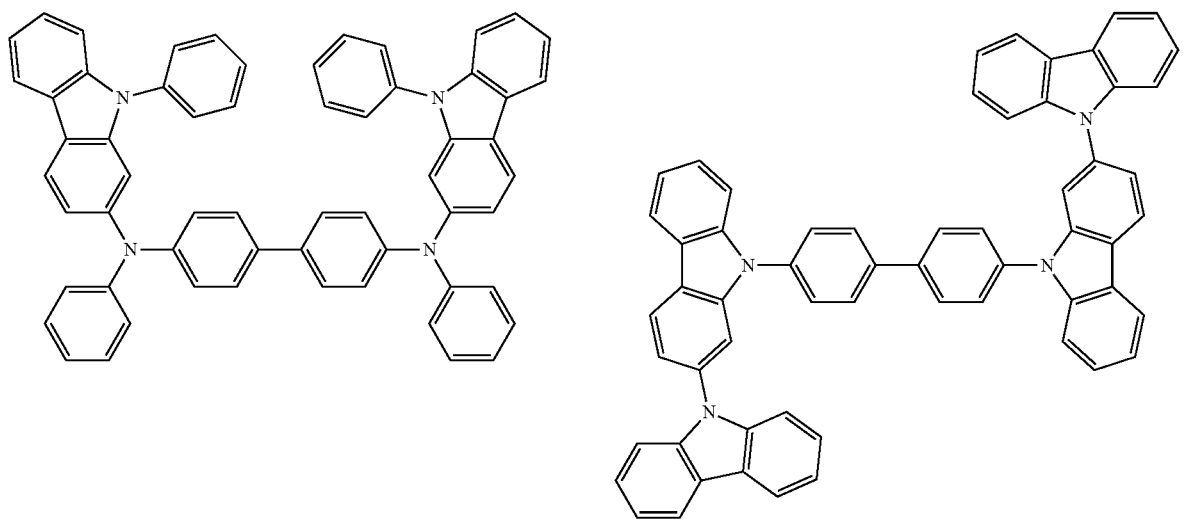
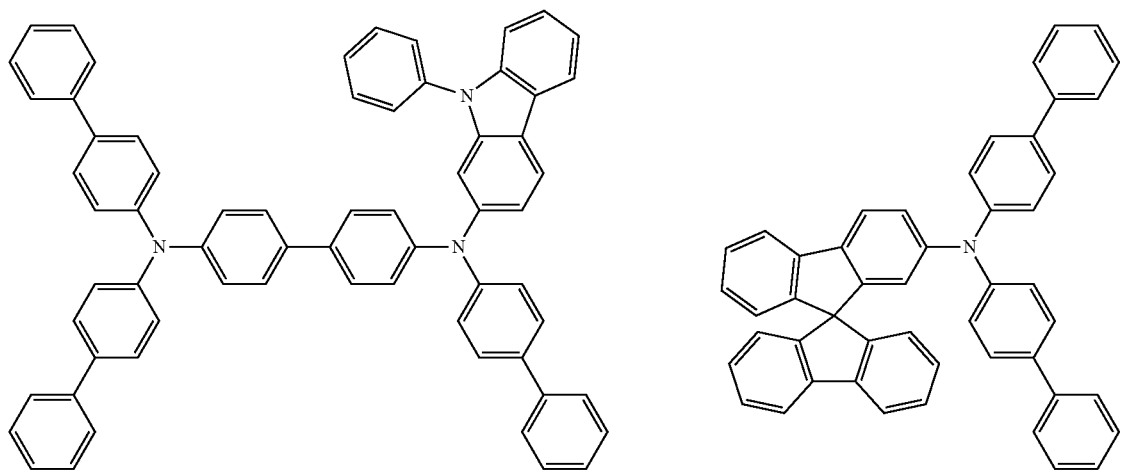

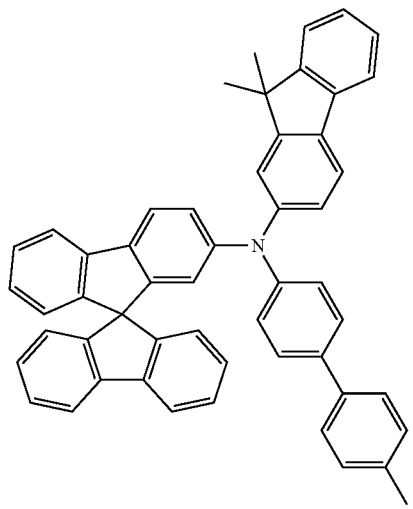
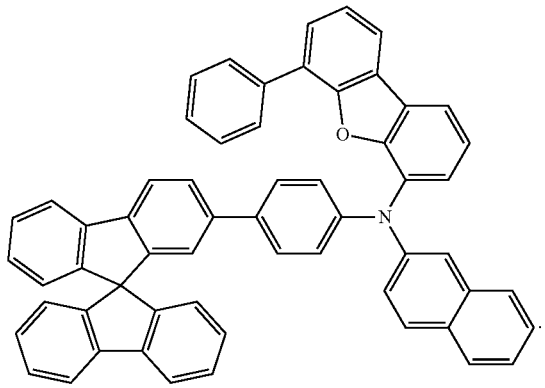

The hole transport region HTR may include a phthalocyanine compound (such as copper phthalocyanine); $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium [tetrakis(pentafluorophenyl)borate], dipyrazino[2,3-f:2',3'-h]quinoxaline-2,3,6,7,10,11-hexacarbonitrile (HATCN), etc.

The hole transport region HTR may include carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl) triphenylamine (TCTA)), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compound of the hole transport region in at least one of a hole injection layer HIL, a hole transport layer HTL, or an electron blocking layer EBL.

The thickness of the hole transport region HTR may be about 100 Å to about 10,000 Å, for example, about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. When the thicknesses of the hole transport region HTR, the hole injection layer HIL, the hole transport layer HTL and the electron blocking layer EBL satisfy the above-described ranges, satisfactory hole transport characteristic may be achieved without a substantial increase in driving voltage.

The hole transport region HTR may further include a charge generating material to increase conductivity, in addition to the above-described materials. The charge generating material may be dispersed substantially uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments of the present disclosure are not limited thereto. For example, the p-dopant may include metal halides (such as CuI and/or RbI), quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), dipyrazino[2,3-f:2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but embodiments of the present disclosure are not limited thereto.

As described above, the hole transport region HTR may further include at least one of the buffer layer or the electron blocking layer EBL in addition to the hole injection layer HIL and the hole transport layer HTL. The buffer layer may compensate for a resonance distance of the wavelength of light emitted from the emission layer EML, and may thus increase light emission efficiency. Materials that may be included in the hole transport region HTR may be included in the buffer layer. The electron blocking layer EBL is a layer that serves to prevent or reduce electrons from being injected from the electron transport region ETR to the hole transport region HTR.

The emission layer EML is provided on the hole transport region HTR. The emission layer EML may have a thickness of, for example, about 100 Å to about 1,000 Å or about 100 Å to about 500 Å. The emission layer EML may have a single layer or a multilayer structure in which a plurality of layers are stacked. In the emission layer EML of the multilayer structure, the materials between the plurality of layers may be different from or substantially the same as each other, and the material of at least one layer may be different from the others.

In the light emitting device ED of an embodiment, the emission layer EML may include a first host and a second host that are different from each other, and a dopant containing an organometallic complex. In some embodiments, in the light emitting device ED of an embodiment, when the emission layer EML includes a plurality of layers, at least one layer may include a first host and a second host, which will be described below, and a dopant containing an organometallic complex.

In an embodiment, the first host may be represented by Formula 1. For example, in an embodiment, the first host may include a triazine core:

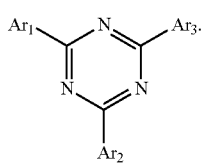

Formula 1

In Formula 1, $Ar_1$ to $Ar_3$ may each independently be a substituted or unsubstituted aryl group having 6 to 30 ring-forming carbon atoms, or a substituted or unsubstituted heteroaryl group having 2 to 30 ring-forming carbon atoms. For example, at least one among $Ar_1$ to $Ar_3$ may be an aryl group having 6 to 30 ring-forming carbon atoms and containing a halogen atom or a cyano group as a substituent, or a hexagonal (e.g., six-membered) heterocycle containing a nitrogen atom as a ring-forming atom. For example, at least one among $Ar_1$ to $Ar_3$ may be a phenyl group substituted with a halogen atom or a cyano group, or be a hexagonal heterocycle containing one or two nitrogen atoms as a ring-forming atom. The hexagonal heterocycle may be substituted or unsubstituted.

In the first host represented by Formula 1, at least one among $Ar_1$ to $Ar_3$ may include an electron-accepting substituent. For example, the hexagonal heterocycle containing a halogen atom, a cyano group, or a nitrogen atom as a ring-forming atom may be contained in the first host as an electron-accepting substituent. For example, in the first host, at least one among $Ar_1$ to $Ar_3$ may include a phenyl group substituted with a fluorine atom, a phenyl group substituted with a cyano group, a pyridine group, a pyrimidine group, and/or the like.

In an embodiment, at least one among $Ar_1$ to $Ar_3$ may be represented by any one among EW-1 to EW-5. In EW-3, "Ph" represents a phenyl group. For example, in EW-3, a phenyl group may be substituted with a triphenylsilyl group.

The groups represented by EW-1 to EW-5 may be electron-accepting substituents.

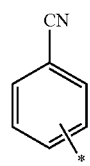

EW-1

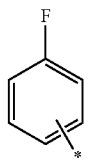

EW-2

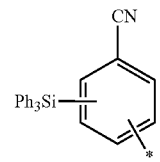

EW-3

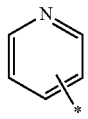

EW-4

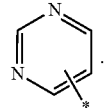

EW-5

In an embodiment, the first host included in the emission layer EML may be a compound containing a triazine core and at least one electron-accepting substituent substituted to the triazine core. The first host material according to an embodiment having this compound structure may have a high material stability.

The first host represented by Formula 1 according to an embodiment contains at least one electron-accepting substituent, and thus the electron density in the triazine core moiety may be reduced. Thus, the binding force between the triazine and adjacent substituents may be increased, and thereby the material stability of the first host may be improved. For example, when the electron-accepting substituent is not included, the bonding energy between the triazine and the substituent substituted to the triazine is about 2.7 eV, whereas the bonding energy between the triazine and a substituent containing the electron-accepting group is increased to about 3.0 eV to about 3.3 eV. As the bonding energy increases, the stability of the first host material according to an embodiment is improved, and a service life of the light emitting device of an embodiment containing this first host material may increase.

The emission layer EML may include, as the first host, at least one among the compounds represented by Compound Group 1:

Compound Group 1

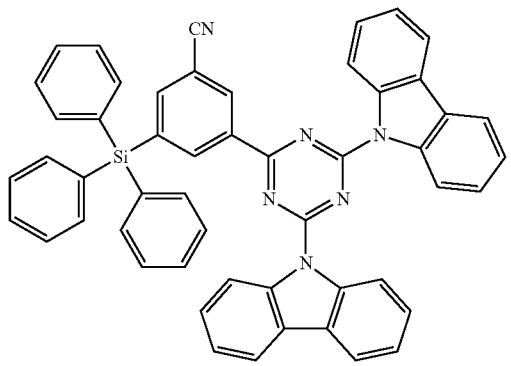

ET01

ET02
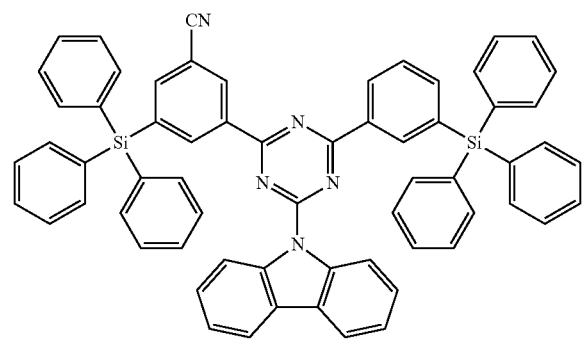
ET03
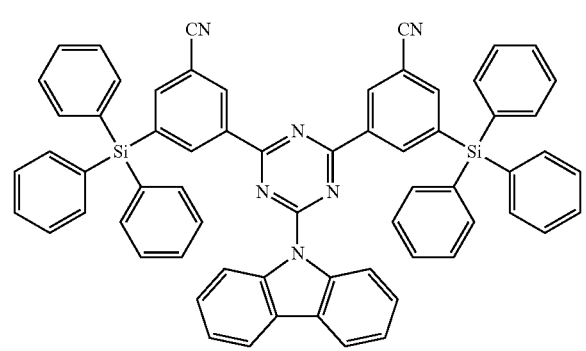
ET04
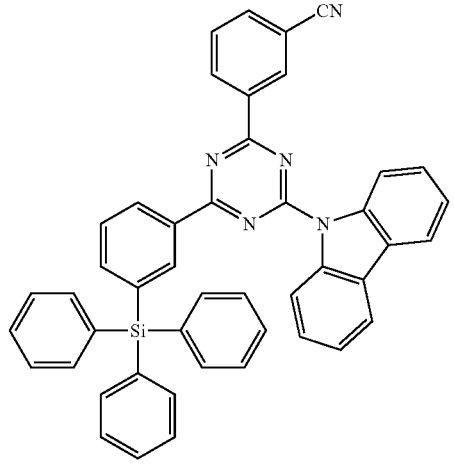
ET05
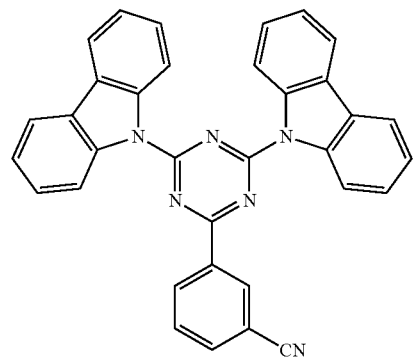
ET06
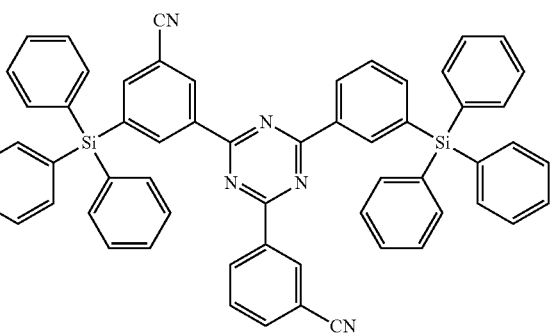
ET07
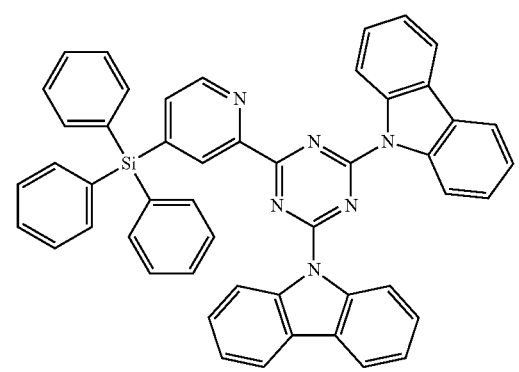
ET08
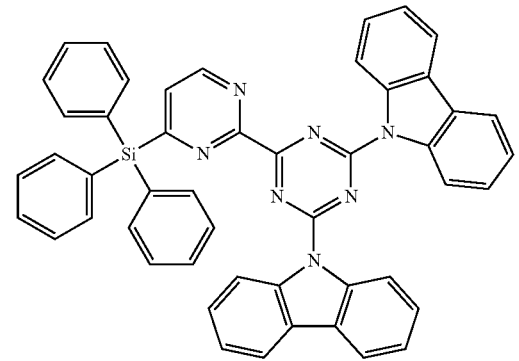
ET09
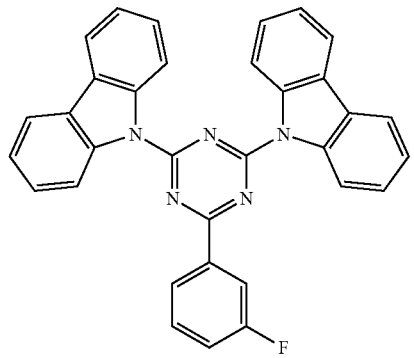

ET10
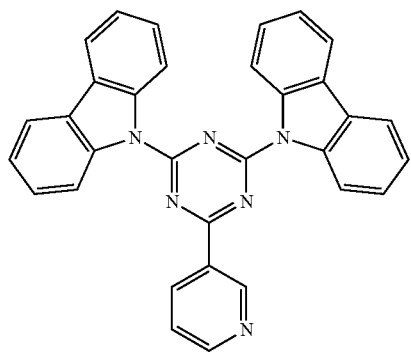

ET11
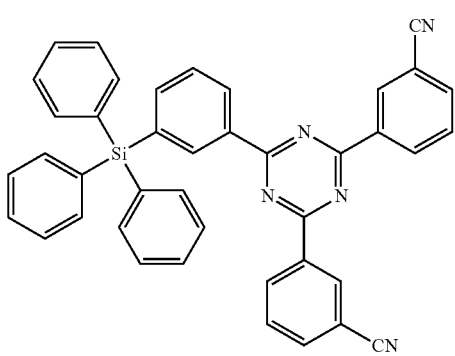

ET12
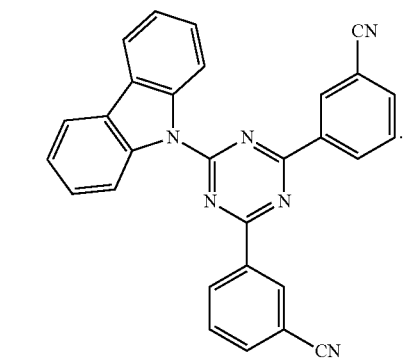

The second host may be represented by Formula 2:

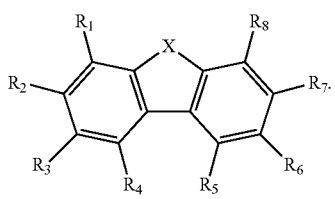

Formula 2

In Formula 2, X is $NR_a$, O, or $CR_bR_c$. In Formula 2, $R_1$ to $R_8$, $R_a$, $R_b$, and $R_c$ may each independently be a hydrogen atom, a deuterium atom, a substituted or unsubstituted silyl group, a substituted or unsubstituted alkyl group having 1 to 20 carbon atoms, a substituted or unsubstituted aryl group having 6 to 60 ring-forming carbon atoms, or a substituted or unsubstituted heterocycle having 2 to 60 ring-forming carbon atoms.

In some embodiments, at least one of $R_a$, $R_b$, or $R_c$ may be represented by Formula A:

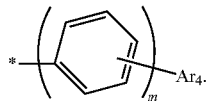

Formula A

In an embodiment, when X is $NR_a$, $R_a$ may be represented by Formula A, and in an embodiment, when X is $CR_bR_c$, at least one of $R_b$ or $R_c$ may be represented by Formula A.

In Formula A, m may be an integer of 0 to 2, and $Ar_4$ may be a substituted or unsubstituted silyl group, a substituted or unsubstituted aryl group having 6 to 60 ring-forming carbon atoms, or a substituted or unsubstituted heterocycle having 2 to 60 ring-forming carbon atoms.

In some embodiments, when m is 0, $Ar_4$ may be directly bonded to a moiety represented by Formula 1. When m is 1, $Ar_4$ may be bonded via a phenylene linker to a moiety represented by Formula 1, and when m is 2, $Ar_4$ may be bonded via a divalent biphenyl group linker to a moiety represented by Formula 1.

For example, $Ar_4$ may be a substituted or unsubstituted carbazole group, a substituted or unsubstituted dibenzofuran group, a substituted or unsubstituted silyl group, a substituted or unsubstituted phenyl group, etc., but embodiments of the present disclosure are not limited thereto.

In Formula 2, $R_1$ to $R_8$ may be, for example, a hydrogen atom, a substituted or unsubstituted carbazole group, a substituted silyl group, etc. However, embodiments of the present disclosure are not limited thereto.

The emission layer EML may include, as the second host, at least one among the compounds represented by Compound Group 2:

Compound Group 2

HT-01
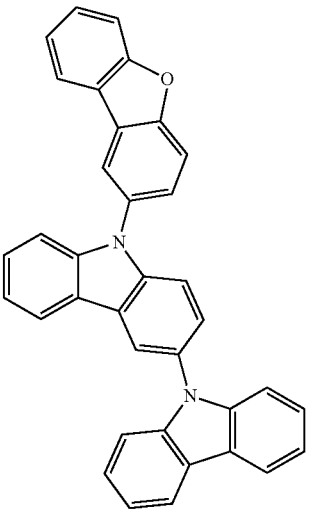

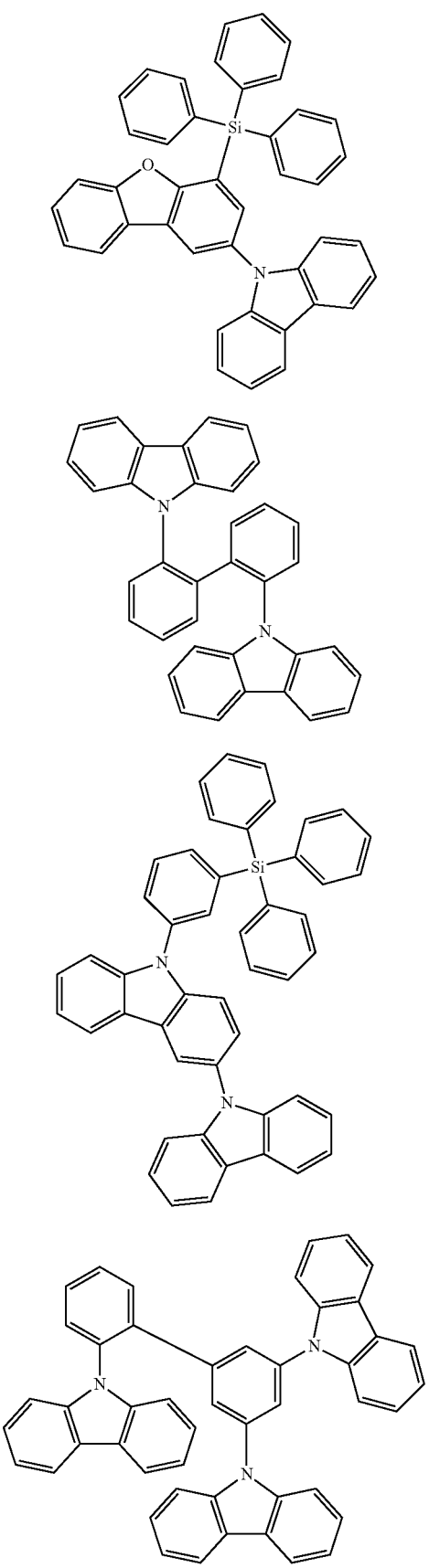
HT-02
HT-03
HT-04
HT-05
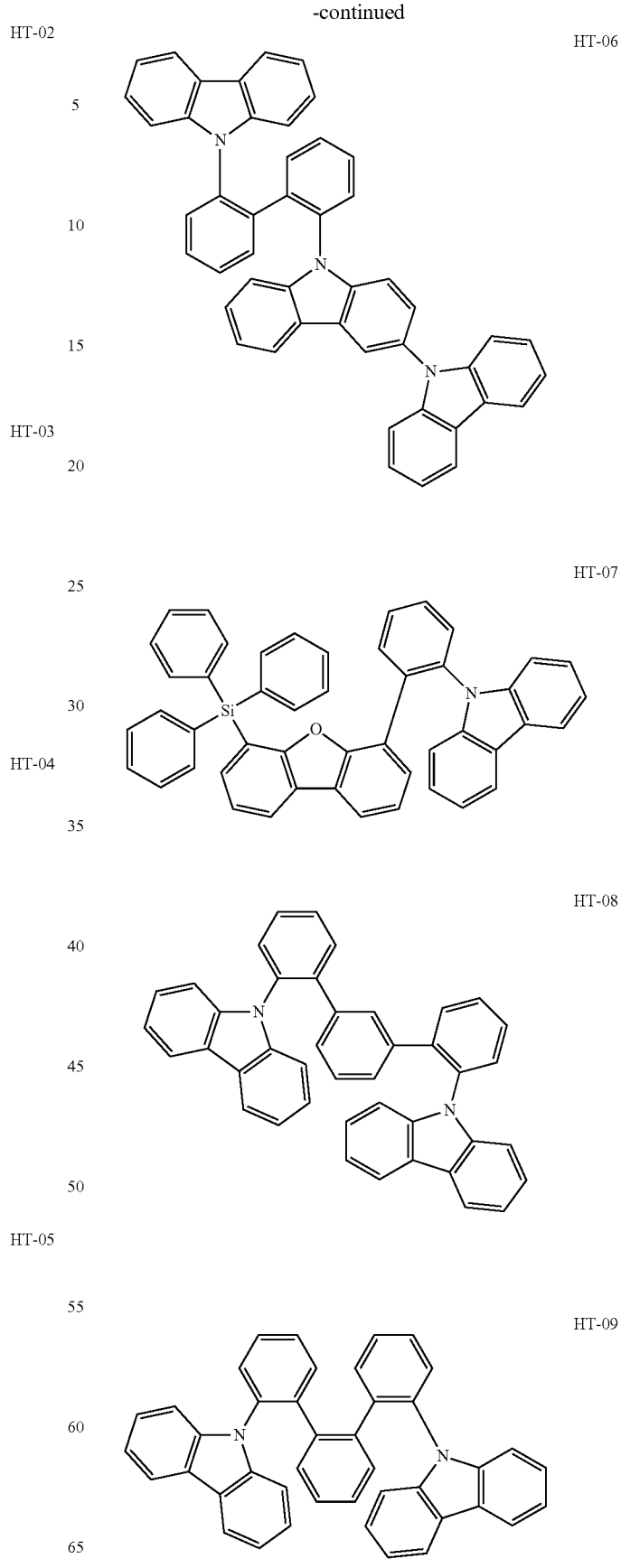
HT-06
HT-07
HT-08
HT-09

-continued

HT-10

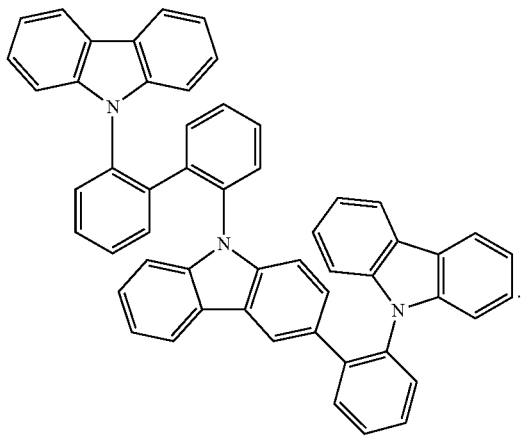

In the light emitting device ED of an embodiment, of the two host materials which are concurrently (e.g., simultaneously) included in the emission layer EML, the first host represented by Formula 1 may be an electron transporting host and the second host represented by Formula 2 may be a hole transporting host. The light emitting device ED of an embodiment includes (e.g., simultaneously), in the emission layer EML, both of the first host (which has an excellent or suitable electron transporting characteristic) and the second host (which has an excellent or suitable hole transporting characteristic), and thus may be capable of efficiently delivering energy to dopant compounds.

In an embodiment, in the total weight of the first host and the second host, the weight ratio of the first host and the second host may be about 3:7 to about 7:3. When the contents of the first dopant and the second dopant satisfy the above-described ratios, a charge balance characteristic of the emission layer EML may be improved, and thus luminous efficiency and/or a device service life may increase.

The dopant included in the emission layer EML in the light emitting device ED of an embodiment may be represented by Formula 3:

Formula 3

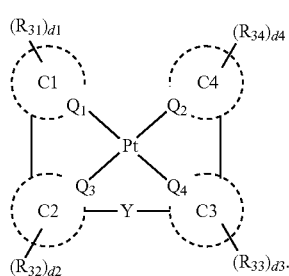

The dopant included in the emission layer EML of an embodiment may be an organometallic complex containing platinum (Pt) as a central metal atom.

In Formula 3, $Q_1$ to $Q_4$ may each independently be C or N, and rings C1 to C4, which are represented by C1 to C4, may each independently be a substituted or unsubstituted hydrocarbon ring having 5 to 30 ring-forming carbon atoms, or a substituted or unsubstituted heterocycle having 2 to 30 ring-forming carbon atoms.

In Formula 3, Y may be O or S, and d1 to d4 may each independently be an integer of 0 to 4. In some embodiments, $R_{31}$ to $R_{34}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or may be bonded to an adjacent group to form a ring.

In some embodiments, the dopant represented by Formula 3 may be represented by Formula 3-1:

Formula 3-1

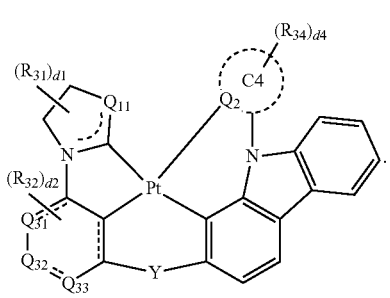

In Formula 3-1, $Q_{11}$, $Q_{31}$, $Q_{32}$, and $Q_{33}$ may each independently be N, $NR_{11}$, $CR_{12}$, $CR_{12}R_{13}$, $BR_{14}$, or $BR_{14}R_{15}$. In Formula 3-1, $R_{11}$ to $R_{15}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or may be bonded to an adjacent group to form a ring. In some embodiments, in Formula 3-1, the part represented by a dotted line (- - - - - -) corresponds to a part in which a double bond is optionally formed (e.g., indicates an optional double bond).

In an embodiment, $R_{11}$ to $R_{15}$ may each independently be a methyl group, a tert-butyl group, a substituted phenyl group, etc., but embodiments of the present disclosure are not limited thereto.

In Formula 3-1, Y, ring C4, $R_{31}$, $R_{32}$, $R_{33}$, d1, d2 and d4 may be the same as described in connection with Formula 3.

The emission layer EML may include, as a dopant, at least one from among the compounds represented by Compound Groups 3:

Compound Group 3

BD01

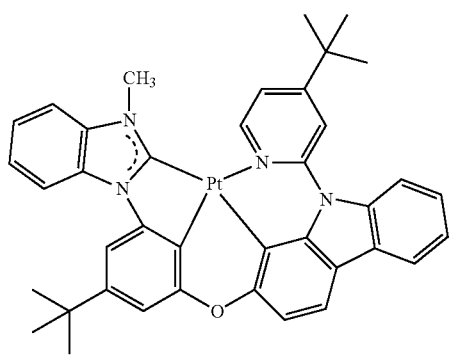

BD02

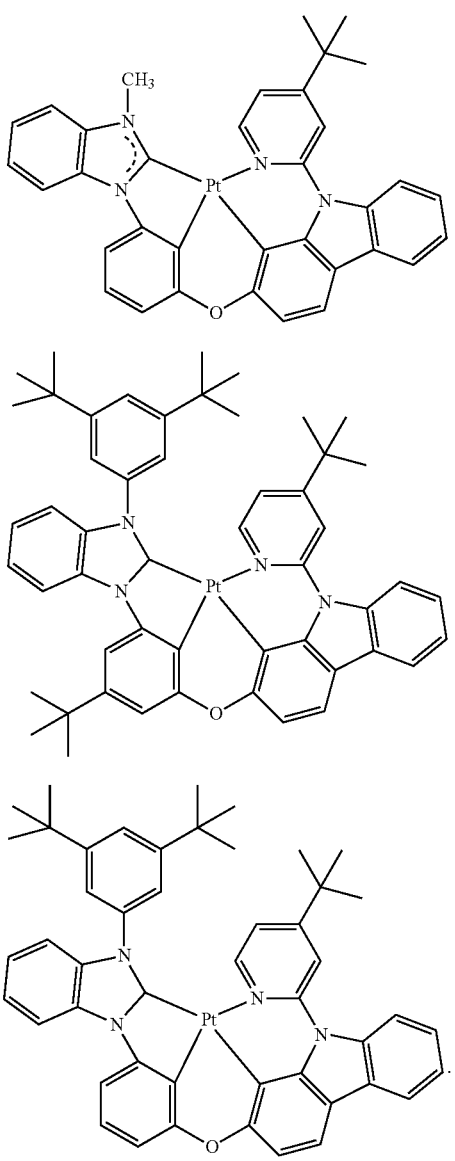

BD03

BD04

In the light emitting device ED of an embodiment, when the emission layer EML is formed, the two host materials and the dopant material as described above may be co-deposited and provided. In an embodiment, the emission layer EML including the first host represented by Formula 1, the second host represented by Formula 2, and the dopant represented by Formula 3 may be to emit blue light. For example, in the light emitting device ED of an embodiment, the emission layer EML including the first host, the second host, and the dopant of Formula 3 may be to emit phosphorescence, and specifically, the emission layer EML may be to emit blue phosphorescence.

The light emitting device ED of an embodiment includes the first host that is an electron transporting host having a triazine core and at least one electron-accepting substituent bonded to the triazine core, and thus may exhibit an improved service life (life span) characteristic. The light emitting device ED of an embodiment includes the emission layer EML including the combination of the first host, the second host, and the dopant of Formula 3 as described above, and thus may exhibit good or suitable luminous efficiency and/or excellent or suitable device service life characteristics.

The light emitting device ED of an embodiment may further include the following emission layer materials in addition to the first host, the second host, and the dopant of Formula 3 containing an organometallic complex as described above. The emission layer materials may be further included in an emission layer equivalent to the emission layer including the first host, the second host, and the dopant of Formula 3, or in an emission layer different from that.

For example, the light emitting device ED may further include, as a suitable emission layer material, anthracene derivatives, pyrene derivatives, fluoranthene derivatives, chrysene derivatives, dihydrobenzanthracene derivatives, and/or triphenylene derivatives. For example, the emission layer EML may include anthracene derivatives and/or pyrene derivatives.

In some embodiments, in each light emitting device ED illustrated in FIGS. 3 to 6, the emission layer EML may include a compound represented by Formula E-1. The compound represented by Formula E-1 may be utilized as a fluorescence host material.

Formula E-1

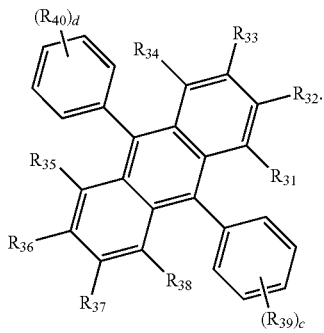

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted oxy group, a substituted or unsubstituted thiol group, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In some embodiments, $R_{31}$ to $R_{40}$ may be bonded to an adjacent group to form a saturated hydrocarbon ring or an unsaturated hydrocarbon ring. In some embodiments, $R_{31}$ to $R_{40}$ may be bonded to an adjacent substituent or an adjacent benzene ring to form a condensed ring.

In Formula E-1, c and d may each independently be an integer of 0 to 5.

Formula E-1 may be represented by any one among Compound E1 to Compound E19:

E1
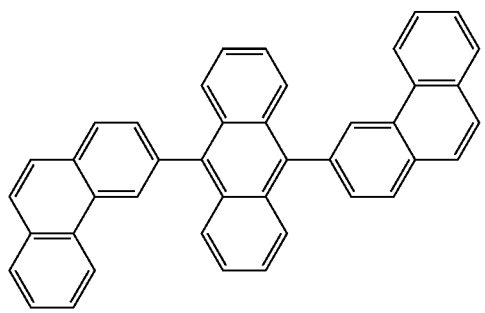
E2
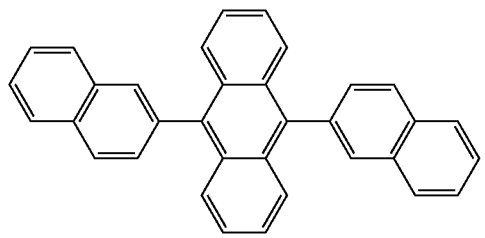
E3
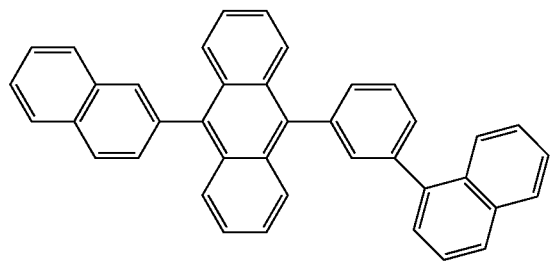
E4
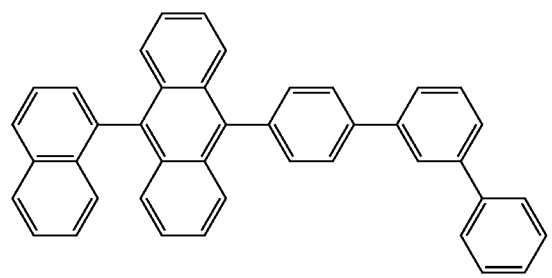
E5
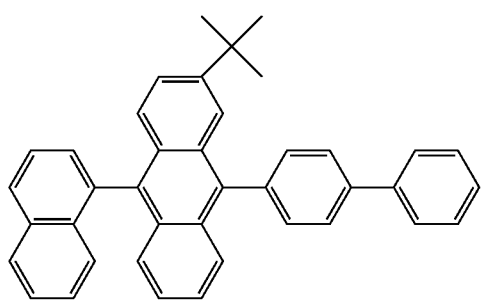
E6
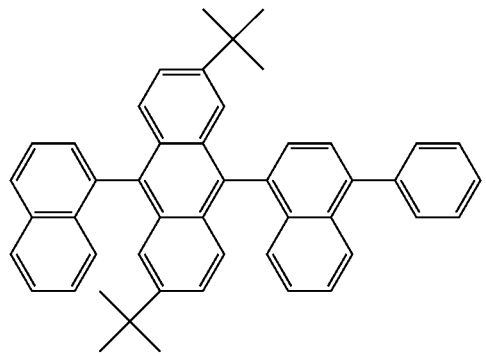
E7
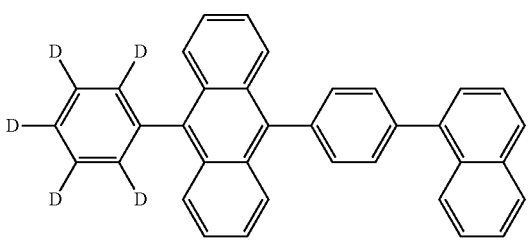
E8
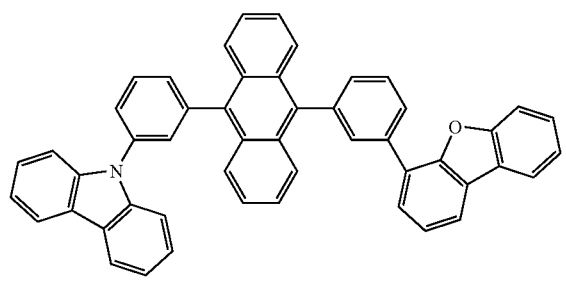
E9
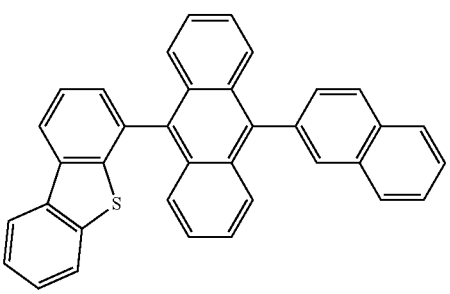
E10
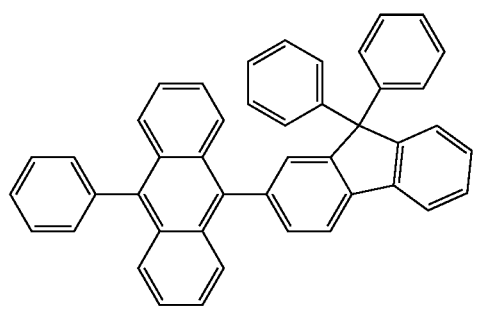

E11
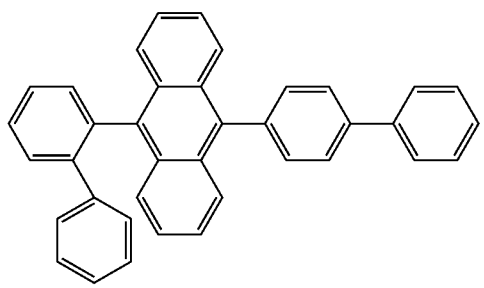
E12
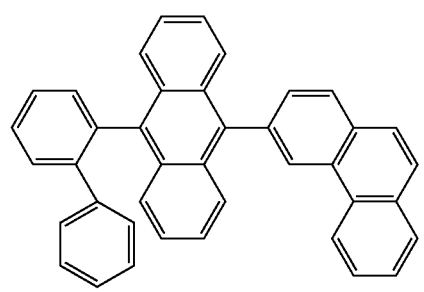
E13
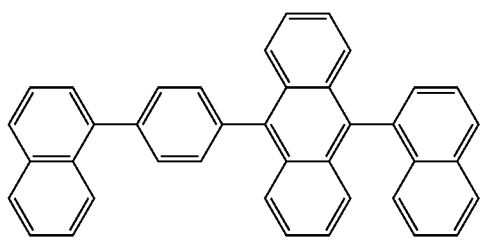
E14
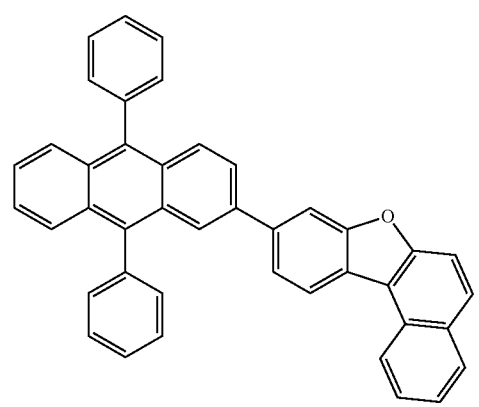
E15
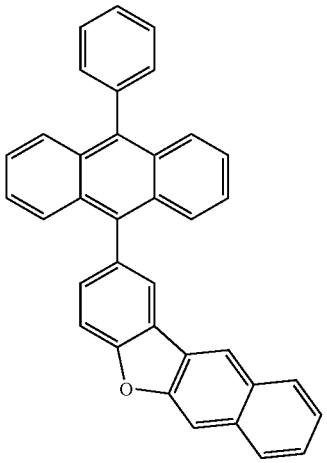
E16
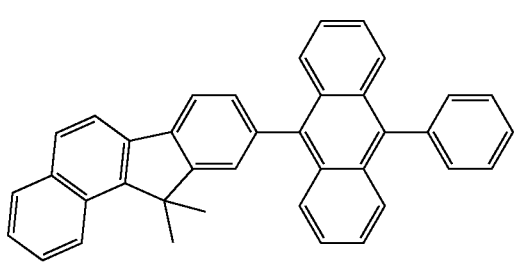
E17
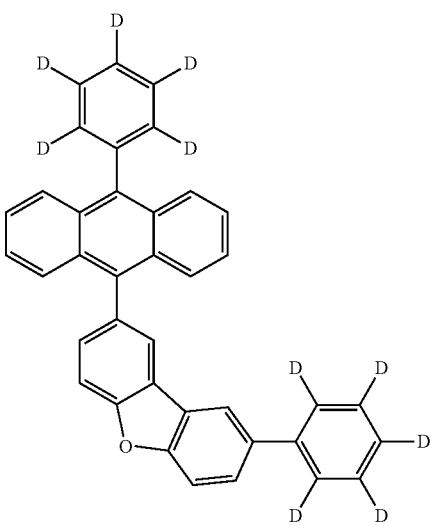
E18
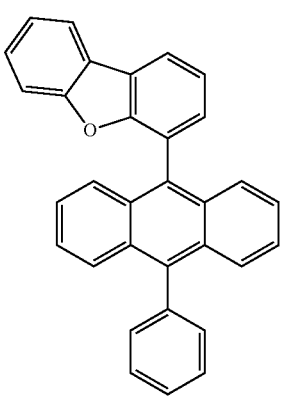

-continued
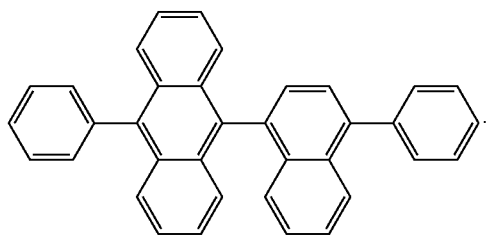
E19
In some embodiments, Formula E-1 above may be represented by any one among the compounds:
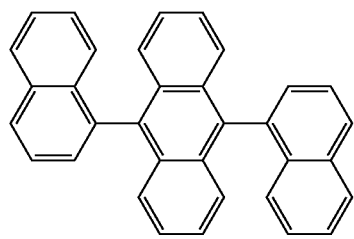
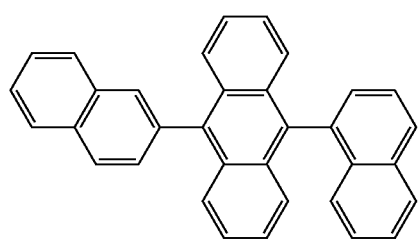
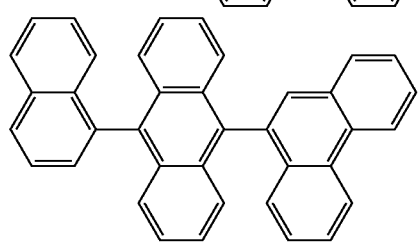
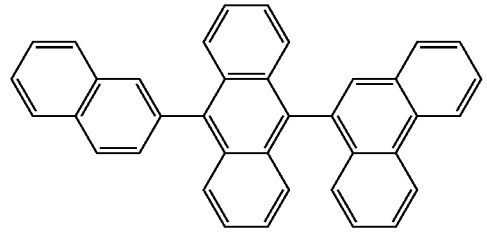
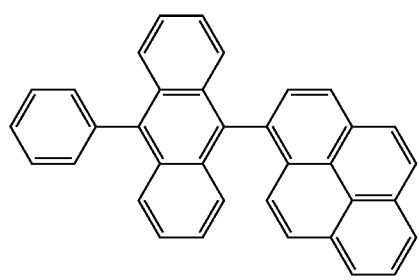
-continued
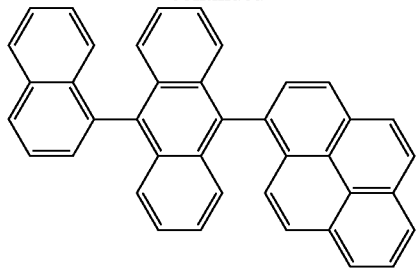
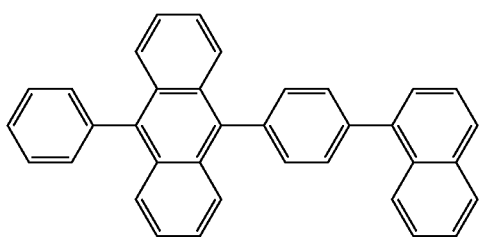
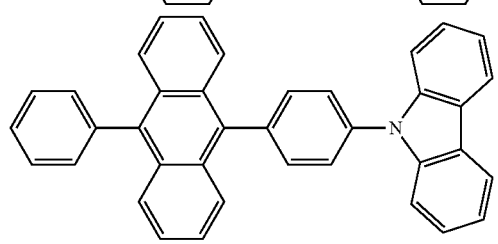
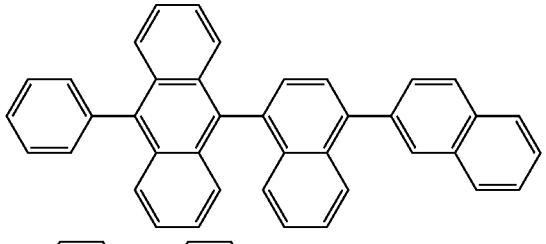
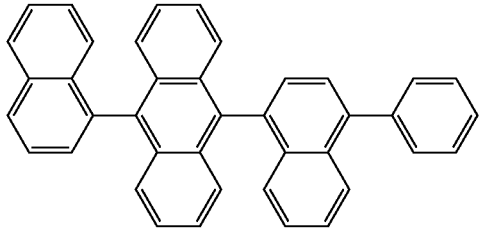
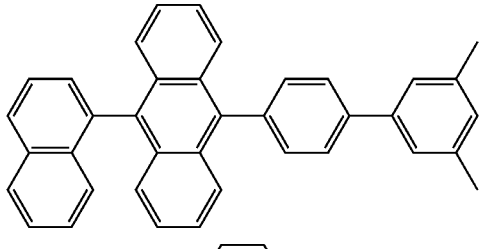
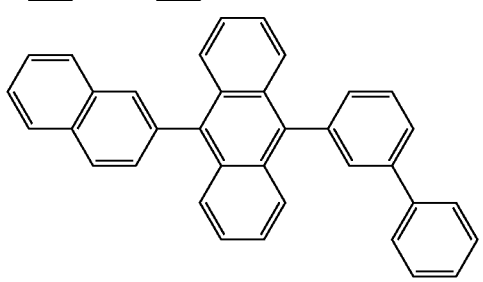

-continued
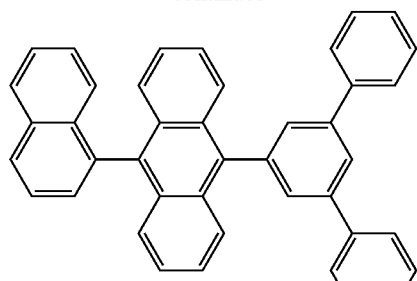
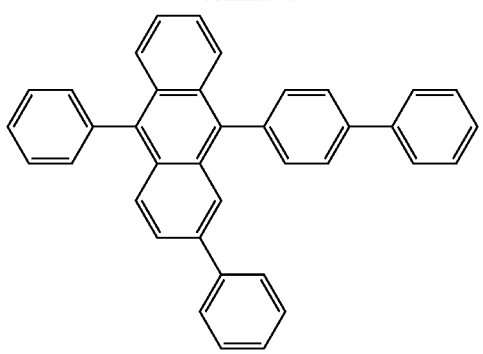
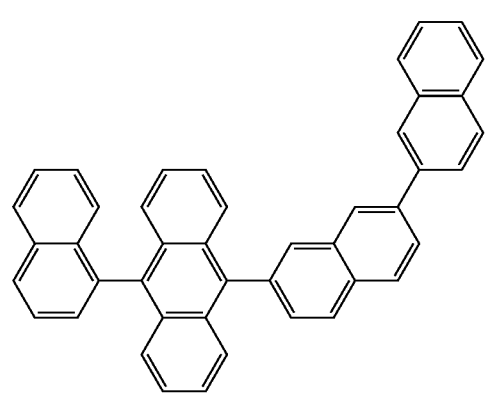
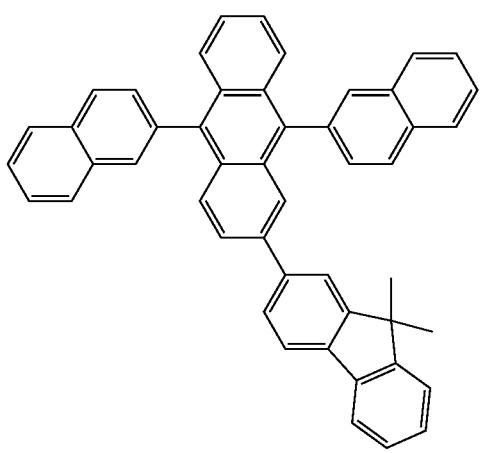
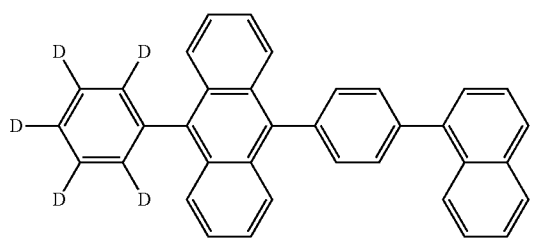
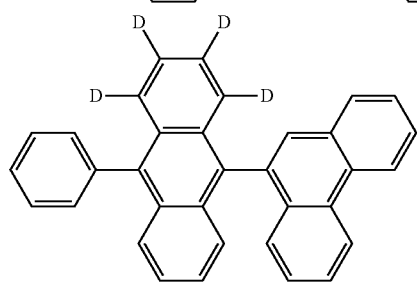
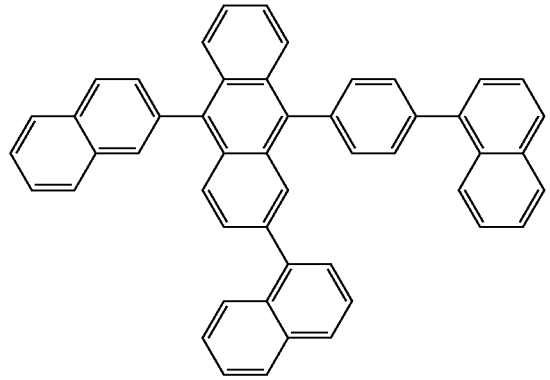
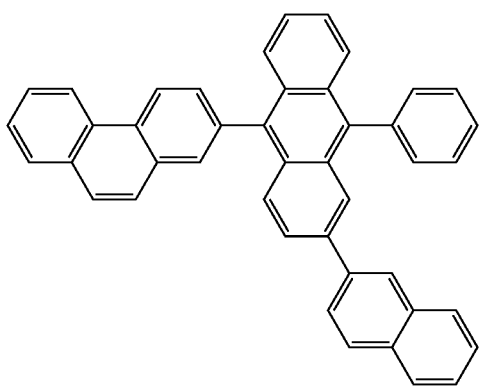

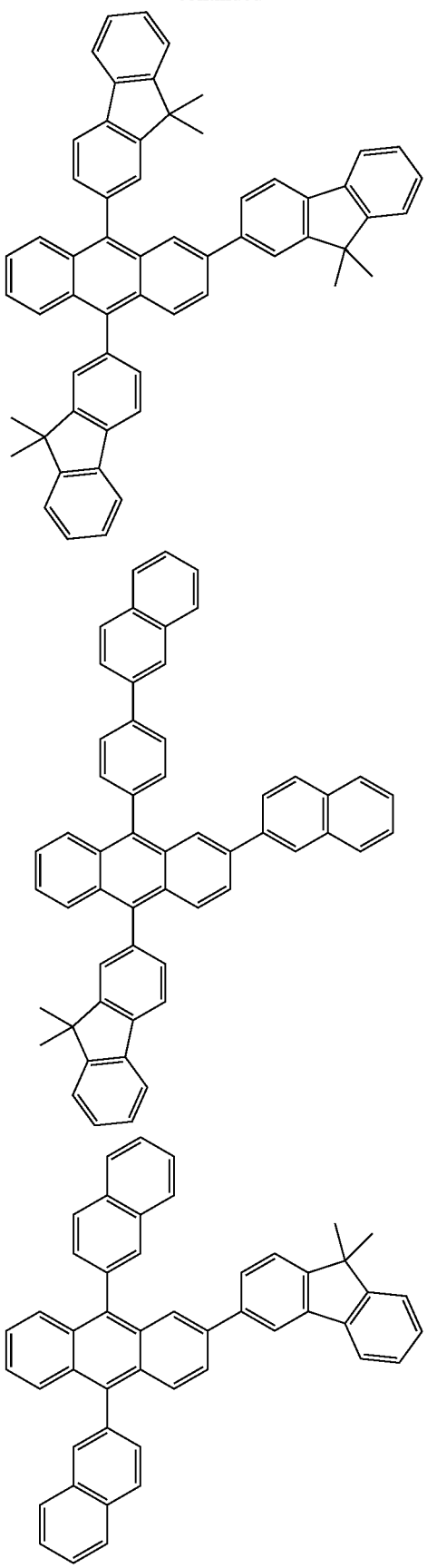

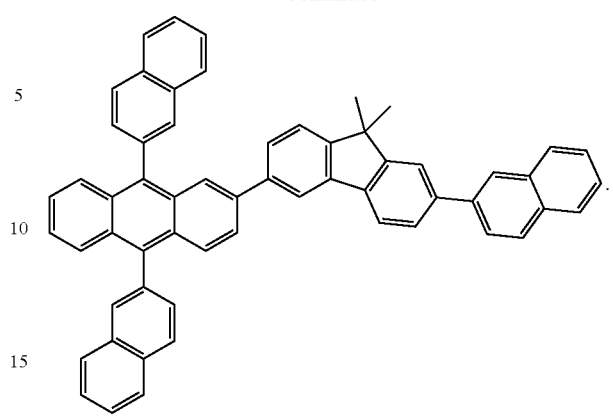

In an embodiment, the emission layer EML may include a compound represented by Formula E-2a or Formula E-2b. The compound represented by Formula E-2a or Formula E-2b may be utilized as a phosphorescence host material:

Formula E-2a

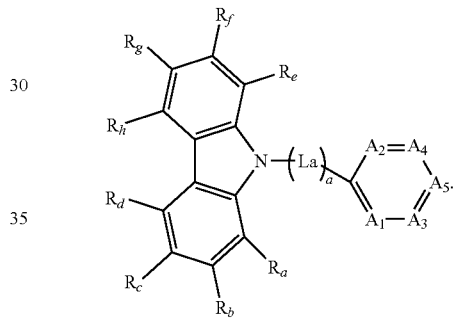

In Formula E-2a, a may be an integer of 0 to 10, and La may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a is an integer of 2 or greater, a plurality of La's may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $CR_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_a$ to $R_i$ may be bonded to an adjacent group to form a hydrocarbon ring or a heterocycle containing N, O, S, etc. as a ring-forming atom.

In some embodiments, in Formula E-2a, two or three selected from among $A_1$ to $A_5$ may be N, and the rest may be $CR_i$.

Formula E-2b $$(Cbz1)\!\!-\!\!(L_b)_{\overline{b}}\!\!-\!\!(Cbz2).$$

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, b may be an integer of 0 to 10, and when b is an integer of 2 or more, a plurality of $L_b$'s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one among the compounds of Compound Group E-2. However, the compounds listed in Compound Group E-2 are examples, and the compound represented by Formula E-2a or Formula E-2b is not limited to those represented by Compound Group E-2.

Compound Group E-2

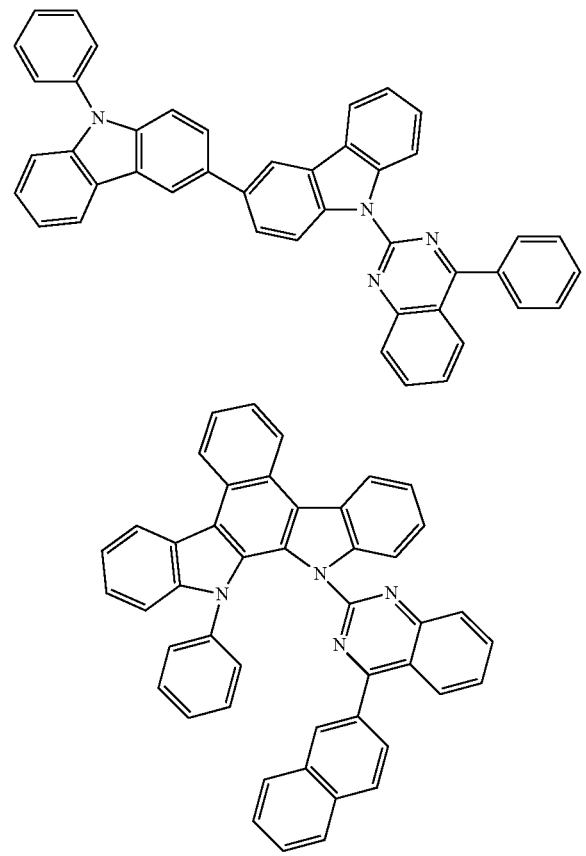

-continued

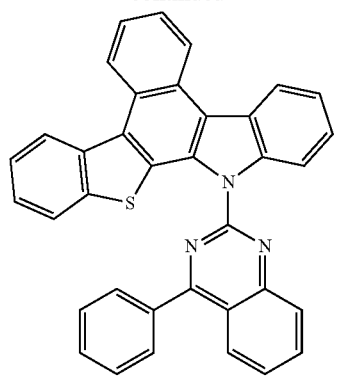

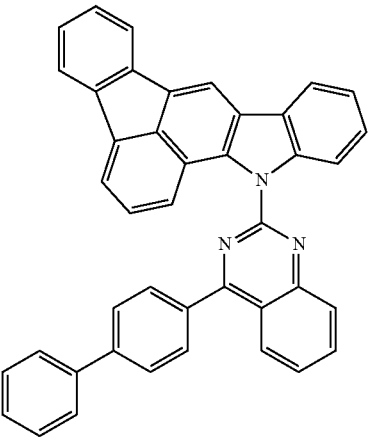

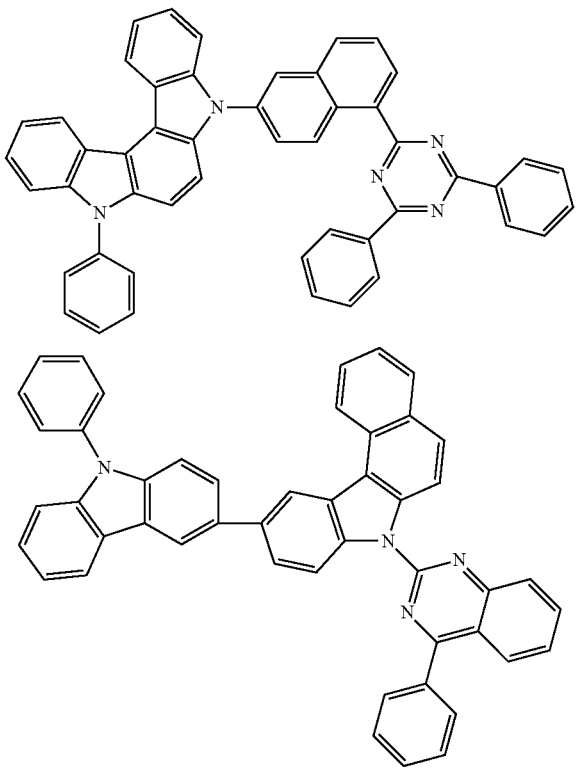

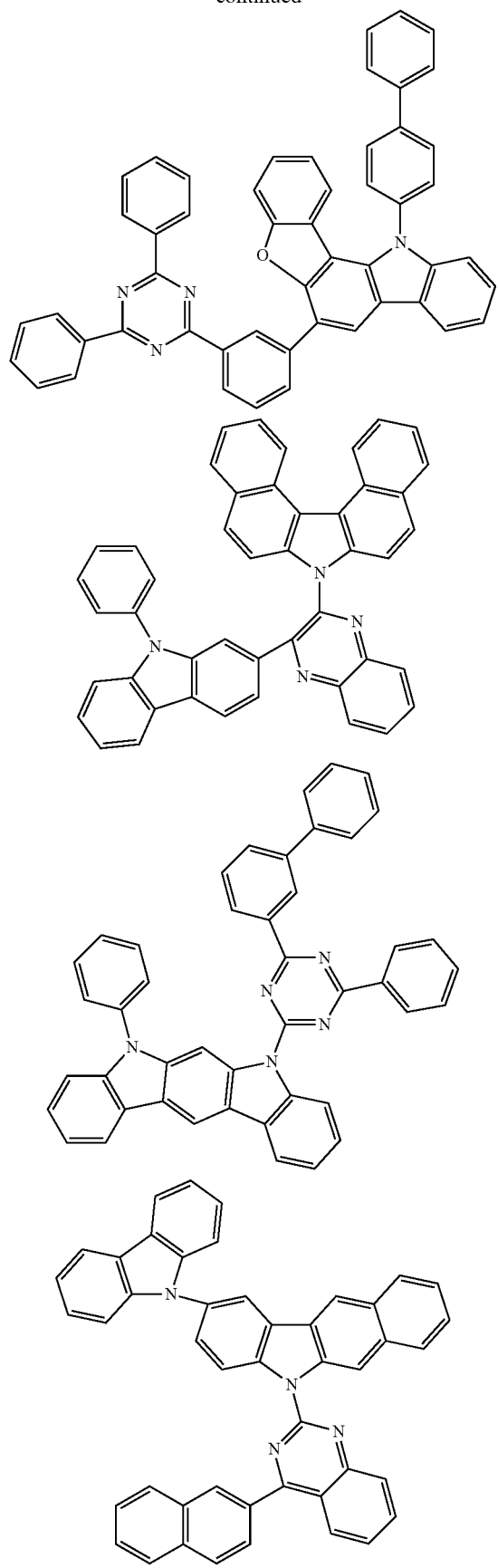
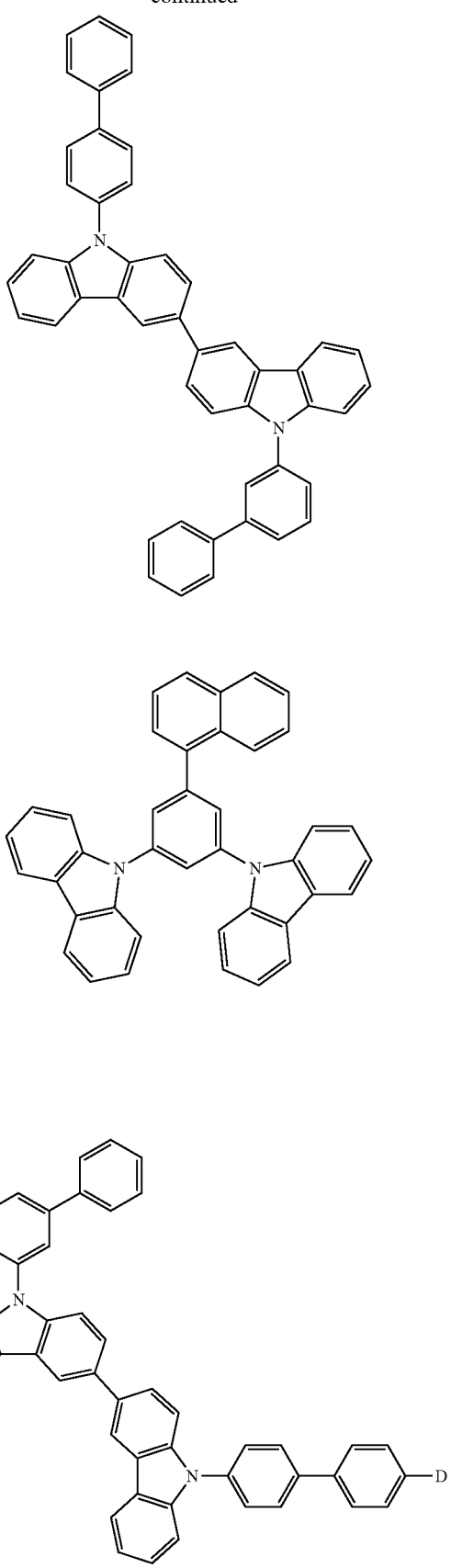

69
-continued
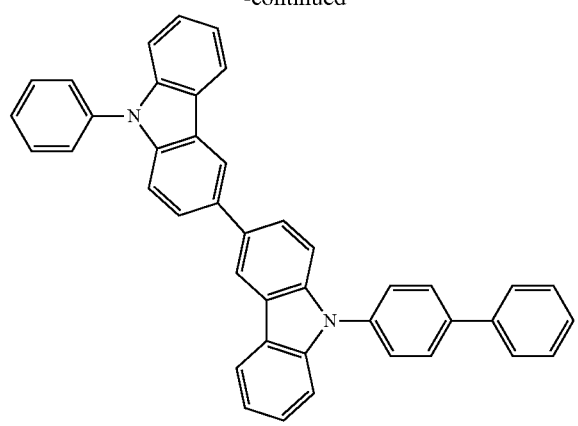
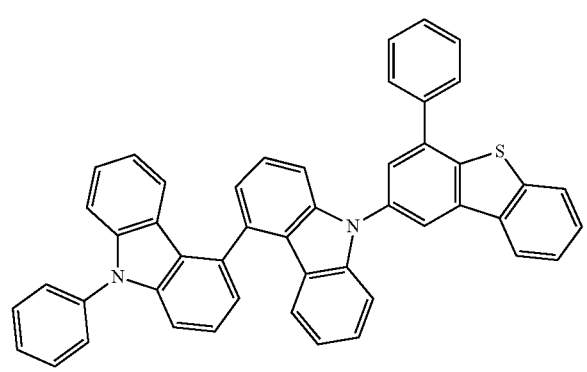
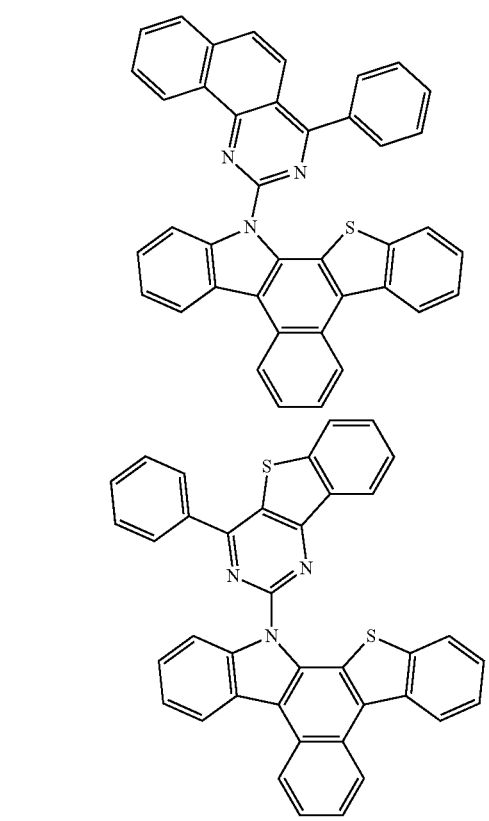
70
-continued
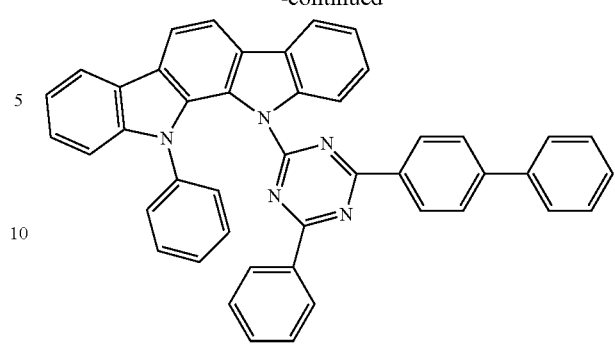
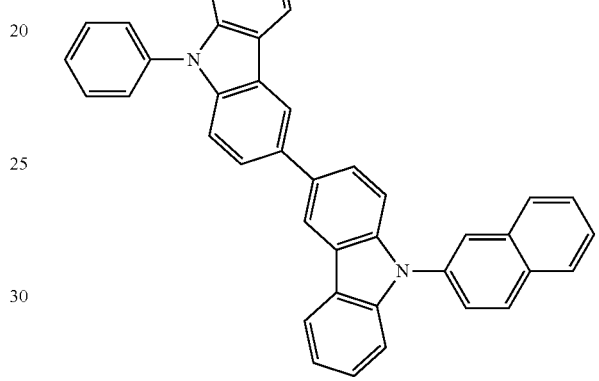
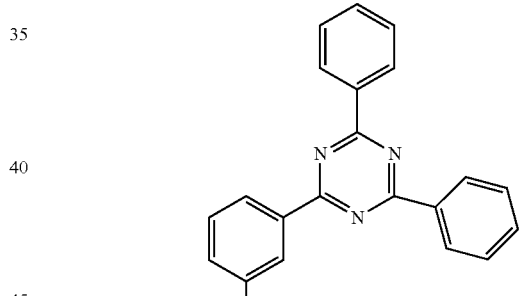
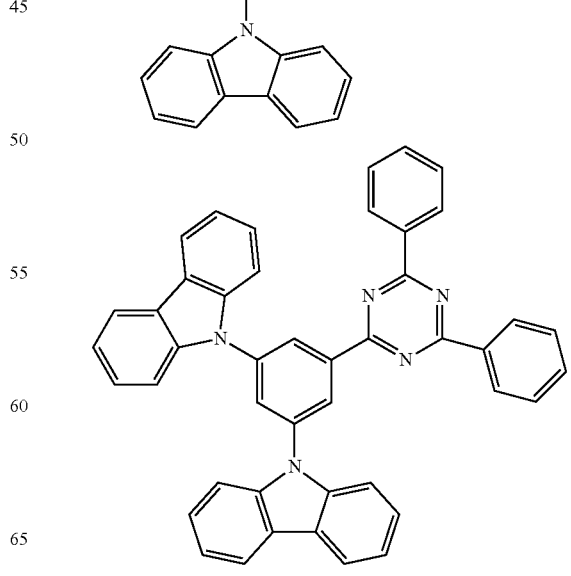

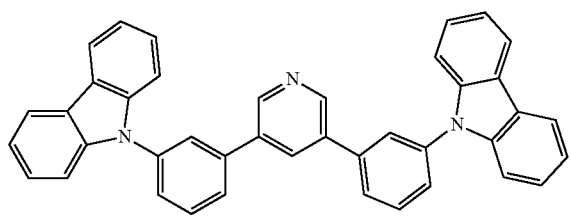
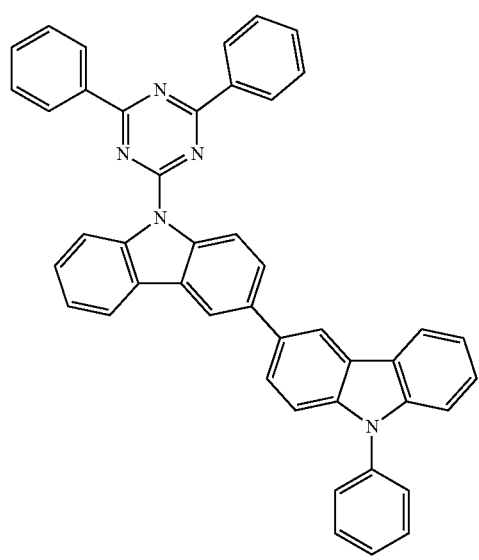
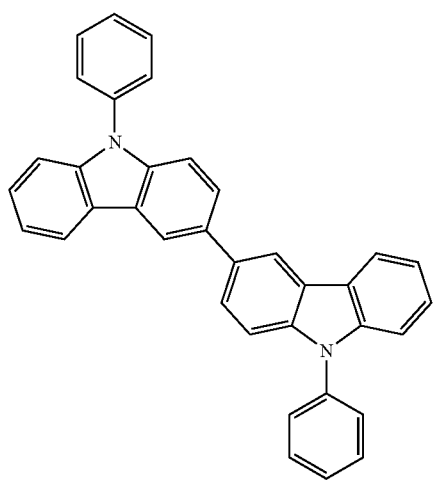
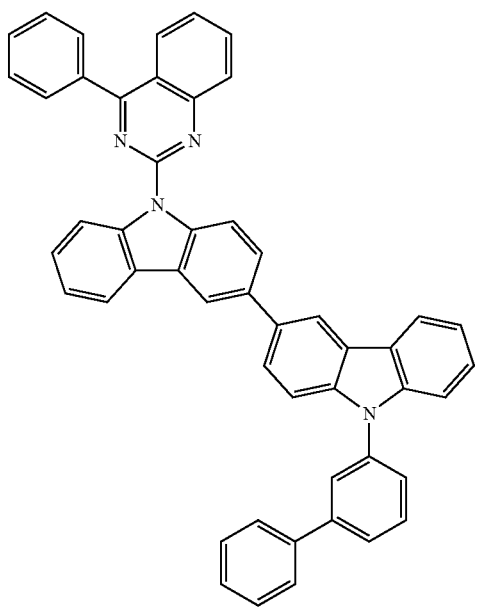
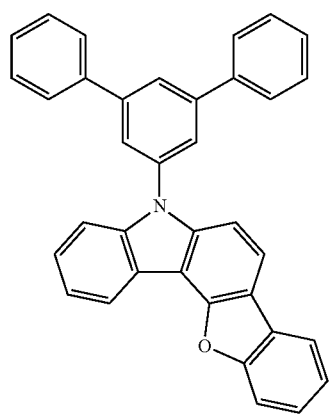
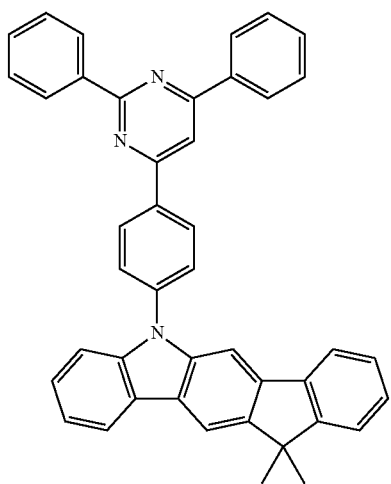

-continued

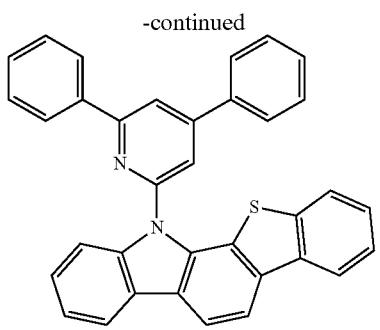

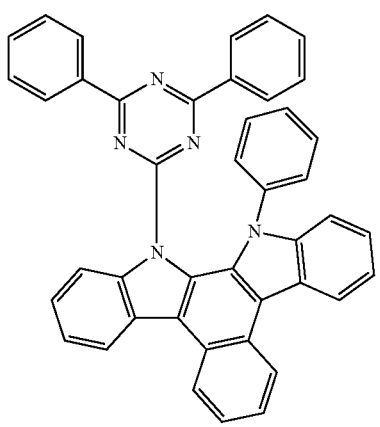

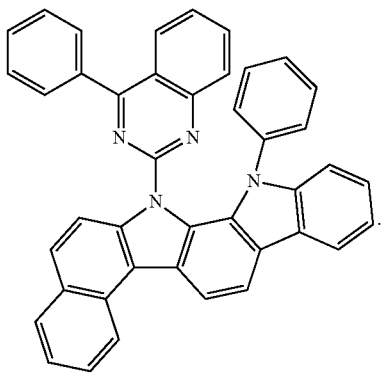

The emission layer EML may further include any suitable material in the art as a host material. For example, the emission layer EML may include, as a host material, at least one of bis[2-(diphenylphosphino)phenyl] ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments of the present disclosure are not limited thereto, and for example, tris(8-hydroxyquinolino)aluminum (Alq$_3$), poly (N-vinylcarbazole) (PVK), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), etc. may be utilized as a host material.

The emission layer EML may further include a compound represented by Formula M-a or Formula M-b. The compound represented by Formula M-a or Formula M-b may be utilized as a phosphorescence dopant material.

Formula M-a

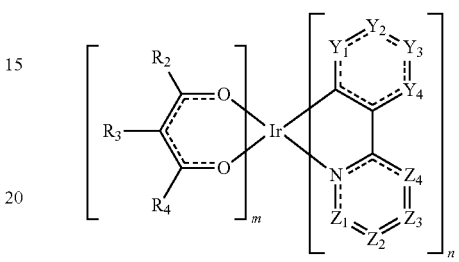

In Formula M-a, $Y_1$ to $Y_4$ and $Z_1$ to $Z_4$ may each independently be $CR_1$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In Formula M-a, m may be 0 or 1, and n may be 2 or 3. In Formula M-a, when m is 0, n is 3, and when m is 1, n is 2.

The compound represented by Formula M-a may be utilized as a red phosphorescence dopant or a green phosphorescence dopant.

The compound represented by Formula M-a may be represented by any one among Compound M-a1 to Compound M-a23. However, Compounds M-a1 to M-a23 are examples, and the compound represented by Formula M-a is not limited to those represented by Compounds M-a1 to M-a23.

M-a1

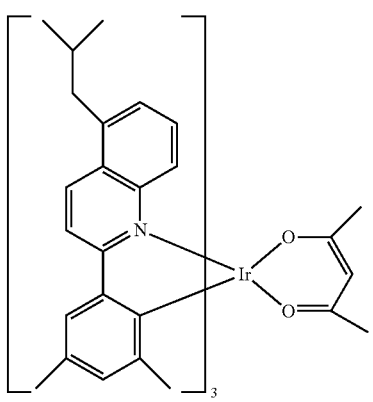

-continued
M-a2
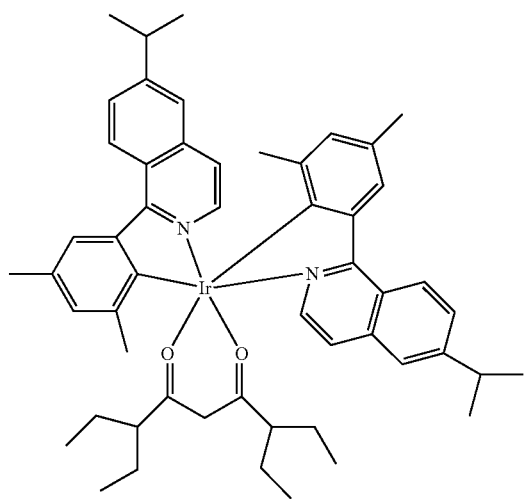
M-a3
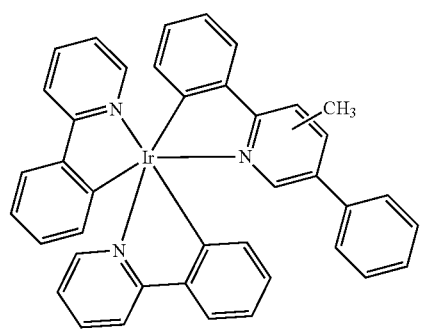
M-a4
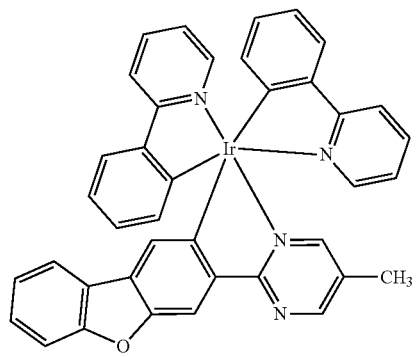
M-a5
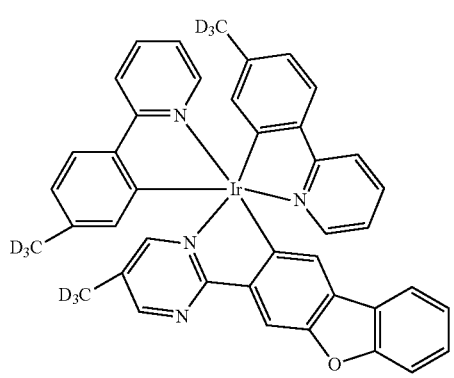
-continued
M-a6
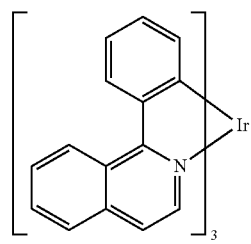
M-a7
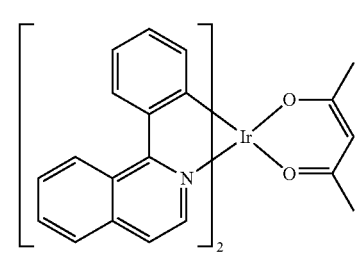
M-a8
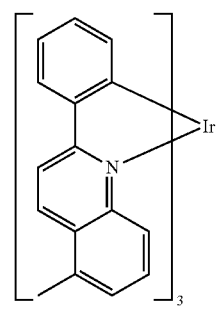
M-a9
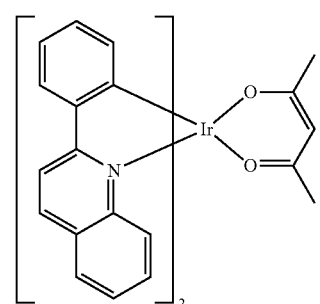
M-a10
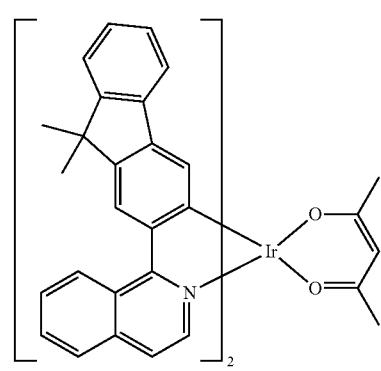

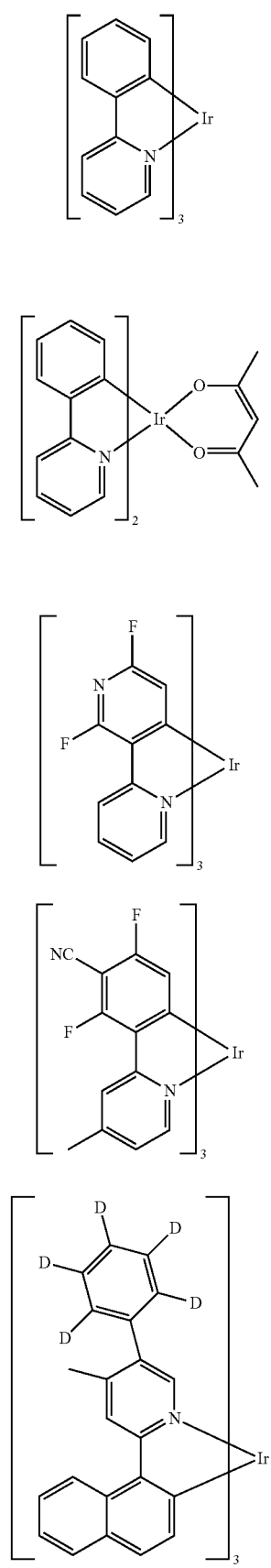
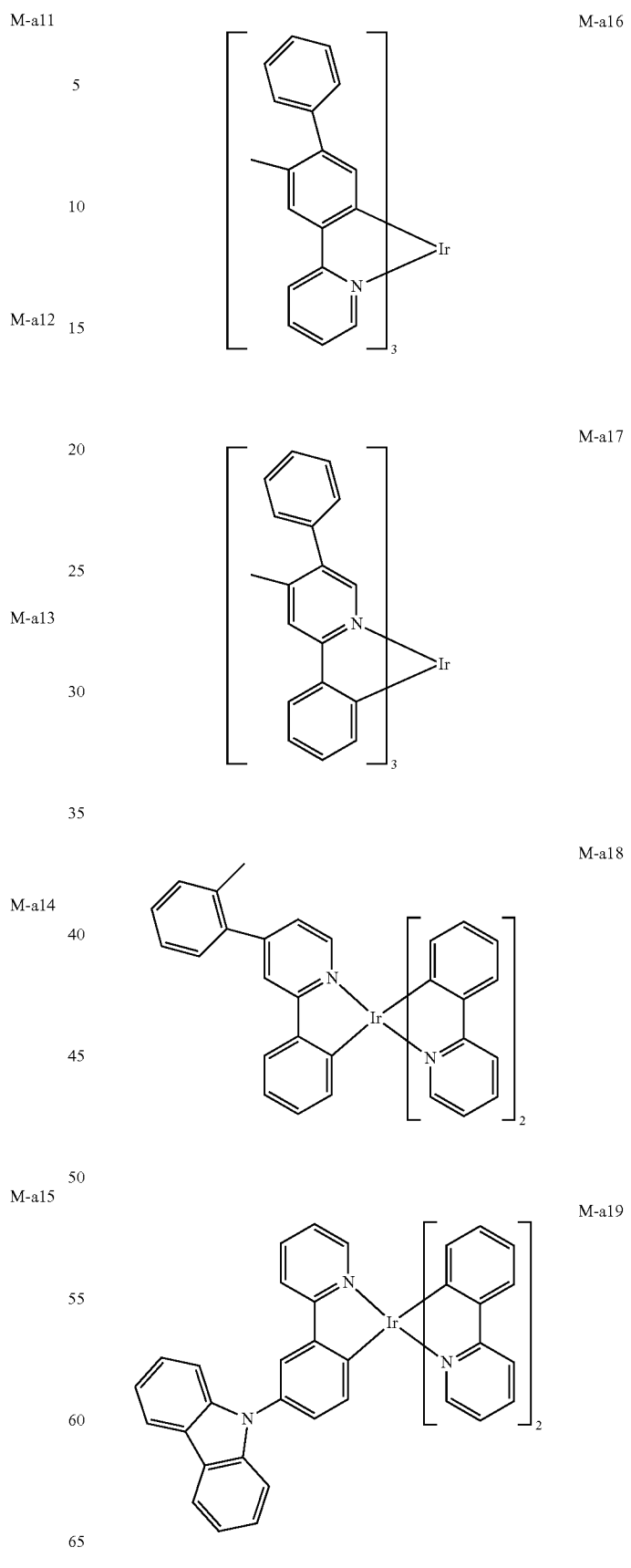

M-a20

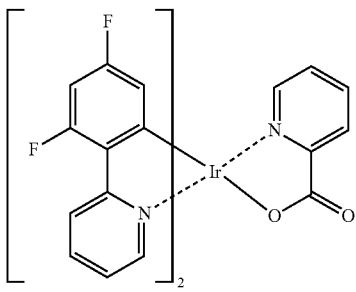

M-a21

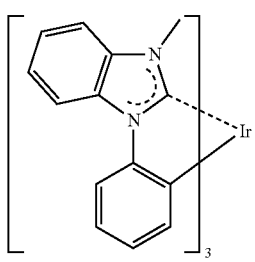

M-a22

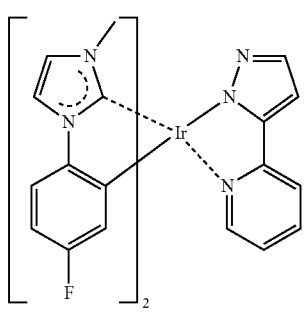

M-a23

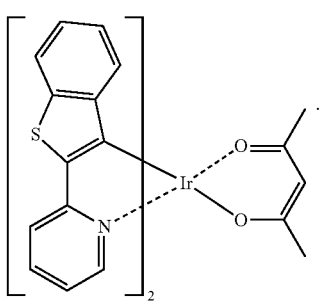

Compound M-a1 and Compound M-a2 may be utilized as a red dopant material, and Compound M-a3 to Compound M-a5 may be utilized as a green dopant material.

Formula M-b

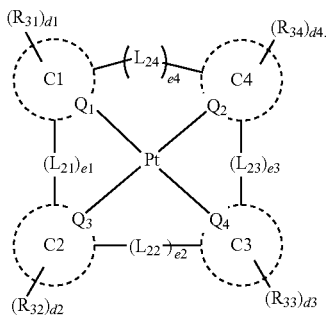

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage, $*-O-*$, $*-S-*$, $\underset{R_{35}\ R_{36}}{*\!\diagdown\!Si\!\diagdown\!*}$, $*-\underset{R_{37}}{N}-*$, $\underset{R_{38}\ R_{39}}{*\!\diagdown\!C\!\diagdown\!*}$,

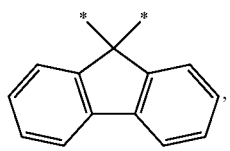

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, and d1 to d4 may each independently be an integer of 0 to 4.

The compound represented by Formula M-b may be utilized as a blue phosphorescence dopant or a green phosphorescence dopant.

The compound represented by Formula M-b may be represented by any one among the compounds below. However, the compounds below are examples, and the compound represented by Formula M-b is not limited to those represented by the compounds below.

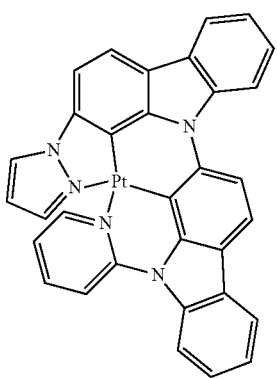
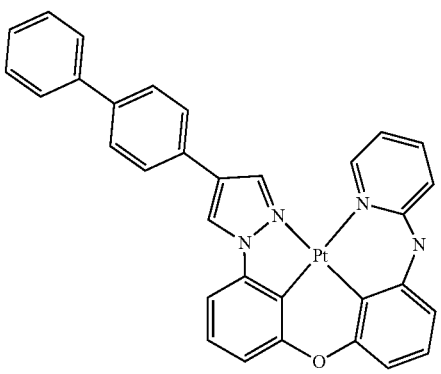
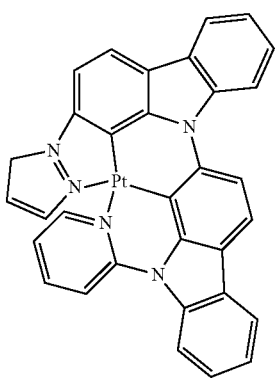
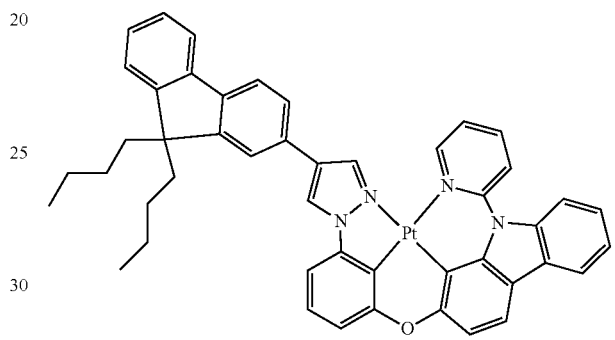
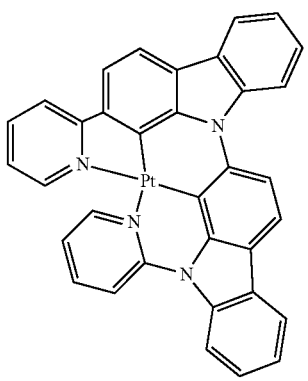
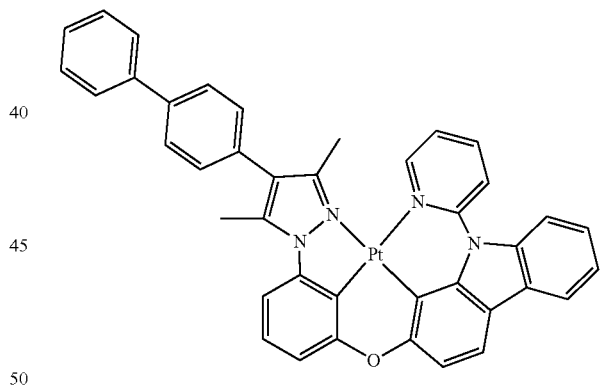
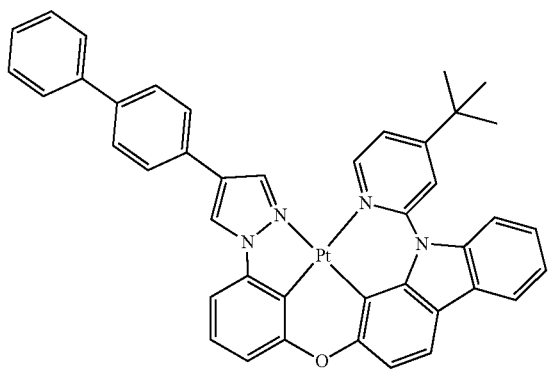
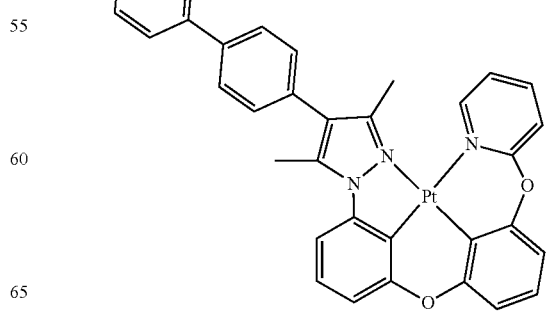

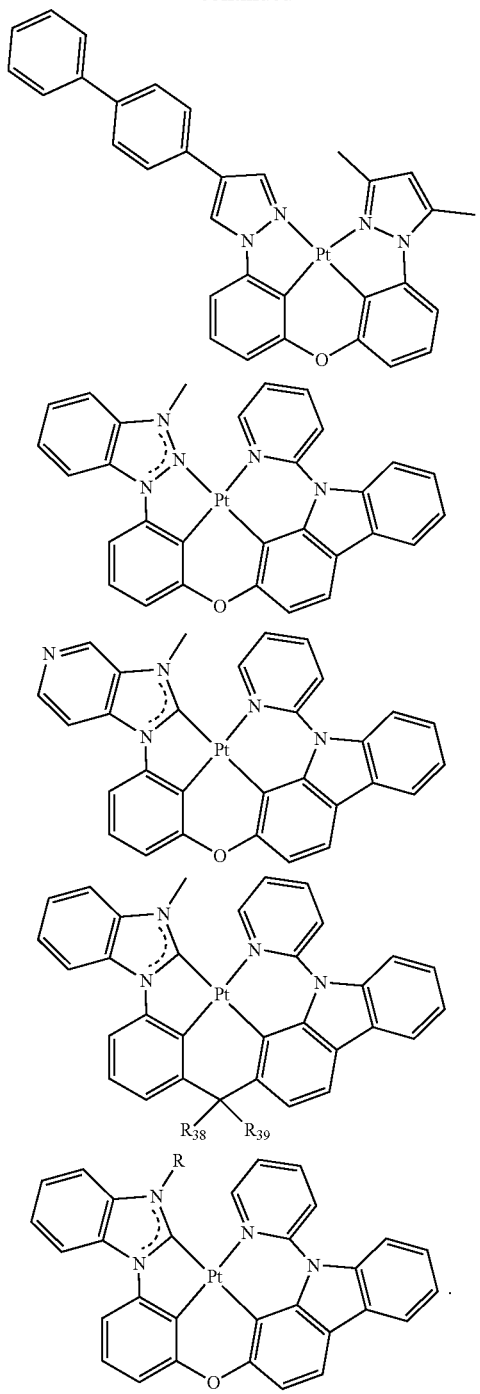

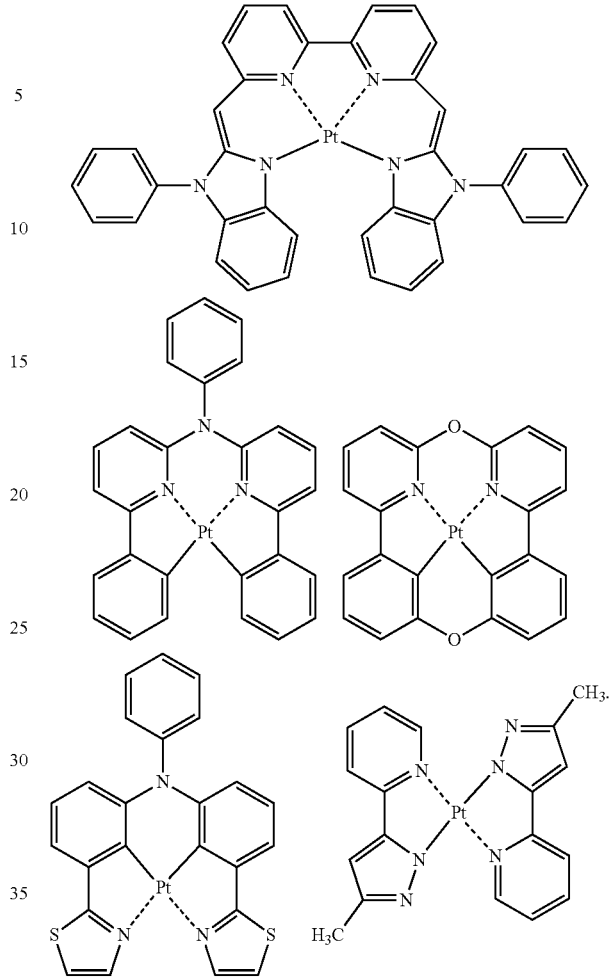

In the compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In some embodiments, at least one among the compounds below including Pt as a central metal may be included as a dopant material.

The emission layer EML may further include a compound represented by any one among Formula F-a to Formula F-c. The compound represented by Formula F-a or Formula F-c may be utilized as a fluorescence dopant material.

Formula F-a

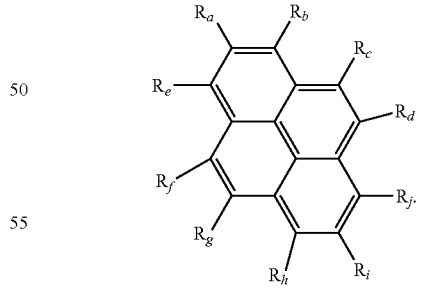

In Formula F-a, two selected from among $R_a$ to $R_j$ may each independently be substituted with *—$NAr_1Ar_2$. The others, which are not substituted with *—$NAr_1Ar_2$, among $R_a$ to $R_j$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

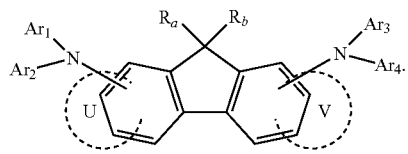

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, when the number of U or V is 1, one ring forms a condensed ring at a part described as U or V, and when the number of U or V is 0, a ring described as U or V is not present. For example, when the number of U is 0 and the number of V is 1, or when the number of U is 1 and the number of V is 0, the condensed ring having a fluorene core of Formula F-b may be a four-ring cyclic compound. When each number of U and V is 0, the condensed ring of Formula F-b may be a three-ring cyclic compound. When each number of U and V is 1, the condensed ring having a fluorene core of Formula F-b may be a five-ring cyclic compound. $Ar_1$, $Ar_2$, $Ar_3$, and $Ar_4$ may each independently be a substituted or unsubstituted aryl group having 6 to 30 ring-forming carbon atoms, or a substituted or unsubstituted heteroaryl group having 2 to 30 ring-forming carbon atoms.

Formula F-c

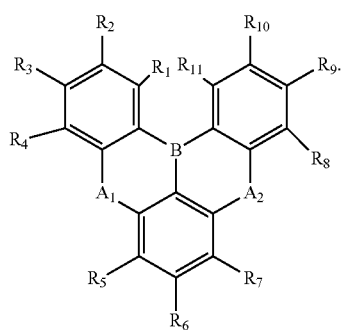

In Formula F-c, $A_1$ and $A_2$ may each independently be O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-c, $A_1$ and $A_2$ may each independently be bonded to substituents of an adjacent ring to form a condensed ring. For example, when $A_1$ and $A_2$ are each independently $NR_m$, $A_1$ may be bonded to $R_4$ or $R_5$ to form a ring. In some embodiments, $A_2$ may be bonded to $R_7$ or $R_8$ to form a ring.

The emission layer may include, as a fluorescence dopant, at least one among Compound FD1 to Compound FD22:

FD1

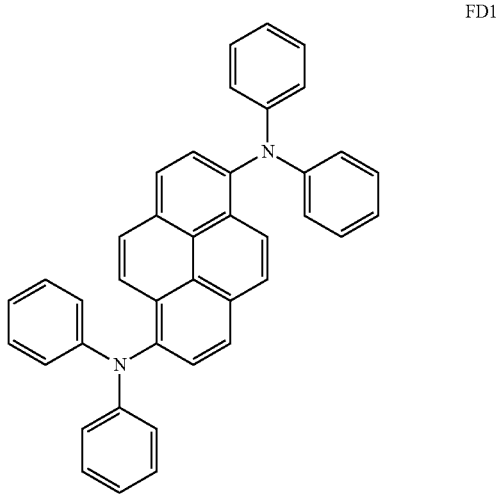

FD2

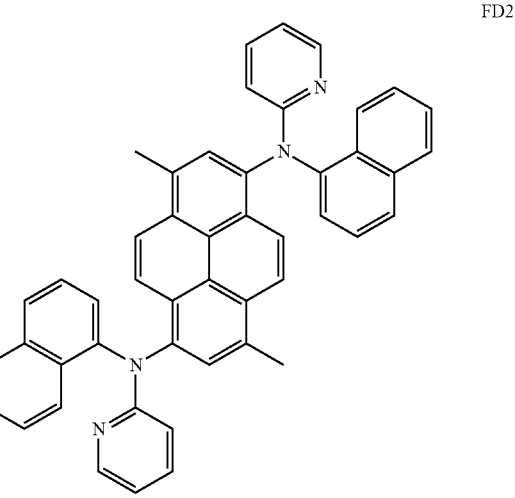

FD3
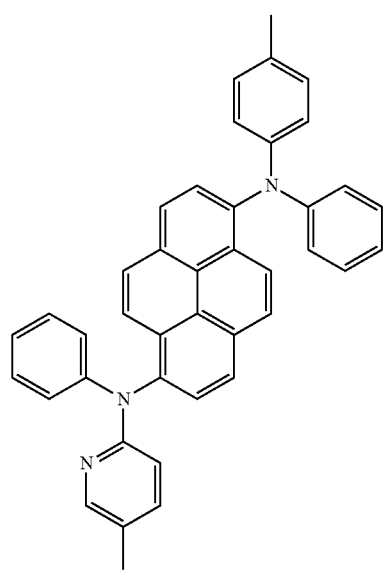
FD5
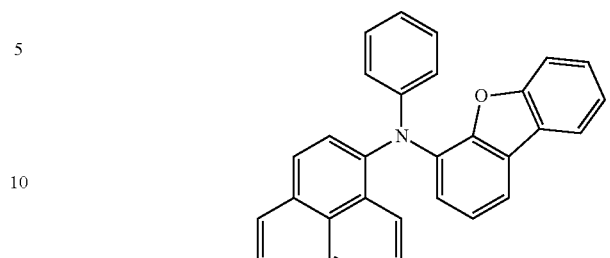
FD6
FD4
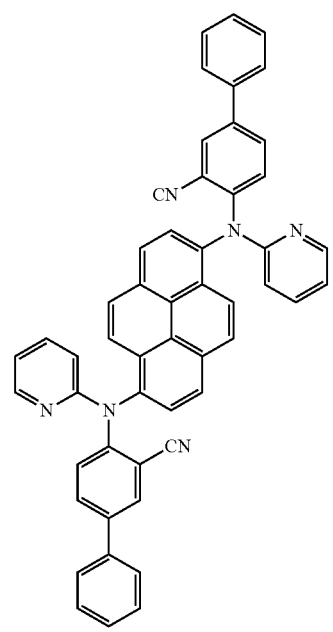
FD7
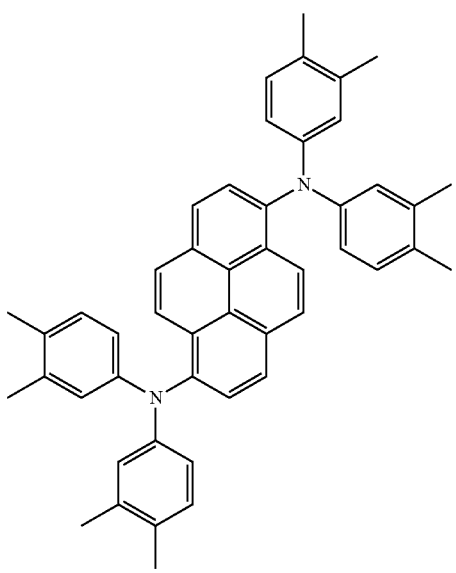

FD8
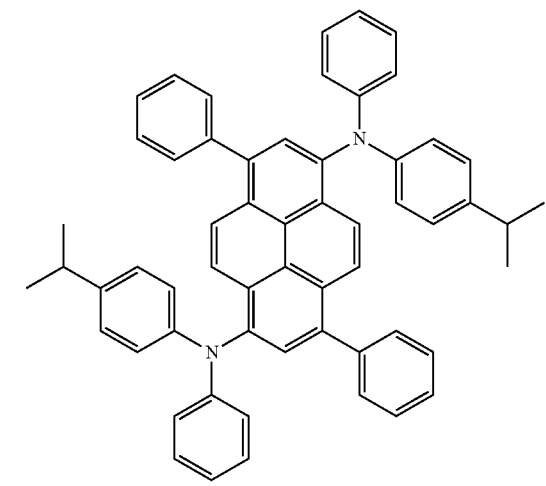
FD9
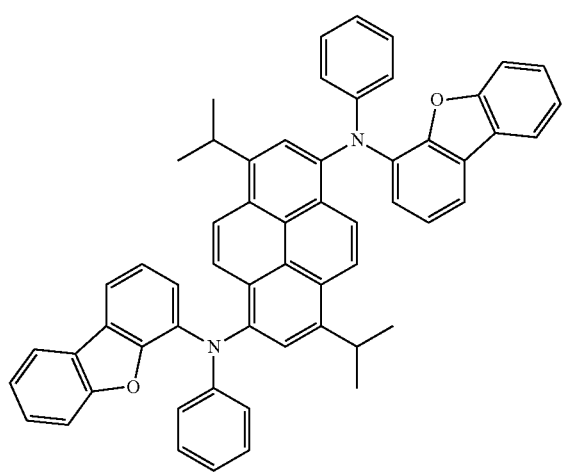
FD10
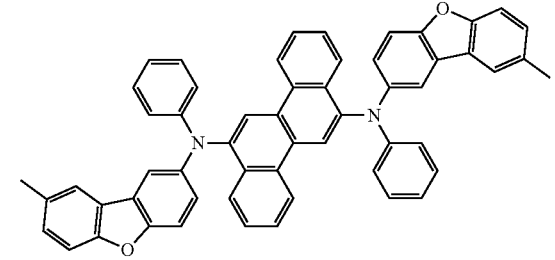
FD11
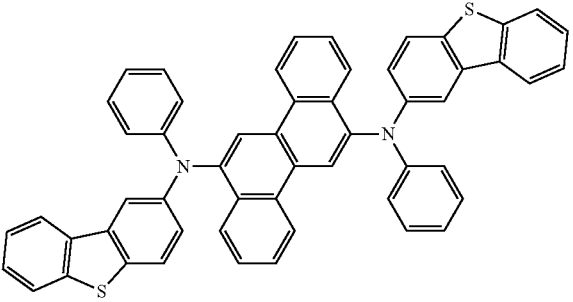
FD12
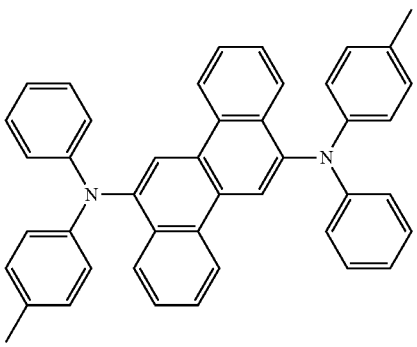
FD13
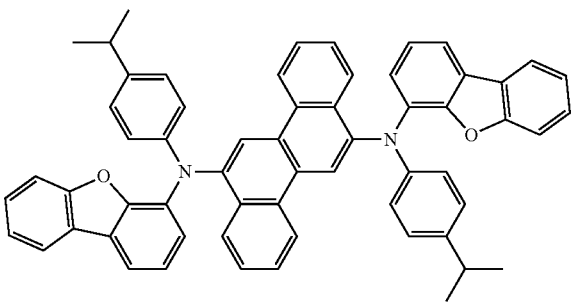
FD14
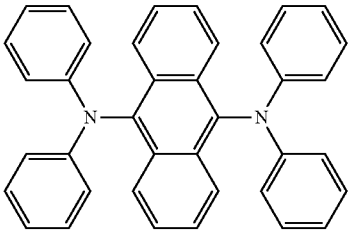
FD15
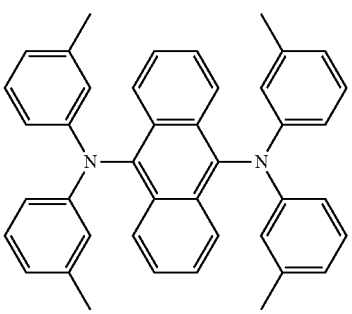
FD16
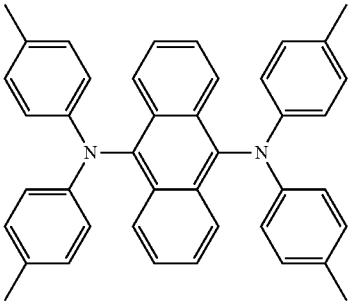

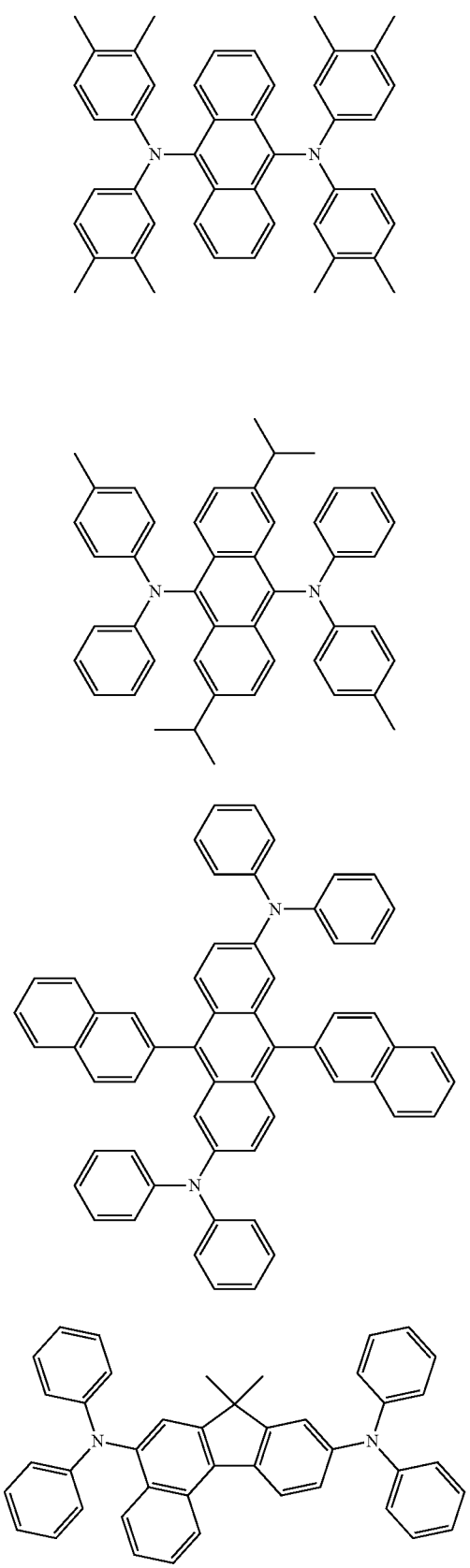

FD17
FD18
FD19
FD20

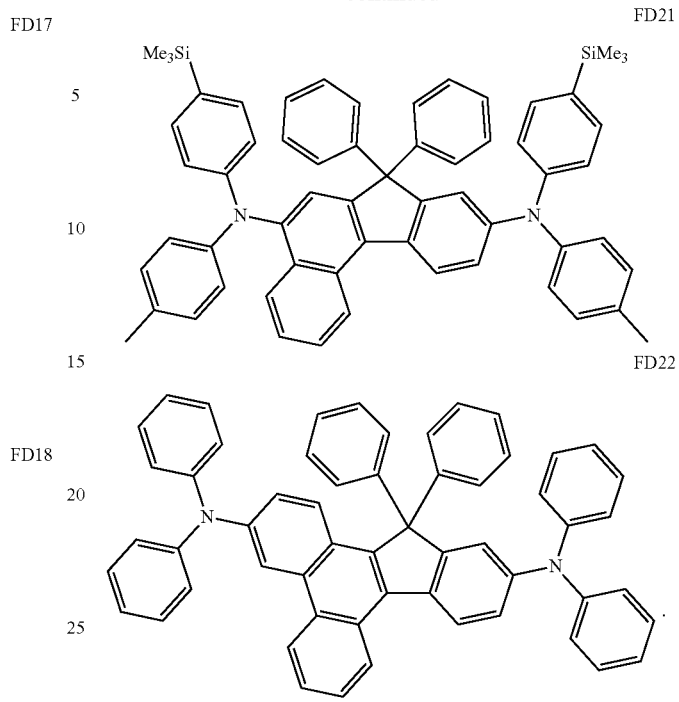

FD21
FD22

In an embodiment, the emission layer EML may further include, as a suitable dopant material, styryl derivatives (e.g., 1,4-bis[2-(3-N-ethyl carbazolyl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenyl benzenamine (N-BDAVBi), 4,4'-bis[2-(4-(N,N-diphenylamino)phenyl)vinyl]biphenyl(DPAVBi), perylene and/or derivatives thereof (e.g., 2,5,8,11-tetra-t-butylperylene (TBP)), pyrene and/or derivatives thereof (e.g., 1,1-dipyrene, 1,4-dipyrenylbenzene, 1,4-bis(N,N-diphenylamino)pyrene), etc.

The emission layer EML may further include any suitable phosphorescence dopant material. For example, a metal complex including iridium (Ir), platinum (Pt), osmium (Os), gold (Au), titanium (Ti), zirconium (Zr), hafnium (Hf), europium (Eu), terbium (Tb), or thulium (Tm) may be utilized as a phosphorescence dopant. For example, iridium (III) bis(4,6-difluorophenylpyridinato-N,C2') (Firpic), bis(2,4-difluorophenylpyridinato)-tetrakis(1-pyrazolyl)borate iridium(III) (Fir6), or platinum octaethyl porphyrin (PtOEP) may be utilized as a phosphorescence dopant. However, embodiments of the present disclosure are not limited thereto.

For example, the light emitting device ED of an embodiment includes the first host, the second host, and the dopant represented by Formula 3, and may exhibit an improved service life characteristic due to the structural characteristics of the first host compound. In some embodiments, the above-described emission layer materials may be further included in addition to the combination of the first host, the second host, and the dopant material represented by Formula 3.

In each light emitting device ED illustrated in FIGS. 1 to 4, the electron transport region ETR is provided on the emission layer EML. The electron transport region ETR may include at least one of the hole blocking layer HBL, the electron transport layer ETL, or the electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, or may have a single layer structure formed of an electron injection material and an electron transport material. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but embodiments of the present disclosure are not limited thereto. The electron transport region ETR may have a thickness, for example, of about 1,000 Å to about 1,500 Å.

The electron transport region ETR may be formed by utilizing one or more suitable methods (such as a vacuum deposition method, a spin coating method, a cast method, a Langmuir-Blodgett (LB) method, an inkjet printing method, a laser printing method, a laser induced thermal imaging (LITI) method, etc.)

The electron transport region ETR may include a compound represented by Formula ET-1:

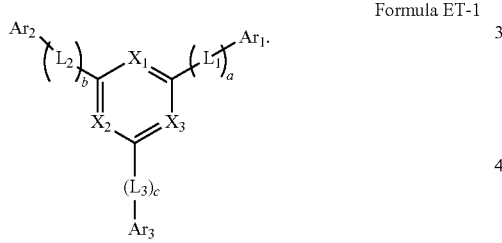

Formula ET-1

In Formula ET-1, at least one among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer of 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a to c are an integer of 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq$_2$), 9,10-di(naphthalene-2-yl)anthracene (ADN), 1,3-Bis[3,5-di(pyridin-3-yl)phenyl]benzene (BmPyPhB), or a mixture thereof.

The electron transport region ETR may include at least one among Compound ET1 to Compound ET36:

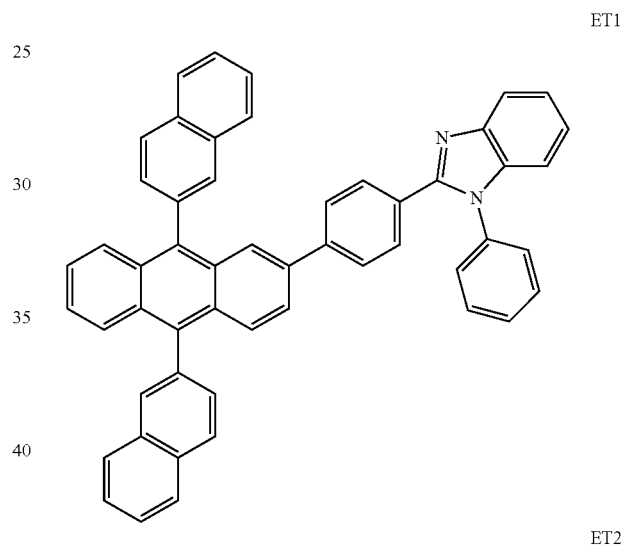

ET1

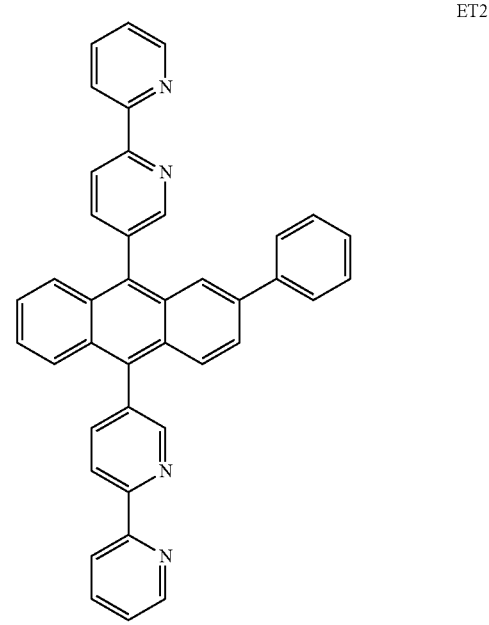

ET2

ET3
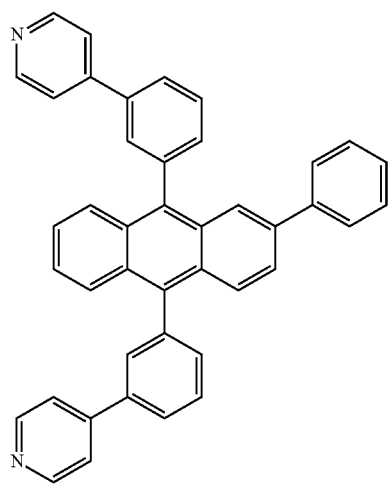
ET6
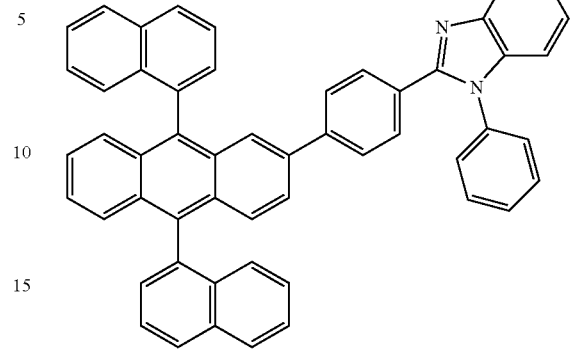
ET4
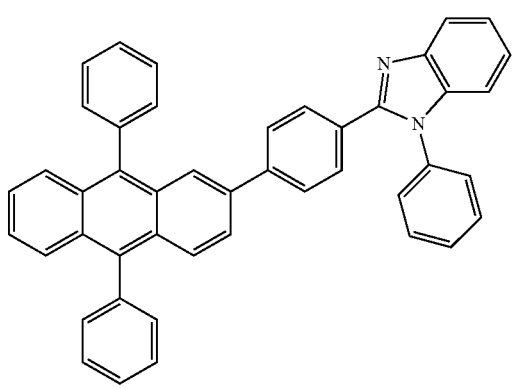
ET7
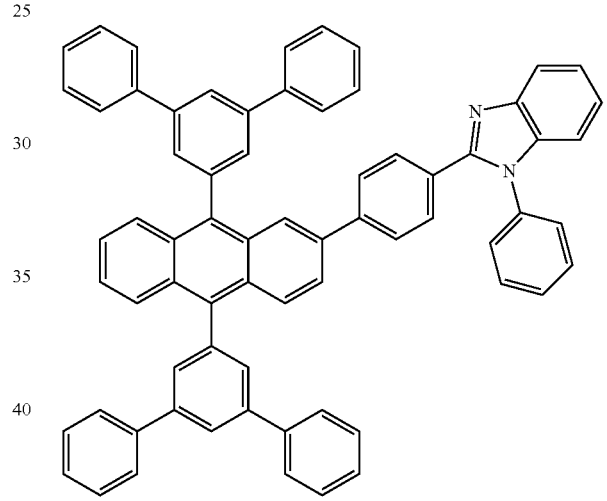
ET5
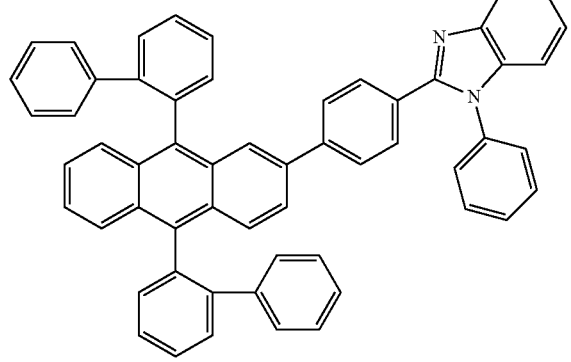
ET8
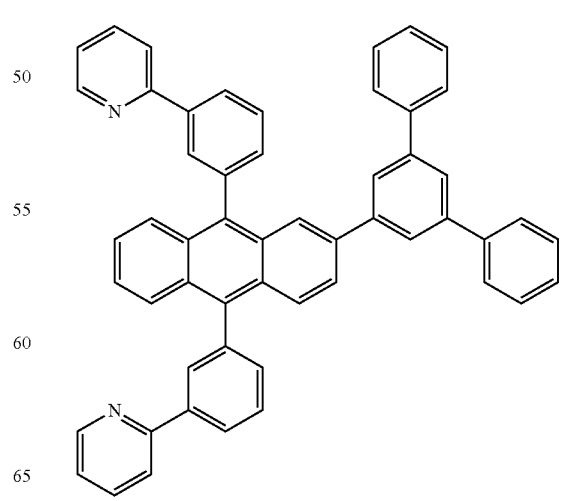

ET9
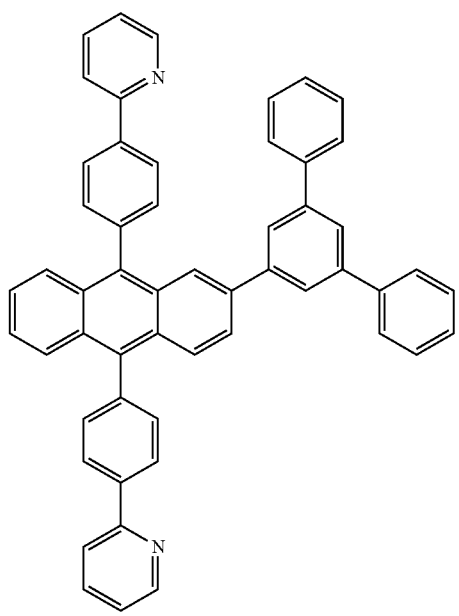
ET11
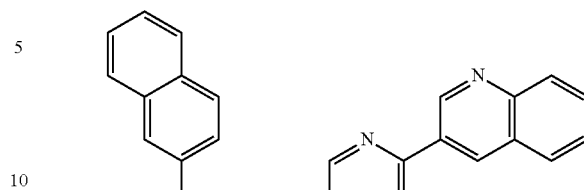
ET12
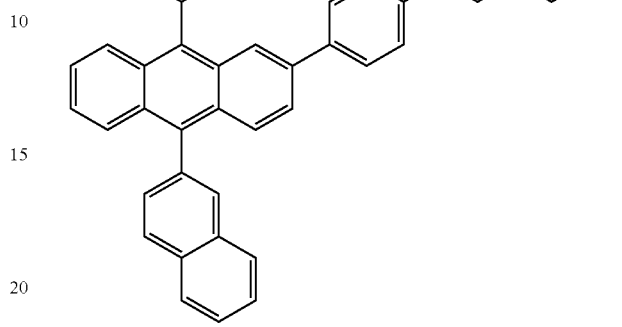
ET13
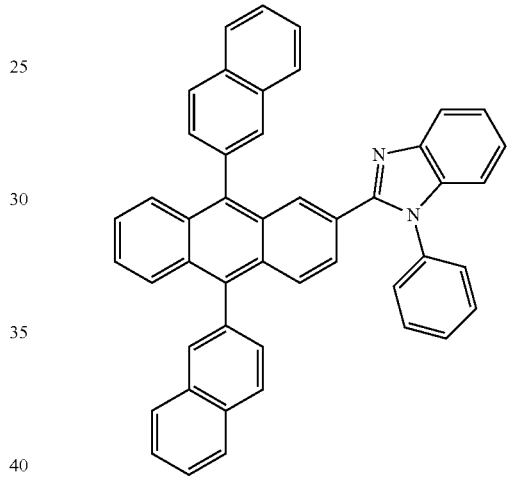
ET10
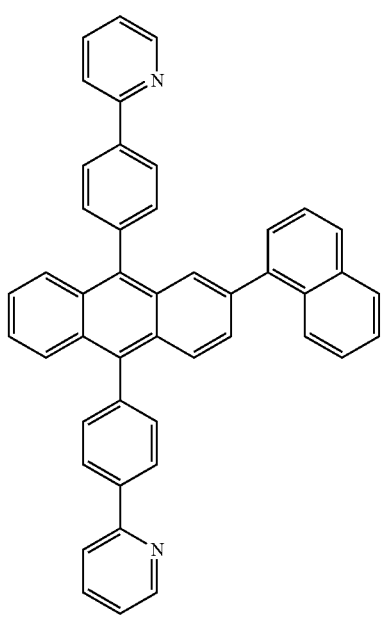
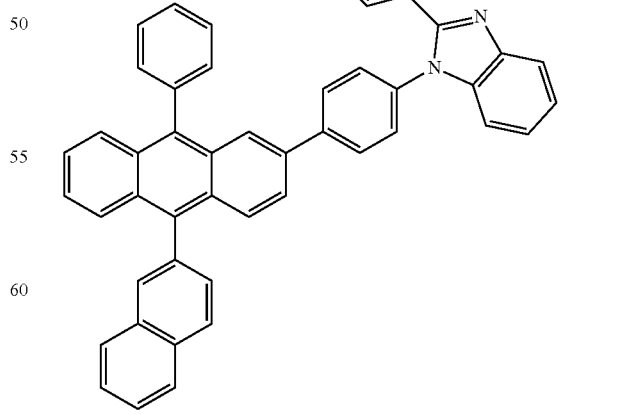

ET14
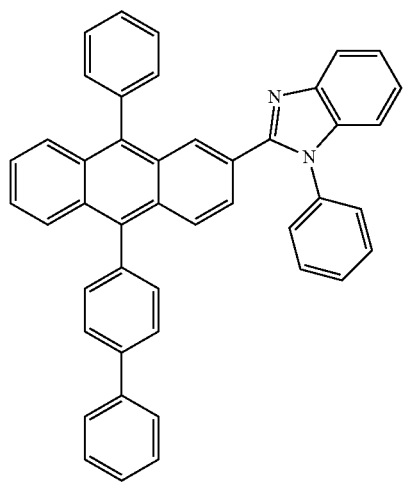
ET15
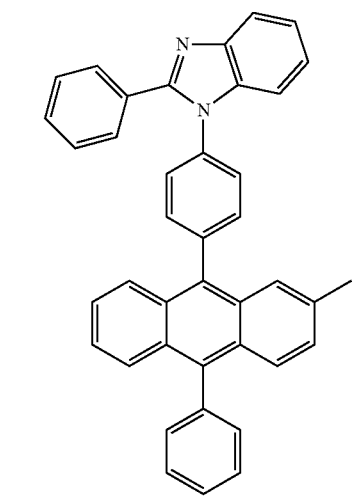
ET16
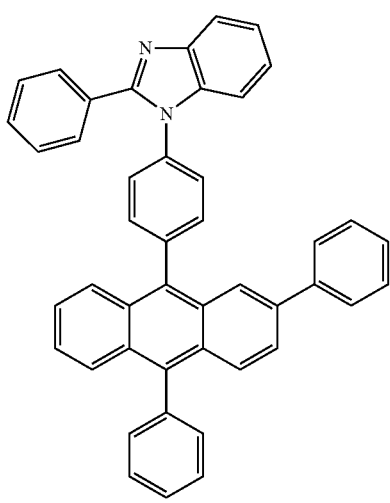
ET17
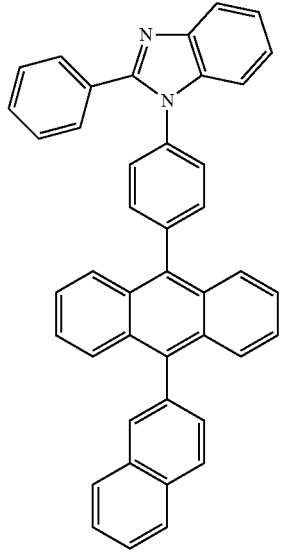
ET18
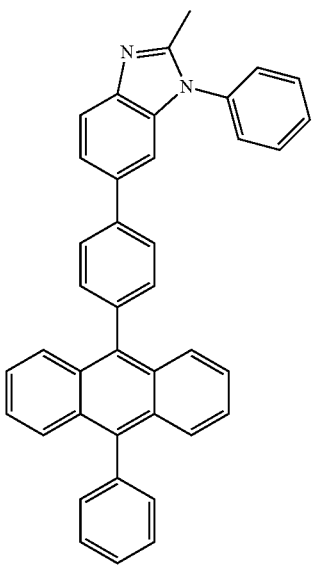
ET19
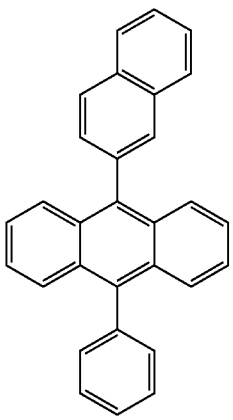

ET20
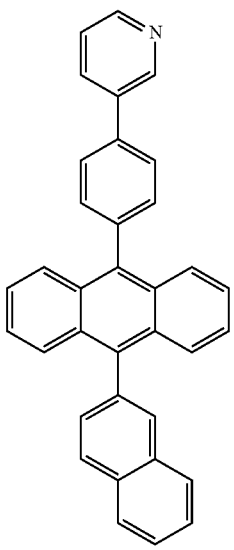
ET21
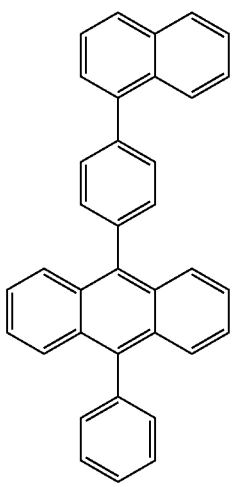
ET22
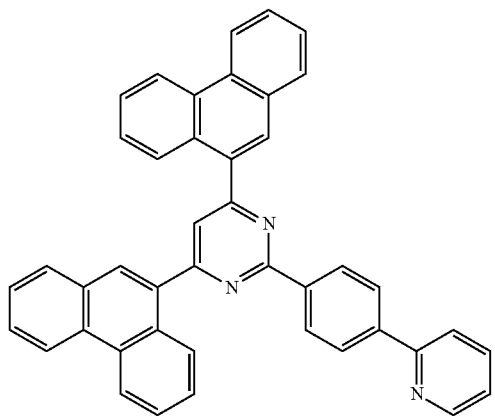
ET23
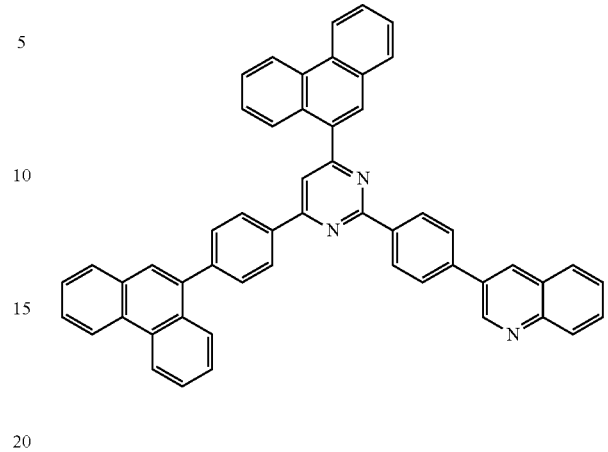
ET24
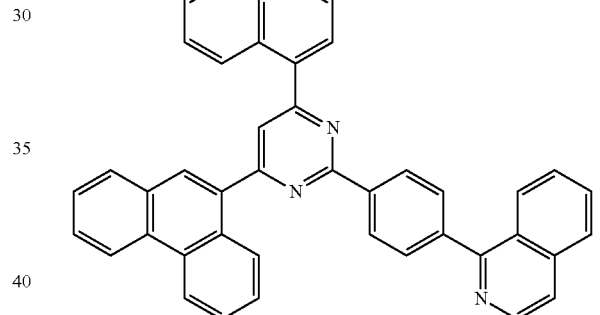
ET25
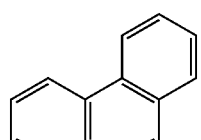
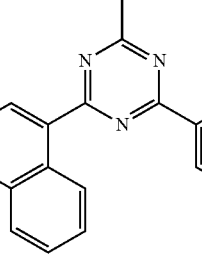

ET26
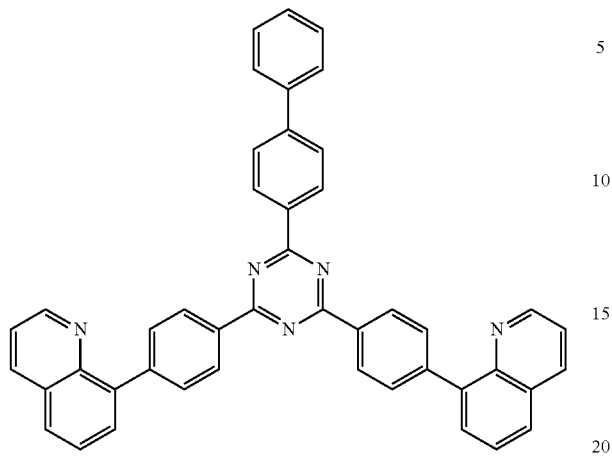
ET29
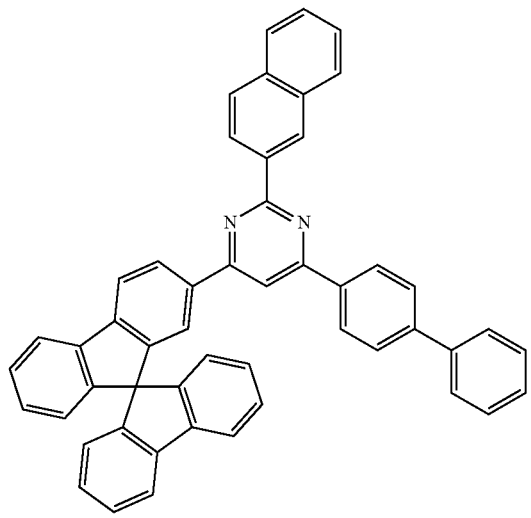
ET27
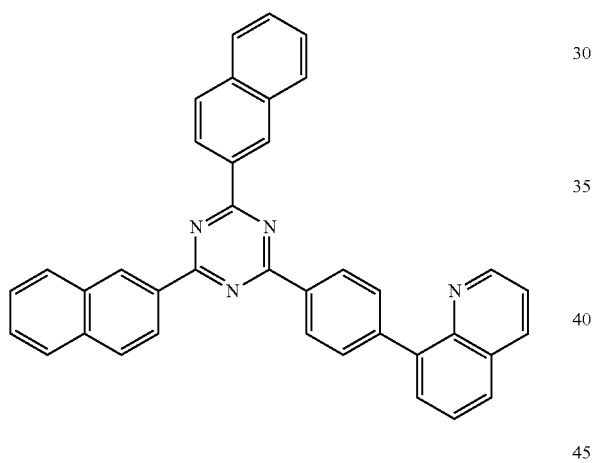
ET30
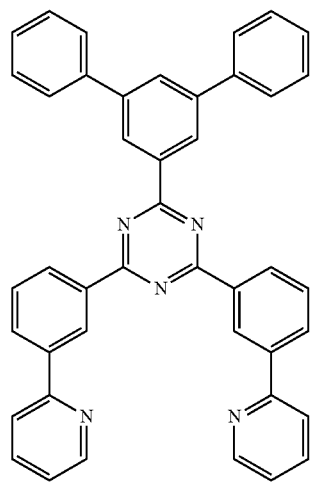
ET28
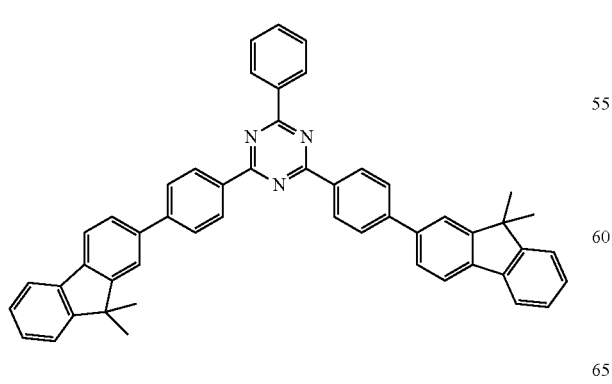
ET31
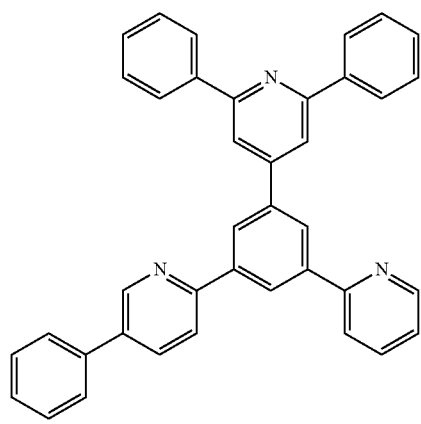

ET32 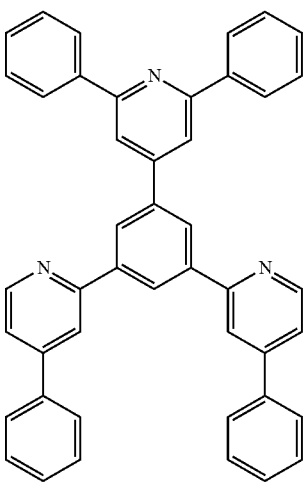

ET33 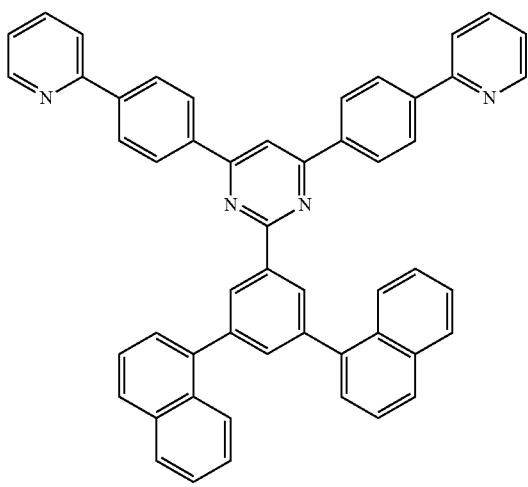

ET34 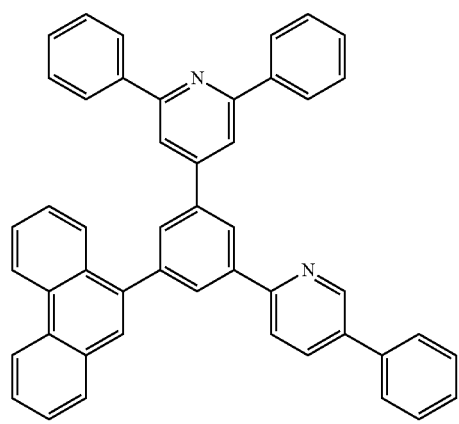

ET35 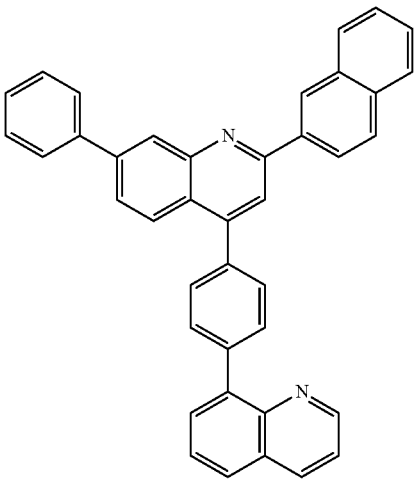

ET36 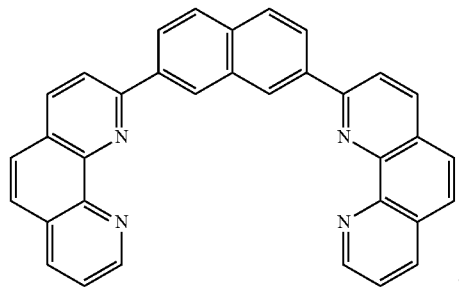

In some embodiments, the electron transport regions ETR may include a metal halide (such as LiF, NaCl, CsF, RbCl, RbI, CuI, and/or KI), a lanthanide metal (such as Yb), and a co-deposited material of the metal halide and the lanthanide metal. For example, the electron transport region ETR may include KI:Yb, RbI:Yb, etc. as a co-deposited material.

In some embodiments, the electron transport region ETR may be formed utilizing a metal oxide (such as $Li_2O$ or BaO, or 8-hydroxyl-lithium quinolate (LiQ), etc.), but embodiments of the present disclosure are not limited thereto. The electron transport region ETR may also be formed of a mixture of an electron transport material and an insulating organometallic salt. The organometallic salt may be a material having an energy band gap of about 4 eV or more. The organometallic salt may include, for example, metal acetates, metal benzoates, metal acetoacetates, metal acetylacetonates, and/or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the above-described materials, but embodiments of the present disclosure are not limited thereto.

The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. When the thickness of the electron transport layer ETL satisfies the aforementioned range, satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (e.g., AgMg, AgYb, or MgYb). In some embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may further be disposed on the second electrode EL2 of the light emitting device ED. The capping layer CPL may include a multilayer or a single layer.

In an embodiment, the capping layer CPL may be an organic layer or an inorganic layer. For example, when the capping layer CPL includes an inorganic material, the inorganic material may include an alkaline metal compound (such as LiF), and/or an alkaline earth metal compound (such as $MgF_2$, SiON, $SiN_x$, $SiO_y$, etc.)

For example, when the capping layer CPL includes an organic material, the organic material may include α-NPD, NPB, TPD, m-MTDATA, $Alq_3$, CuPc, N4,N4,N4',N4'-tetra(biphenyl-4-yl)biphenyl-4,4'-diamine (TPD15), 4,4',4''-tris(carbazol-9-yl)triphenylamine (TCTA), etc., an epoxy resin, or an acrylate (such as methacrylate) resin. However, embodiments of the present disclosure are not limited thereto, and the capping layer CPL may include at least one among Compounds P1 to P5:

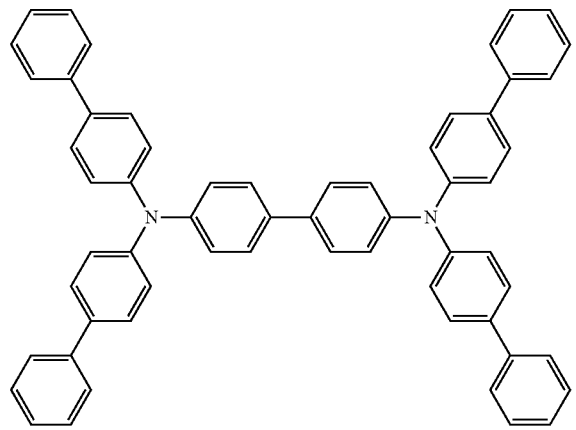

P1

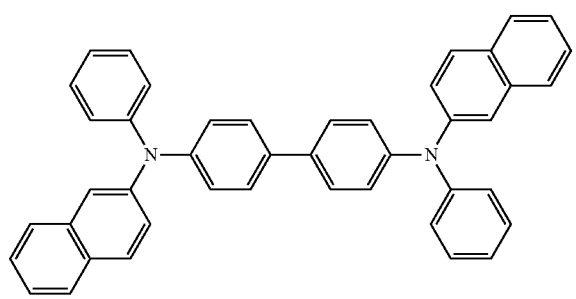

P2

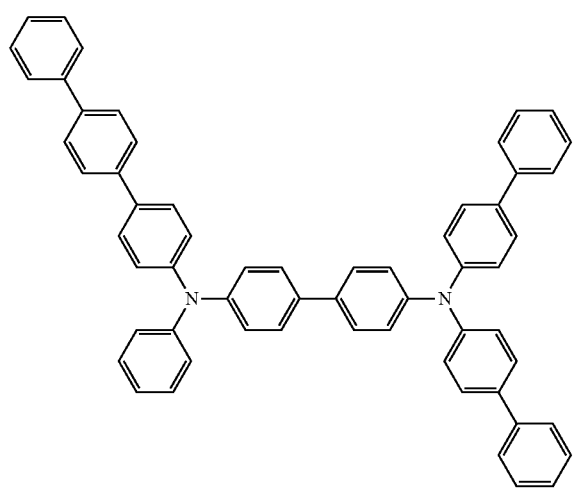

P3

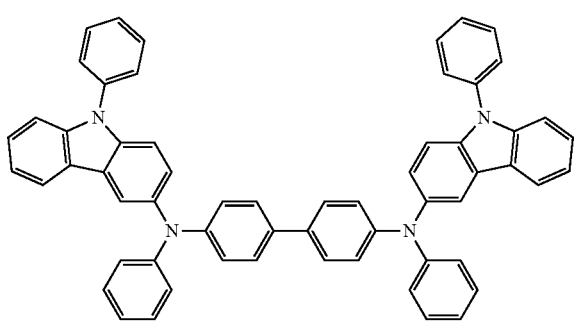

P4

-continued

P5

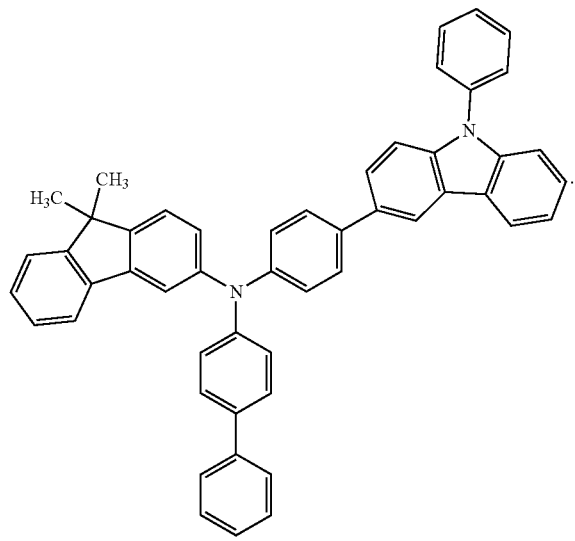

In some embodiments, the refractive index of the capping layer CPL may be about 1.6 or more. For example, the refractive index of the capping layer CPL may be about 1.6 or more with respect to light in a wavelength range of about 550 nm to about 660 nm.

Figure 7:
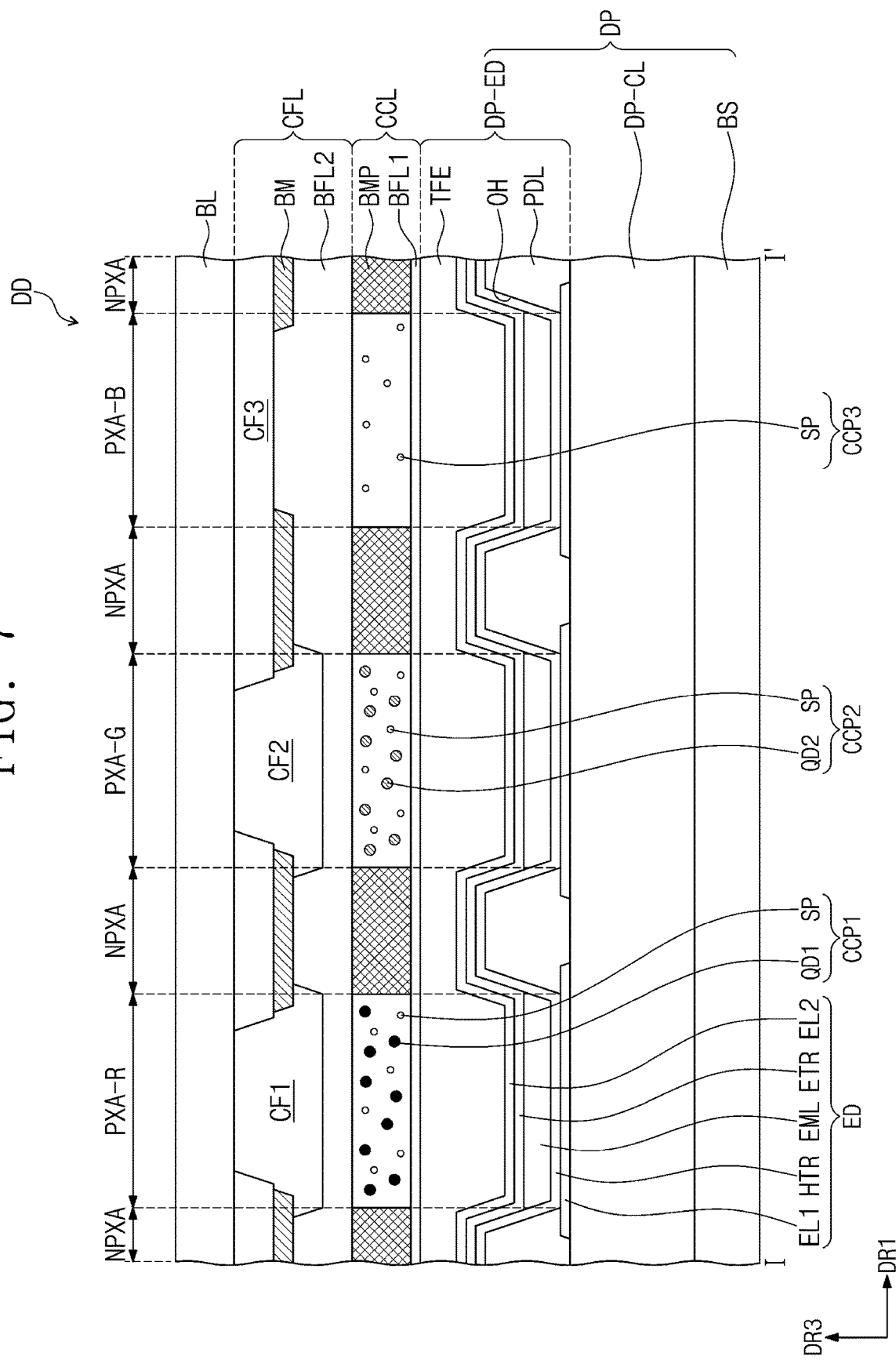
FIG. 7 is a cross-sectional view of a display apparatus according to an embodiment of the present disclosure.
Figure 8:
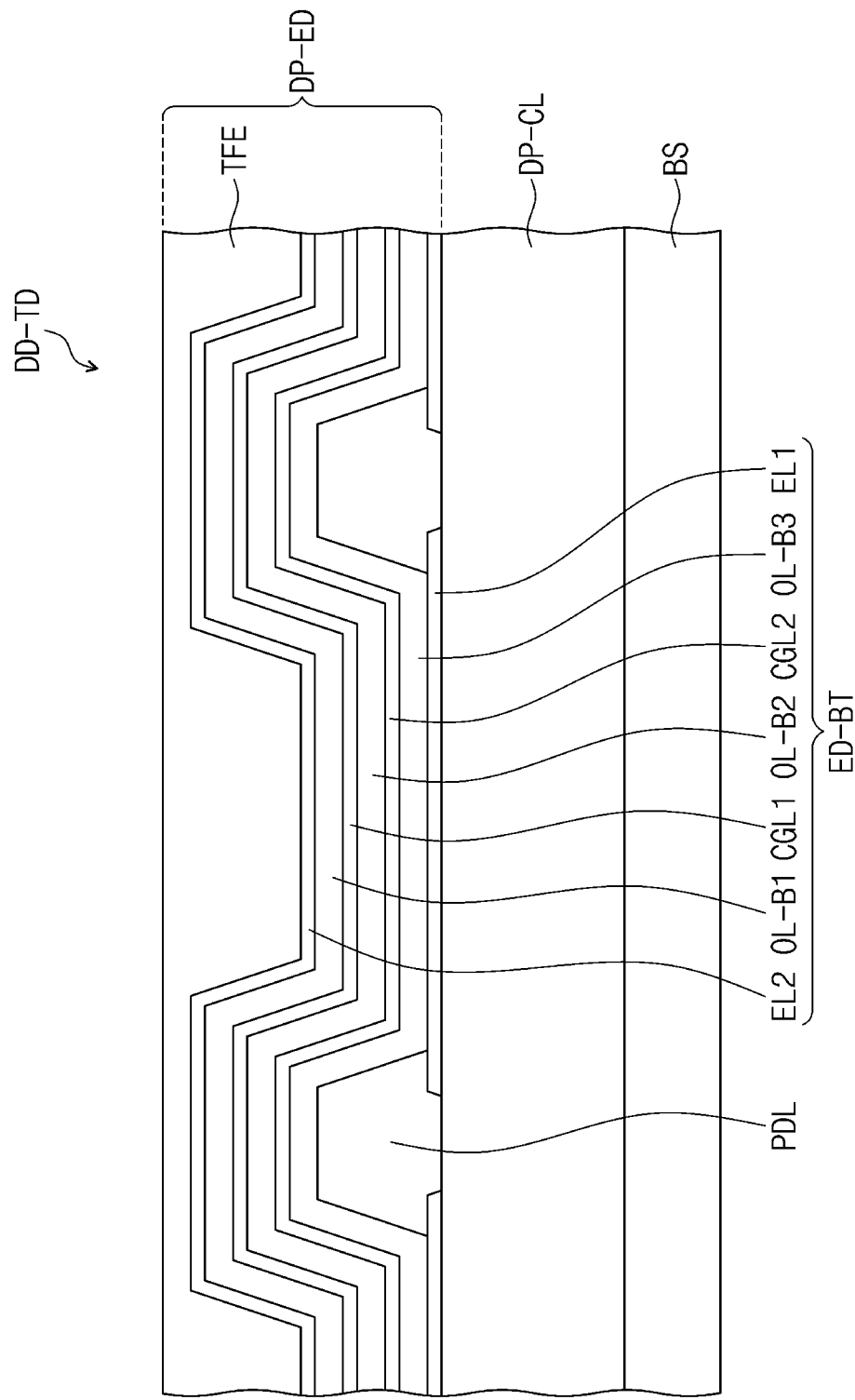
FIG. 8 is a cross-sectional view of a display apparatus according to an embodiment of the present disclosure.

FIGS. 7 and 8 are each a cross-sectional view of a display apparatus according to an embodiment. Hereinafter, in describing the display apparatus of an embodiment with reference to FIGS. 7 and 8, the features which have been described in FIGS. 1 to 6 are not described again, and the differences will be mainly described.

Referring to FIG. 7, the display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In some embodiments, the structures of the light emitting devices of FIGS. 4 to 6 as described above may be equally applied to the structure of the light emitting device ED shown in FIG. 7.

Referring to FIG. 7, the emission layer EML may be disposed in an opening OH defined in a pixel defining film PDL. For example, the emission layer EML, which is divided by the pixel defining film PDL and provided corresponding to each light emitting regions PXA-R, PXA-G, and PXA-B, may emit light in the same wavelength range. In the display apparatus DD of an embodiment, the emission layer EML may be to emit blue light. In some embodiments, the emission layer EML may be provided as a common layer in the entire light emitting regions PXA-R, PXA-G, and PXA-B.

The light control layer CCL may be disposed on the display panel DP. The light control layer CCL may include a light conversion body. The light conversion body may be a quantum dot, a phosphor, and/or the like. The light conversion body may be to emit provided light by converting the wavelength thereof. For example, the light control layer CCL may a layer containing the quantum dot or a layer containing the phosphor.

The light control layer CCL may include a plurality of light control units CCP1, CCP2 and CCP3. The light control units CCP1, CCP2, and CCP3 may be spaced apart from one another.

Referring to FIG. 7, divided patterns BMP may be disposed between the light control units CCP1, CCP2 and CCP3, which are spaced apart from each other, but embodiments of the present disclosure are not limited thereto. FIG. 7 illustrates that the divided patterns BMP do not overlap the light control units CCP1, CCP2 and CCP3, but at least a portion of the edges of the light control units CCP1, CCP2 and CCP3 may overlap the divided patterns BMP.

The light control layer CCL may include a first light control unit CCP1 containing (including) a first quantum dot QD1, which converts first color light provided from the light emitting device ED into second color light, a second light control unit CCP2 containing a second quantum dot QD2, which converts the first color light into third color light, and a third light control unit CCP3 which transmits the first color light.

In an embodiment, the first light control unit CCP1 may provide red light that is the second color light, and the second light control unit CCP2 may provide green light that is the third color light. The third light control unit CCP3 may provide blue light by transmitting the blue light that is the first color light provided in the light emitting device ED. For example, the first quantum dot QD1 may be a red quantum dot, and the second quantum dot QD2 may be a green quantum dot. The same as described above may be applied with respect to the quantum dots QD1 and QD2.

In some embodiments, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include any quantum dot but include the scatterer SP.

The scatterer SP may be or include inorganic particles. For example, the scatterer SP may include at least one of $TiO_2$, $ZnO$, $Al_2O_3$, $SiO_2$, or hollow silica. The scatterer SP may include any one of $TiO_2$, $ZnO$, $Al_2O_3$, $SiO_2$, or hollow silica, or may be a mixture of at least two materials selected from among $TiO_2$, $ZnO$, $Al_2O_3$, $SiO_2$, and hollow silica.

The first light control unit CCP1, the second light control unit CCP2, and the third light control unit CCP3 each may include base resins BR1, BR2, and BR3 in which the quantum dots QD1 and QD2 and the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1 and QD2 and the scatterer SP are dispersed, and may be formed of one or more suitable resin compositions, which may each be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be disposed on the light control units CCP1, CCP2, and CCP3 to block or reduce the light control units CCP1, CCP2 and CCP3 from being exposed to moisture/oxygen. In some embodiments, the barrier layer BFL1 may cover the light control units CCP1, CCP2, and CCP3. In some embodiments, the barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In some embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be disposed on the light control layer CCL. For example, the color filter layer CFL may be directly disposed on the light control layer CCL. In this case, the barrier layer BFL2 may not be provided.

The color filter layer CFL may include a light shielding unit BM and filters CF-B, CF-G, and CF-R. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and/or a pigment or dye. The first filter CF1 may include a red pigment or dye, the second filter CF2 may include a green pigment or dye, and the third filter CF3 may include a blue pigment or dye. However, embodiments of the present disclosure are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated but be provided as one filter.

The light shielding unit BM may be a black matrix. The light shielding unit BM may include an organic light shielding material or an inorganic light shielding material containing a black pigment or dye. The light shielding unit BM may prevent or reduce light leakage, and may separate boundaries between the adjacent filters CF1, CF2, and CF3. In some embodiments, in an embodiment, the light shielding unit BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may be a member which provides a base surface in which the color filter layer CFL, the light control layer CCL, and the like are disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In some embodiments, the base substrate BL may be omitted.

FIG. 8 is a cross-sectional view illustrating a part of a display apparatus according to an embodiment. FIG. 8 illustrates a cross-sectional view of a part corresponding to the display panel DP of FIG. 7. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 facing each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including a plurality of emission layers.

In an embodiment illustrated in FIG. 8, all light beams respectively emitted from the light emitting structures OL-B1, OL-B2, and OL-B3 may be blue light. However, embodiments of the present disclosure are not limited thereto, and the light beams respectively emitted from the light emitting structures OL-B1, OL-B2, and OL-B3 may have wavelength ranges different from each other. For example, the light emitting device ED-BT including the plurality of light emitting structures OL-B1, OL-B2, and OL-B3, which emit light beams having wavelength ranges different from each other, may be to emit white light.

A charge generation layer CGL may be disposed between the neighboring light emitting structures OL-B1, OL-B2, and OL-B3. The charge generation layer CGL may include a p-type charge generation layer and/or an n-type charge generation layer.

The combination of materials of the emission layer according to an embodiment as described above may be applied to at least one emission layer of the light emitting structures OL-B1, OL-B2, and/or OL-B3 included in the display apparatus DD-TD of an embodiment. For example, at least one of the light emitting structures OL-B1, OL-B2, and/or OL-B3 may include, in the emission layer, the first host as an electron transporting host, the second host as a hole transporting host, and the dopant as an organometallic complex represented by Formula 3 as described above.

The display apparatus DD-TD according to an embodiment of the present disclosure includes the combination of materials of the emission layer EML as described above, and thus may exhibit an improved service life characteristic.

Hereinafter, with reference to Examples and Comparative Examples, a light emitting device according to an embodiment of the present disclosure and a first host included in the light emitting device of an embodiment of the present disclosure will be described in more detail. The Examples shown are illustrated only for the understanding of the present disclosure, and the scope of the present disclosure is not limited thereto.

EXAMPLES

1. Synthesis of First Host

Synthesis of Compound ET01

Compound ET01 according to an embodiment may be synthesized by, for example, the tasks (steps) shown in the Reaction Scheme below:

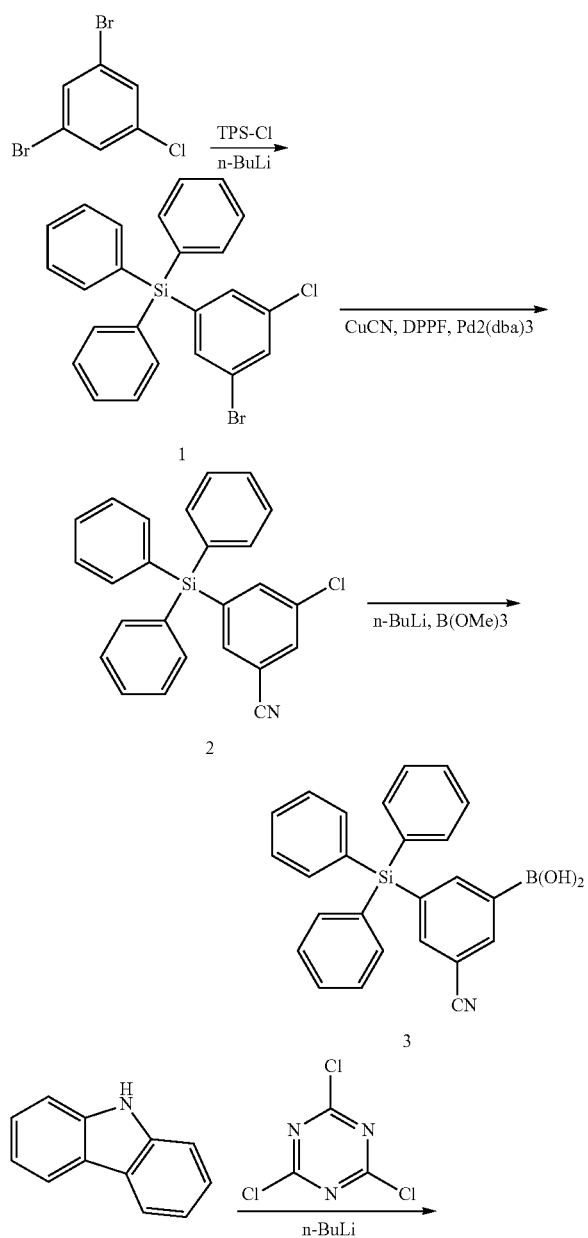

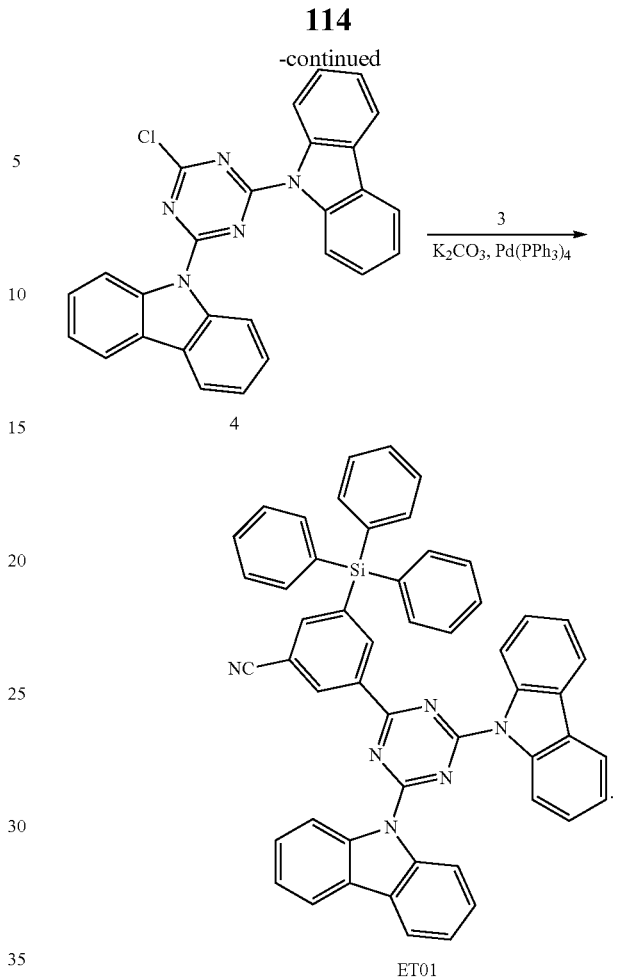

Synthesis of Intermediate Compound 1

In a round bottom flask (RBF), 1,3-dibromo-5-chlorobenzene (10 g) and tetrahydrofuran (THF) were added, nBuLi (2 M in hexane, 1.2 eq) was slowly added dropwise thereto at room temperature, and then the resulting mixture was stirred for about 30 minutes. In the RBF, triphenylsilyl chloride (1.5 eq) was added and THF was further added. Thereafter, the reaction solution was refluxed for about 2 hours and cooled to room temperature, and then water was added dropwise thereto to quench, and the resulting solution was stirred for about 30 minutes. The resulting solid was filtered and then washed with distilled water, methanol, and hexane to obtain Intermediate Compound 1 (yield: 84%). [$C_{24}H_{18}BrClSi$ [M]+: calculation: 448.00, measurement: 447]

Synthesis of Intermediate Compound 2

In an RBF, Intermediate Compound 1 (12 g), CuCN (1.2 eq), $Pd_2(dba)_3$ (0.02 eq), and DPPF (1.2 eq) were added and stirred in toluene (150 mL) at about 120° C. for about 12 hours. After the reaction was completed, the reactants were subjected to silica filtration with methylene chloride and then the solvent was removed. The resulting product was purified by column chromatography utilizing methylene chloride (MC):hexane (1:3) and then dried to obtain Intermediate Compound 2 (yield: 76%). [$C_{25}H_{18}ClNSi$ [M]+: calculation: 395.09, measurement: 394]

Synthesis of Intermediate Compound 3

In an RBF, Intermediate Compound 2 (8 g) and THF (100 mL) were added and nBuLi (2 M in hexane, 17 mL, 1.2 eq) was slowly added dropwise thereto. After about 40 minutes, trimethyl borate (1.5 eq) was slowly added dropwise thereto. The reaction solution was slowly heated to room temperature and stirred overnight, the reaction was then quenched with a solution of water and $NH_4Cl$, and the resulting product was washed with ethyl acetate (EA)/$H_2O$ and dried over $MgSO_4$. Thereafter, the resulting product was purified by column chromatography utilizing MC:EA to obtain Intermediate Compound 3 (yield: 88%). [$C_{25}H_{20}BNO_2Si$ [M]+: calculation: 405.14, measurement: 404]

Synthesis of Intermediate Compound 4

In an RBF, 9H-carbazole (2 eq) and THF were added, nBuLi (2 M in hexane, 1.2 eq) was slowly added dropwise thereto at room temperature, and then the resulting mixture was stirred for about 30 minutes. In the RBF, 2,4,6-trichlorotriazine (1 eq) was added thereto, and THF was added, and then a prepared Li-carbazole solution was slowly added dropwise thereto with a dropping funnel over about 30 minutes. The reaction solution was refluxed for about 2 hours and then cooled to room temperature and water was added dropwise thereto to quench, and the resulting solution was stirred for about 30 minutes. The resulting solid was filtered and then washed with distilled water, methanol, and hexane to obtain Intermediate Compound 4 (yield: 82%). [$C_{27}H_{16}ClN_5$ [M]+: calculation: 445.91, measurement: 444]

Synthesis of Compound ET01

In an RBF, Intermediate Compound 3 (1 eq), Intermediate Compound 4 (1.1 eq), Pd(PPh$_3$)$_4$ (0.05 eq), K$_2$CO$_3$ (2.5 eq), THF (400 mL), and H$_2$O (100 mL) were added and stirred under reflux at about 100° C. overnight. After the reaction was completed, EA/H$_2$O were added thereto, the mixture was stirred for about 30 minutes, and the organic layers were separated with a separatory funnel. The organic layers were dried over MgSO$_4$, and filtered with MC silica, and then the resulting solid was filtered by utilizing MeOH and dried. The dried solid was heated and dissolved in toluene (100 mL) and solidified by adding dropwise a solution (100 mL) of ether:hexane (1:1). The solid was dissolved again in MC (400 mL), hexane (400 mL) was added thereto, and the resulting mixture was slowly recrystallized to synthesize Compound ET01 (yield: 84.1%). [$C_{52}H_{34}N_6Si$ [M]+: calculation: 770.26, measurement: 769]

Synthesis of Compound ET02

Compound ET02 according to an embodiment may be synthesized by, for example, the tasks (steps) shown in the Reaction Scheme below:

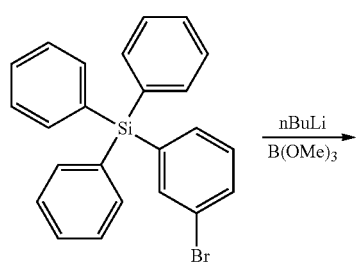

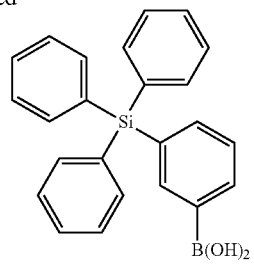

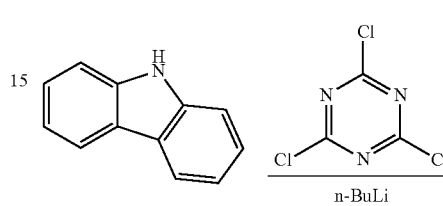

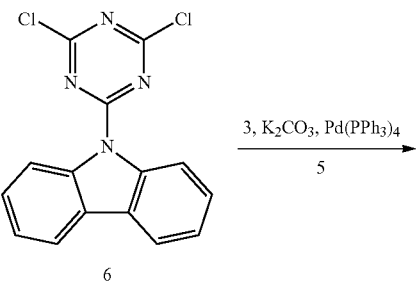

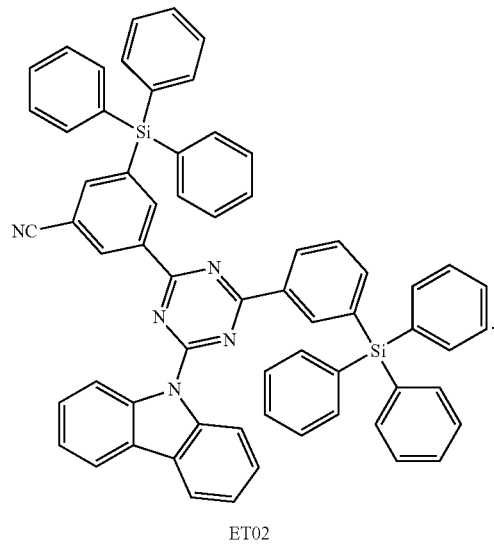

ET02

Synthesis of Intermediate Compound 5

In an RBF, 3-(bromophenyl)triphenylsilane (1 eq) was added and THF (150 mL) was further added. nBuLi (2 M in hexane, 17 mL, 1.2 eq) was slowly added dropwise thereto at about −78° C., and after about 40 minutes, trimethyl borate (5.75 mL, 1.5 eq) was slowly added dropwise thereto. Thereafter, the reaction solution was slowly heated to room temperature and stirred overnight, the reaction was then quenched with a solution of water and NH$_4$Cl, and the resulting product was washed with EA/H$_2$O. Thereafter, the resulting product was dried over MgSO$_4$ and purified by column chromatography utilizing MC:EA to obtain Intermediate Compound 5 (yield: 77%). [C$_{24}$H$_{21}$BO$_2$Si [M]+: calculation: 380.33, measurement: 379]

Synthesis of Intermediate Compound 6

Intermediate Compound 6 (yield: 85%) was obtained in substantially the same manner as in the synthetic method of Intermediate Compound 4, but utilizing only 1 eq of 9H-carbazole. [C$_{15}$H$_8$Cl$_2$N$_4$[M]+: calculation: 314.01, measurement: 313]

Synthesis of Compound ET02

In an RBF, Intermediate Compound 6 (1 eq), Pd(PPh$_3$)$_4$ (0.05 eq), K$_2$CO$_3$ (2.1 eq), THF (400 mL), and H$_2$O (100 mL) were added and stirred. The resulting mixture was cooled to about 0° C., and then a 1 M solution, in which Intermediate Compound 3 was dissolved in THF, was added dropwise thereto. Thereafter, the mixture was slowly heated to room temperature, and then stirred for about 6 hours. Then, Intermediate Compound 5 (1.1 eq) was added thereto and stirred under reflux at about 100° C. overnight. After the reaction was completed, EA/H$_2$O were added thereto, the mixture was stirred for about 30 minutes, and the organic layers were separated with a separatory funnel. The organic layers were dried over MgSO$_4$, and filtered with MC silica, and then the resulting solid was filtered by utilizing MeOH and dried. The dried solid was heated and dissolved in toluene (100 mL) and solidified by adding dropwise a solution (100 mL) of MC:hexane (1:1). The solid was dissolved again in MC and purified by column chromatography utilizing MC:EA to synthesize Compound ET02 (yield: 51%). [C$_{64}$H$_{45}$N$_5$Si$_2$ [M]+: calculation: 939.32, measurement: 938]

Synthesis of Compound ET03

Compound ET03 according to an embodiment may be synthesized by, for example, the tasks (steps) shown in the Reaction Scheme below:

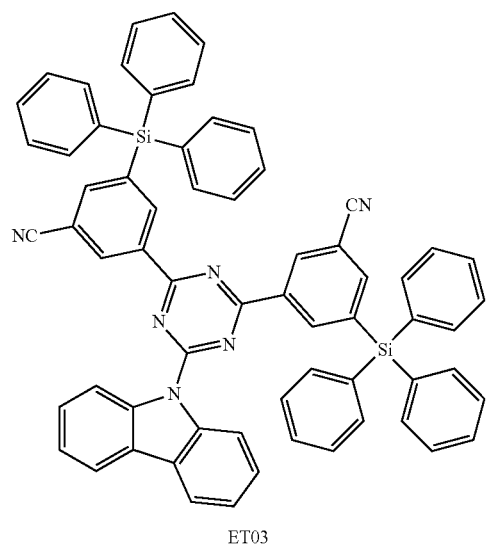

ET03

In an RBF, Intermediate Compound 6 (1 eq), Intermediate Compound 3 (2.2 eq), Pd(PPh$_3$)$_4$ (0.05 eq), K$_2$CO$_3$ (2.5 eq), THF (400 mL), and H$_2$O (100 mL) were added and stirred under reflux at about 100° C. overnight. After the reaction was completed, EA/H$_2$O were added thereto, the mixture was stirred for about 30 minutes, and then only organic layers were separated with a separatory funnel. Thereafter, the organic layers were dried over MgSO$_4$, and filtered with MC silica, and then the resulting solid was filtered by utilizing MeOH and dried. The dried solid was heated and dissolved in toluene (100 mL) and solidified by adding dropwise a solution (100 mL) of ether:hexane (1:1). The solid was dissolved again in MC (400 mL), hexane (400 mL) was added thereto, and the resulting mixture was slowly recrystallized to synthesize Compound ET03 (yield: 84.1%). [C$_{65}$H$_{44}$N$_6$Si$_2$ [M]+: calculation: 964.32, measurement: 963]

Synthesis of Compound ET05

Compound ET05 according to an embodiment may be synthesized by, for example, the tasks (steps) shown in the Reaction Scheme below:

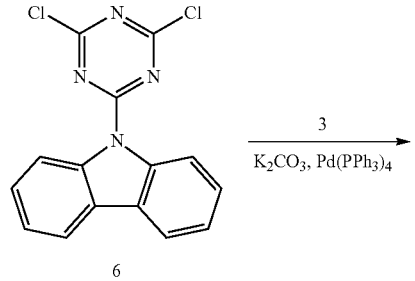

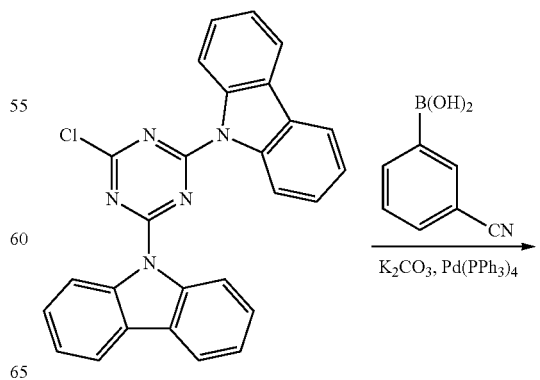

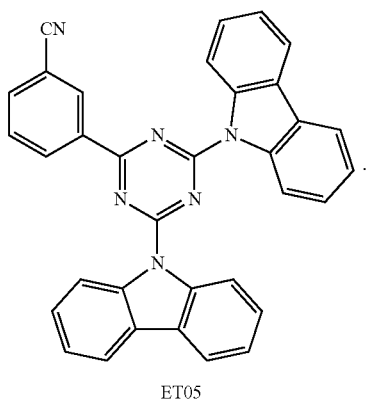

ET05

In an RBF, 9,9'-(6-chloro-1,3,5-triazine-2,4-diyl)bis(9H-carbazole) (1 eq), (3-cyanophenyl)boronic acid (1.2 eq), Pd(PPh$_3$)$_4$ (0.05 eq), K$_2$CO$_3$ (1.5 eq), THF (200 mL), and H$_2$O (50 mL) were added and stirred under reflux at about 100° C. overnight. After the reaction was completed, EA/H$_2$O were added thereto, the mixture was stirred for about 30 minutes, and then only organic layers were separated with a separatory funnel. Thereafter, the organic layers were dried over MgSO$_4$, and filtered with MC silica, and then the resulting solid was filtered by utilizing MeOH and dried. The dried solid was heated and dissolved in toluene (100 mL) and solidified by adding dropwise a solution (100 mL) of MC:hexane (1:1). The solid was dissolved again in MC (200 mL), hexane (400 mL) was added thereto, and the resulting mixture was slowly recrystallized to synthesize Compound ET05 (yield: 89%). [C$_{34}$H$_{20}$N$_6$[M]+: calculation: 512.17, measurement: 511]

Synthesis of Compound ET09

Compound ET09 according to an embodiment may be synthesized by, for example, the tasks (steps) shown in the Reaction Scheme below:

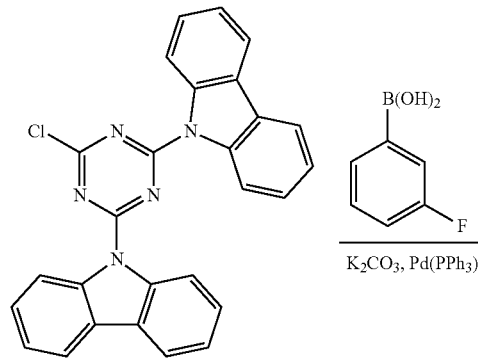

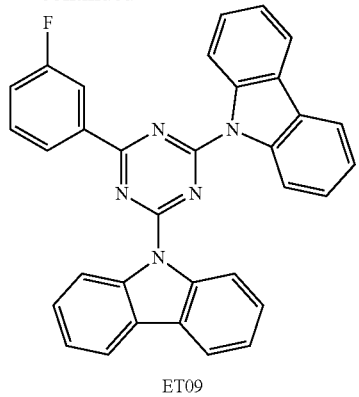

ET09

Compound ET09 (yield: 81%) was synthesized in substantially the same manner as in the synthetic method of Compound ET05, but utilizing (3-fluorophenyl)boronic acid instead of (3-cyanophenyl)boronic acid. [C$_{33}$H$_{20}$FN$_5$ [M]+: calculation: 505.17, measurement: 504]

2. Manufacture and Evaluation of Light Emitting Device

Manufacture of Light Emitting Device

An ITO glass substrate was cut to a size of 50 mm×50 mm×0.5 mm and cleansed by ultrasonic waves utilizing isopropyl alcohol and pure water for about 10 minutes. Thereafter, the ITO glass substrate was irradiated with ultraviolet rays for about 10 minutes, exposed to ozone, and further cleansed. The ITO glass substrate was then installed on a vacuum deposition apparatus. m-MTDATA was deposited in vacuum on the upper portion of the ITO glass substrate to form a 40 Å-thick hole injection layer. Then, NPB was deposited in vacuum to form a 10 Å-thick hole transport layer. A first host, a second host, and a dopant were deposited at the same time on the upper portion of the hole transport layer to form a 400 Å-thick emission layer. Then, ETL1 was deposited on the upper portion of the emission layer to form a 300 Å-thick electron transport layer, and Mg was deposited in vacuum to form an 800 Å-thick second electrode. The materials utilized in the manufacture of the light emitting devices are shown below. The light emitting devices of additional Examples and Comparative Examples were manufactured by utilizing different materials for the first host.

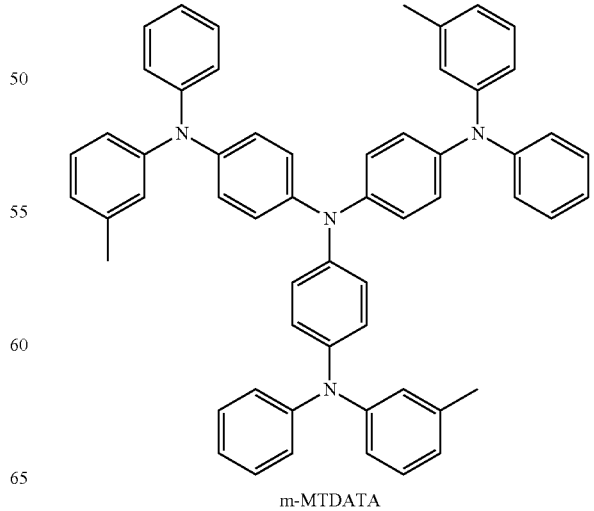

m-MTDATA

-continued

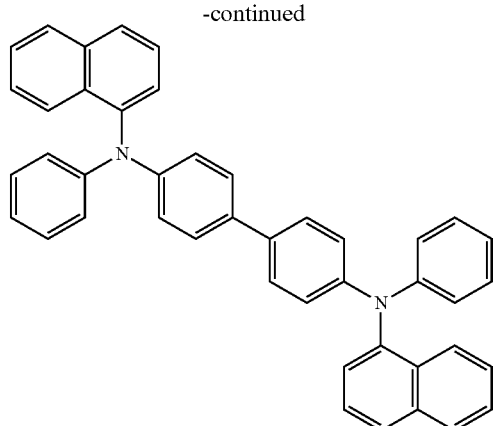

NPB

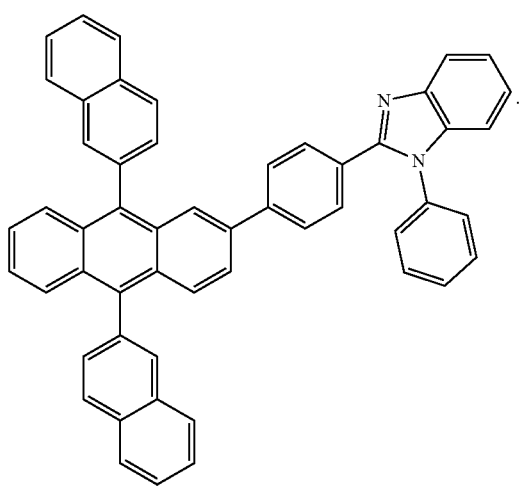

ETL1

Comparative Example Compounds

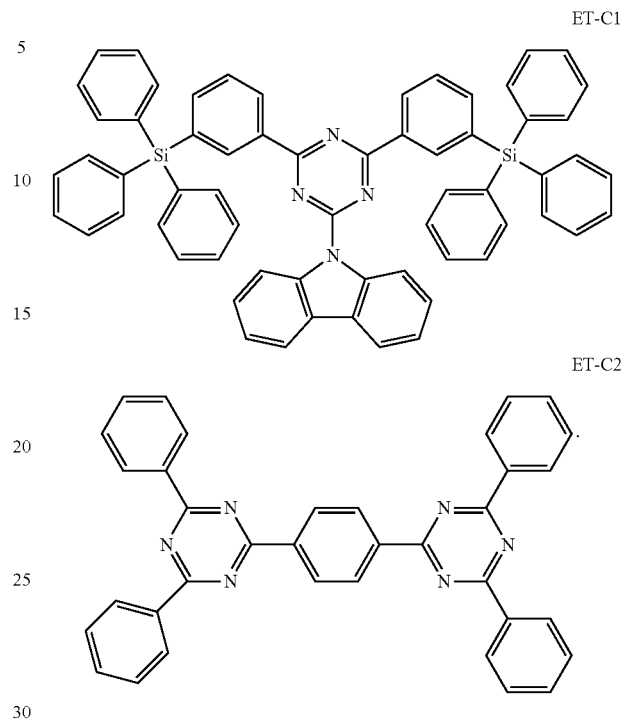

Evaluation of Light Emitting Device Characteristics

Device service lives (T95) of the manufactured light emitting devices were evaluated. The evaluated service life characteristics show a device service life (life span, T95), which is a time taken to reduce the brightness to 95% level with respect to a brightness of 1,000 cd/m². The device service life (T95) was measured by continuous driving at a current density of 10 mA/cm², and a unit is an hour.

Table 1 shows the material combination in each emission layer of the Examples and Comparative Examples, and each resulting device service life. In each of Comparative Example 1-1, Comparative Example 2-1, and Comparative Example 3-1, Comparative Example Compound ET-C1 was utilized as a first host material, and in each of Comparative Example 1-2, Comparative Example 2-2, and Comparative Example 3-2, Comparative Example Compound ET-C2 was utilized as a first host material. The constitution of the rest of each device (e.g., the second host and the dopant) was substantially the same as in the associated Examples.

TABLE 1

| Division | Second host | First host | Ratio of First host: Second host | Dopant | Device service life (T95) |
|---|---|---|---|---|---|
| Comparative Example 1-1 | HT-01 | ET-C1 | 7:3 | BD-01 | 31 |
| Comparative Example 1-2 | HT-01 | ET-C2 | 7:3 | BD-01 | 16 |
| Example 1-1 | HT-01 | ET-01 | 7:3 | BD-01 | 54 |
| Example 1-2 | HT-01 | ET-02 | 7:3 | BD-01 | 60 |
| Example 1-3 | HT-01 | ET-03 | 7:3 | BD-01 | 50 |
| Example 1-4 | HT-01 | ET-05 | 7:3 | BD-01 | 48 |
| Example 1-5 | HT-01 | ET-09 | 7:3 | BD-01 | 40 |
| Comparative Example 2-1 | HT-03 | ET-C1 | 7:3 | BD-02 | 17 |
| Comparative Example 2-2 | HT-03 | ET-C2 | 7:3 | BD-02 | 10 |
| Example 2-1 | HT-03 | ET-01 | 7:3 | BD-02 | 42 |
| Example 2-2 | HT-03 | ET-02 | 7:3 | BD-02 | 30 |
| Example 2-3 | HT-03 | ET-03 | 7:3 | BD-02 | 36 |
| Example 2-4 | HT-03 | ET-05 | 7:3 | BD-02 | 22 |
| Example 2-5 | HT-03 | ET-09 | 7:3 | BD-02 | 39 |
| Comparative Example 3-1 | HT-04 | ET-C1 | 7:3 | BD-01 | 55 |
| Comparative Example 3-2 | HT-04 | ET-C2 | 7:3 | BD-01 | 34 |
| Example 3-1 | HT-04 | ET-01 | 7:3 | BD-01 | 102 |
| Example 3-2 | HT-04 | ET-02 | 7:3 | BD-01 | 79 |
| Example 3-3 | HT-04 | ET-03 | 7:3 | BD-01 | 80 |
| Example 3-4 | HT-04 | ET-05 | 7:3 | BD-01 | 78 |
| Example 3-5 | HT-04 | ET-09 | 7:3 | BD-01 | 72 |

Referring to the results of Table 1, it may be confirmed that Examples including the first host of the triazine derivative in the emission layer, which includes at least one electron-accepting substituent, have improved device service lives compared to the Comparative Examples. In addition, it may be confirmed that the Examples include the combination of the first host, the second host, and the dopant of an organometallic complex, and thus exhibit service life characteristics superior to the Comparative Examples.

It is believed that this effect of improving service life is achieved because the first host, which may be an electron transporting host of the two co-deposited host materials, includes an electron-accepting substituent on the triazine skeleton, and thus a bond dissociation energy between the triazine core and the substituent increases compared to the first host materials (ET-C1 and ET-C2) of the Comparative Examples. For example, the first host material includes an electron-accepting substituent to increase a binding force between the triazine core and the substituent, thereby increasing non-polar covalent bond characteristics of the binding (e.g., linkage), and thus the bond dissociation energy between the core and the substituent may be increased to about 3.0 eV to about 3.3 eV. Thus, it is believed that the material stability of the first host is improved and thus the device service life of the light emitting device of Example including the first host increases.

The light emitting device according to embodiments of the present disclosure includes the emission layer having the combination of the first host, the second host, and the dopant, thereby exhibiting an improved service life characteristic.

The light emitting device of an embodiment includes a hole transporting host, an electron transporting host, and a dopant material in an emission layer, thereby exhibiting a long service life characteristic.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to embodiments of the present disclosure, it will be understood that the present disclosure should not be limited to these embodiments but various suitable changes and modifications can be made by those skilled in the art without departing from the spirit and scope of the present disclosure. Accordingly, the technical scope of the present disclosure is not intended to be limited to the contents set forth in the detailed description of the specification, but is intended to be defined by the appended claims and their equivalents.

What is claimed is:

1. A light emitting device comprising:
   a first electrode;
   a second electrode on the first electrode; and
   an emission layer between the first electrode and the second electrode, the emission layer comprising a first host represented by Formula 1, a second host different from the first host, and a dopant comprising an organometallic complex:

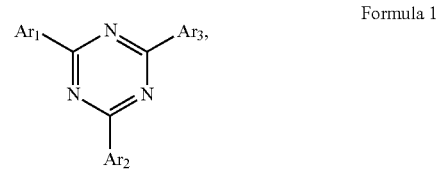

Formula 1 wherein, in Formula 1,
$Ar_1$ to $Ar_3$ are each independently a substituted or unsubstituted aryl group having 6 to 30 ring-forming carbon atoms, or a substituted or unsubstituted heteroaryl group having 2 to 30 ring-forming carbon atoms, and
at least one among $Ar_1$ to $Ar_3$ is an aryl group having 6 to 30 ring-forming carbon atoms and comprising a halogen atom or a cyano group as a substituent, or is a hexagonal heterocycle comprising a nitrogen atom as a ring-forming atom, and
wherein the dopant is represented by Formula 3:

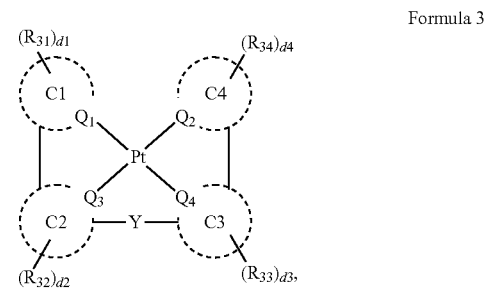

Formula 3 and
wherein, in Formula 3,
$Q_1$ to $Q_4$ are each independently C or N,
rings C1 to C4 are each independently a substituted or unsubstituted hydrocarbon ring having 5 to 30 ring-forming carbon atoms, or a substituted or unsubstituted heterocycle having 2 to 30 ring-forming carbon atoms,
Y is O or S,
d1 to d4 are each independently an integer of 0 to 4, and
$R_{31}$ to $R_{34}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or are bonded to an adjacent group to form a ring.

2. The light emitting device of claim 1, wherein at least one among $Ar_1$ to $Ar_3$ is represented by any one among EW-1 to EW-5:

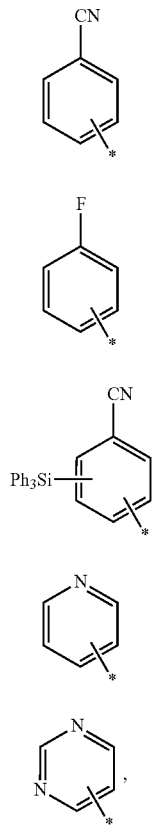

and wherein * indicates a point of connection.

3. The light emitting device of claim 1, wherein the second host is represented by Formula 2:

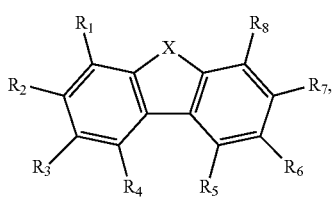

wherein, in Formula 2,

X is $NR_a$, O, or $CR_bR_c$, $R_1$ to $R_8$, $R_a$, $R_b$, and $R_c$ are each independently a hydrogen atom, a deuterium atom, a substituted or unsubstituted silyl group, a substituted or unsubstituted alkyl group having 1 to 20 carbon atoms, a substituted or unsubstituted aryl group having 6 to 60 ring-forming carbon atoms, or a substituted or unsubstituted heterocycle having 2 to 60 ring-forming carbon atoms, and at least one of $R_a$, $R_b$, or $R_c$ is represented by Formula A:

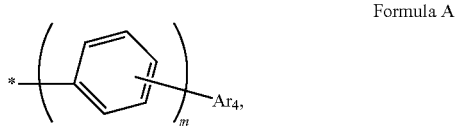

and wherein, in Formula A, m is an integer of 0 to 2, $Ar_4$ is a substituted or unsubstituted silyl group, a substituted or unsubstituted aryl group having 6 to 60 ring-forming carbon atoms, or a substituted or unsubstituted heterocycle having 2 to 60 ring-forming carbon atoms, and

* indicates a point of connection.

4. The light emitting device of claim 1, wherein Formula 3 is represented by Formula 3-1:

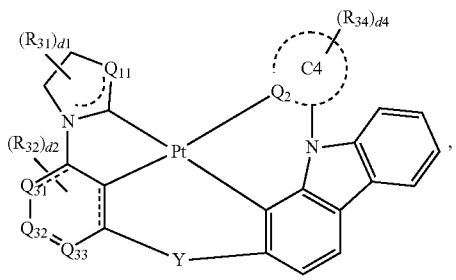

and wherein, in Formula 3-1, $Q_{11}$, $Q_{31}$, $Q_{32}$, and $Q_{33}$ are each independently N, $NR_{11}$, $CR_{12}$, $CR_{12}R_{13}$, $BR_{14}$, or $BR_{14}R_{15}$, $R_{11}$ to $R_{15}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or are bonded to an adjacent group to form a ring, and Y, ring C4, $R_{31}$, $R_{32}$, $R_{33}$, d1, d2 and d4 are each independently the same as defined in Formula 3.

5. The light emitting device of claim 1, wherein a weight ratio of the first host and the second host is about 3:7 to about 7:3.

6. The light emitting device of claim 1, wherein the first host comprises at least one among compounds represented by Compound Group 1:

Compound Group 1
ET01
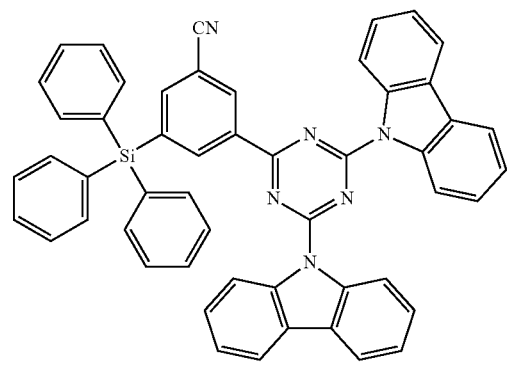
ET02
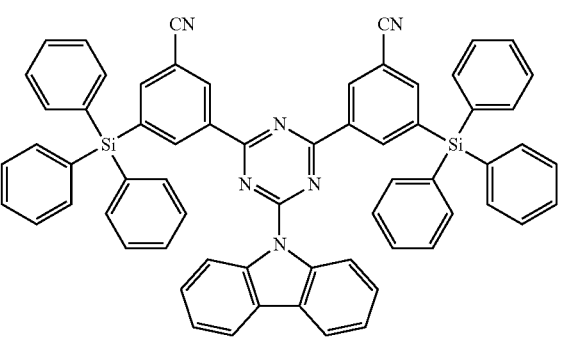
ET03
ET04
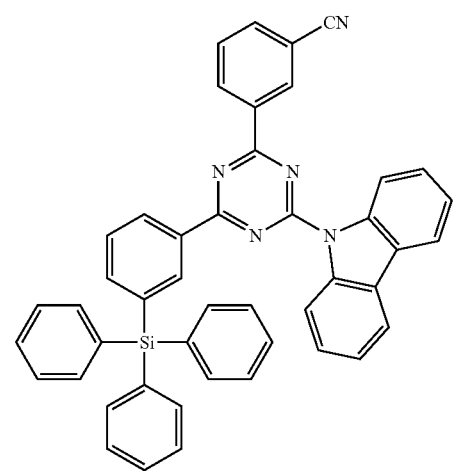
ET05
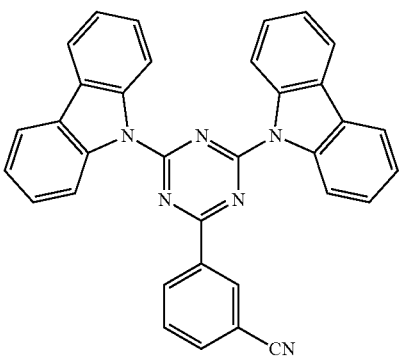
ET06
ET07
ET08

ET09
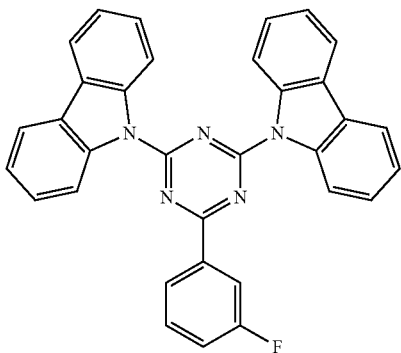
ET10
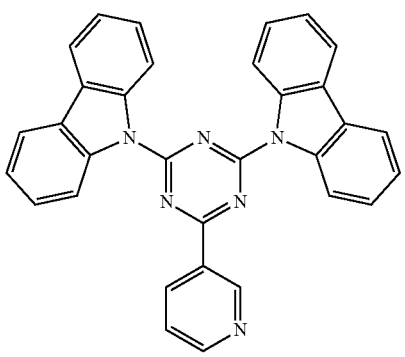
ET11
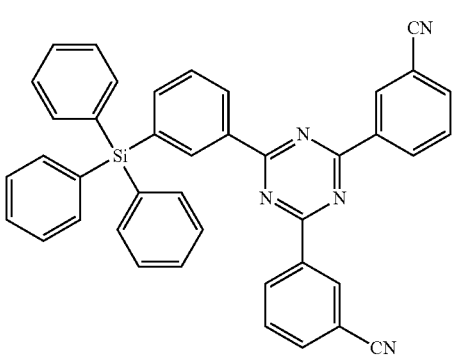
ET12
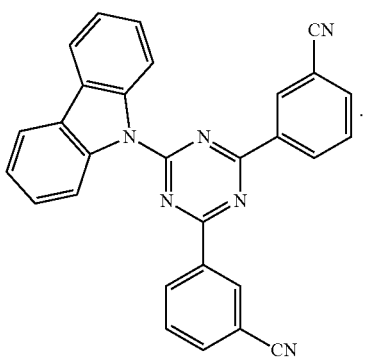
7. The light emitting device of claim 1, wherein the second host comprises at least one among compounds represented by Compound Group 2:
Compound Group 2
HT-01
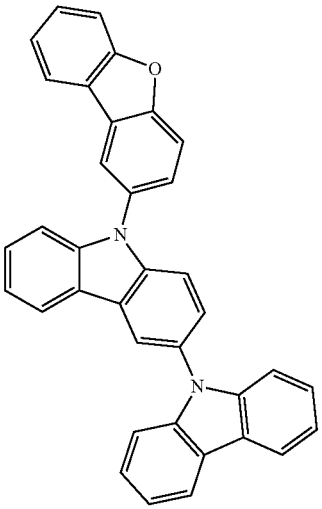
HT-02
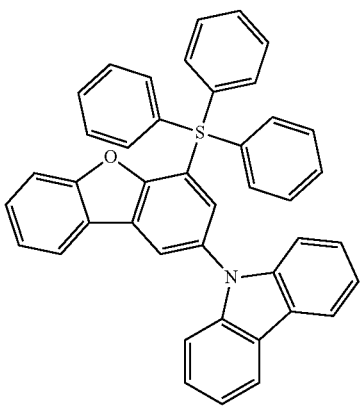
HT-03
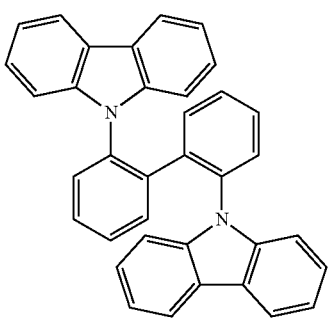

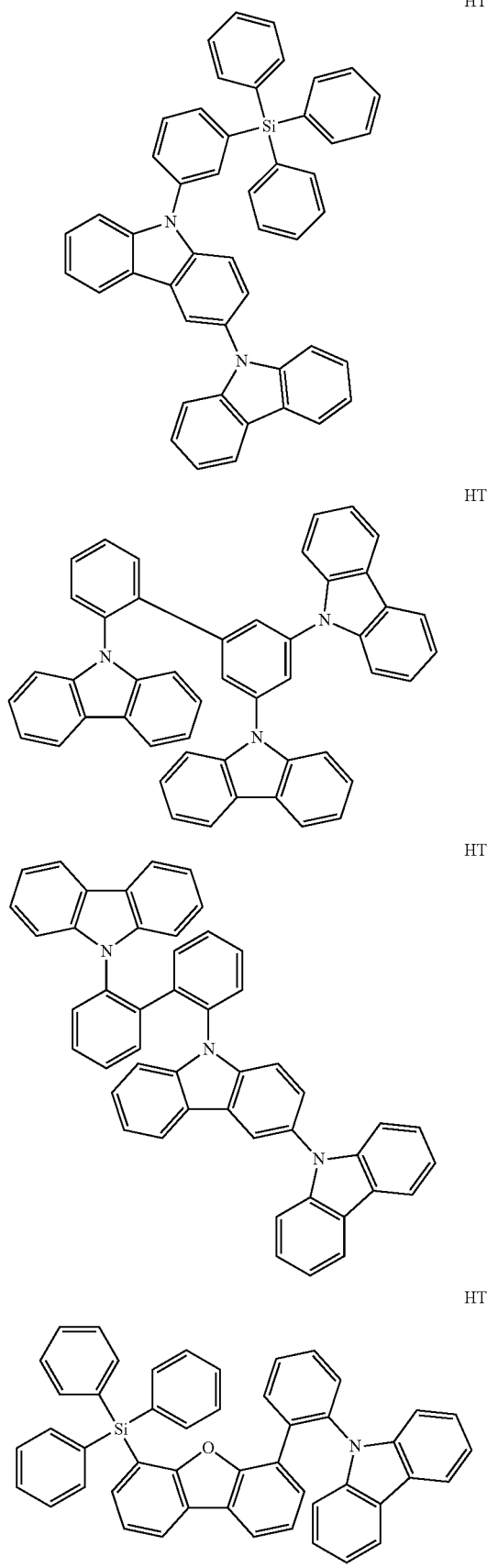
8. The light emitting device of claim 1, wherein the dopant comprises at least one among compounds represented by Compound Group 3:
Compound Group 3
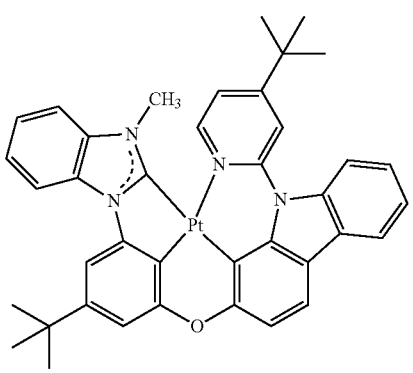

BD02

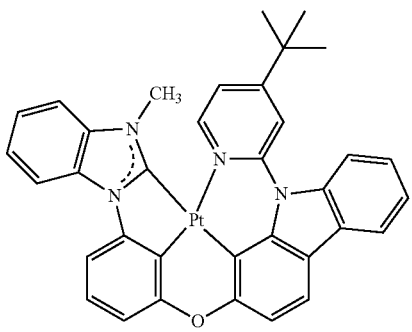

BD03

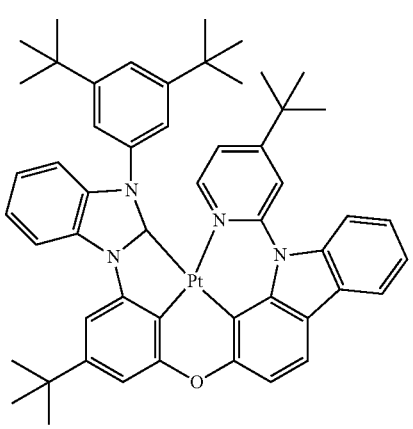

BD04

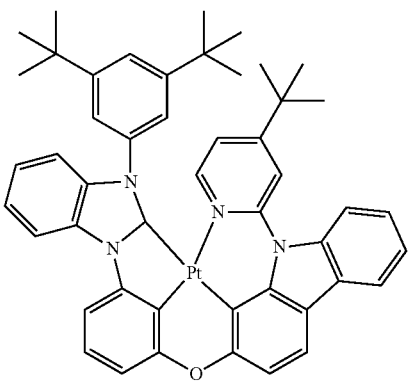

9. The light emitting device of claim 1, wherein the emission layer is to emit blue phosphorescence.

10. A light emitting device comprising:
a first electrode;
a second electrode on the first electrode;
an emission layer between the first electrode and the second electrode, the emission layer comprising a first host represented by Formula 1, a second host different from the first host, and a dopant comprising an organometallic complex; and
a capping layer on the second electrode, the capping layer having a refractive index of about 1.6 or more;

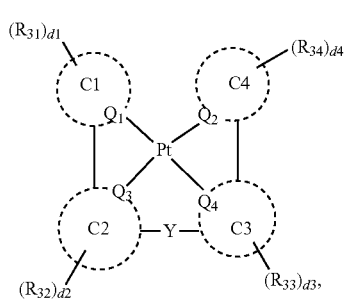

Formula 1 wherein, in Formula 1
$Ar_1$ to $Ar_3$ are each independently a substituted or unsubstituted aryl group having 6 to 30 ring-forming carbon atoms, or a substituted or unsubstituted heteroaryl group having 2 to 30 ring-forming carbon atoms, and
at least one among $Ar_1$ to $Ar_3$ is an aryl group having 6 to 30 ring-forming carbon atoms and comprising a halogen atom or a cyano group as a substituent, or is a hexagonal heterocycle comprising a nitrogen atom as a ring-forming atom.

11. A light emitting device comprising:
a first electrode;
a second electrode on the first electrode; and
an emission layer between the first electrode and the second electrode, the emission layer comprising a first host and a second host, which are different from each other, and a dopant comprising an organometallic complex,
wherein the first host comprises a triazine core and at least one electron-accepting substituent on the triazine core, and
the electron-accepting substituent is an aryl group substituted with a cyano group or a halogen atom, or is a hexagonal heterocycle comprising a nitrogen atom as a ring-forming atom, and
wherein the dopant is represented by Formula 3:

Formula 3 and
wherein, in Formula 3,
$Q_1$ to $Q_4$ are each independently C or N,
rings C1 to C4 are each independently a substituted or unsubstituted hydrocarbon ring having 5 to 30 ring-forming carbon atoms, or a substituted or unsubstituted heterocycle having 2 to 30 ring-forming carbon atoms,
Y is O or S,
d1 to d4 are each independently an integer of 0 to 4, and
$R_{31}$ to $R_{34}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or are bonded to an adjacent group to form a ring.

12. The light emitting device of claim 11, wherein the electron-accepting substituent is represented by any one among EW-1 to EW-5:

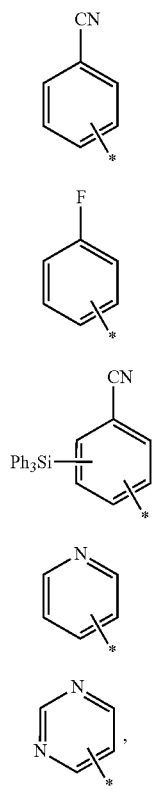

and
wherein * indicates a point of connection.

13. The light emitting device of claim 11, wherein the first host is represented by Formula 1:

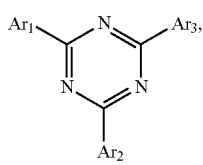

and
wherein, in Formula 1,
Ar$_1$ to Ar$_3$ are each independently a substituted or unsubstituted aryl group having 6 to 30 ring-forming carbon atoms, or a substituted or unsubstituted heteroaryl group having 2 to 30 ring-forming carbon atoms, and
at least one among Ar$_1$ to Ar$_3$ is an aryl group having 6 to 30 ring-forming carbon atoms and comprising a halogen atom or a cyano group as a substituent, or is a hexagonal heterocycle comprising a nitrogen atom as a ring-forming atom.

14. The light emitting device of claim 11, wherein the second host is represented by Formula 2:

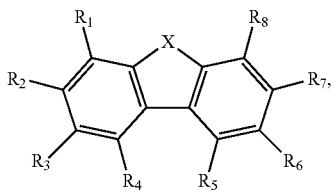

wherein, in Formula 2,
X is NR$_a$, O, or CR$_b$R$_c$,
R$_1$ to R$_8$, R$_a$, R$_b$, and R$_c$ are each independently a hydrogen atom, a deuterium atom, a substituted or unsubstituted silyl group, a substituted or unsubstituted alkyl group having 1 to 20 carbon atoms, a substituted or unsubstituted aryl group having 6 to 60 ring-forming carbon atoms, or a substituted or unsubstituted heterocycle having 2 to 60 ring-forming carbon atoms, and
at least one of R$_a$, R$_b$, or R$_c$ is represented by Formula A:

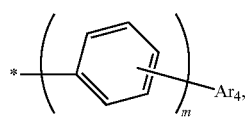

and
wherein, in Formula A,
m is an integer of 0 to 2, and
Ar$_4$ is a substituted or unsubstituted silyl group, a substituted or unsubstituted aryl group having 6 to 60 ring-forming carbon atoms, or a substituted or unsubstituted heterocycle having 2 to 60 ring-forming carbon atoms.

15. The light emitting device of claim 11, wherein the first host comprises at least one among compounds represented by Compound Group 1:

Compound Group 1

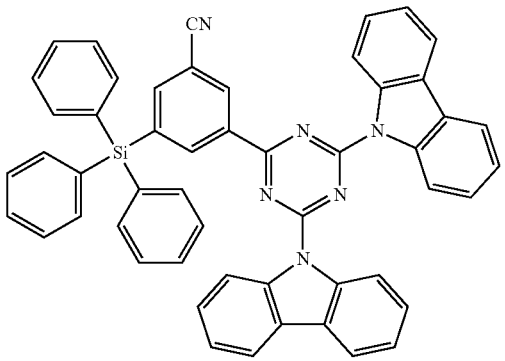

ET02
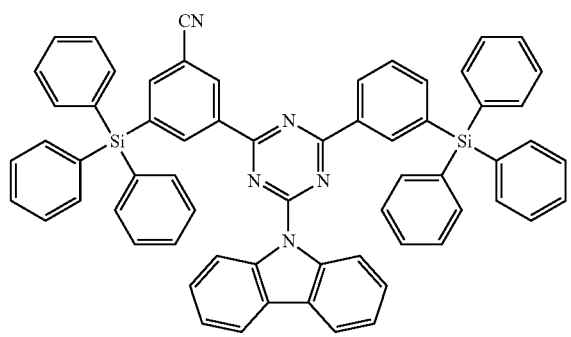
ET03
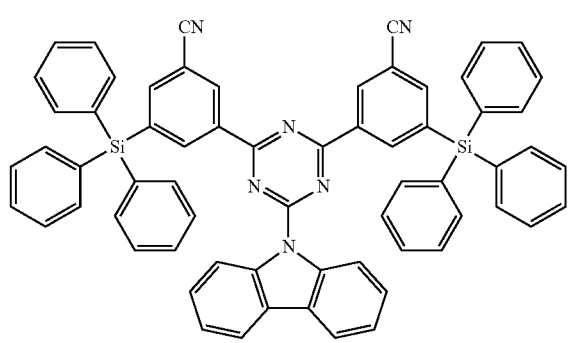
ET04
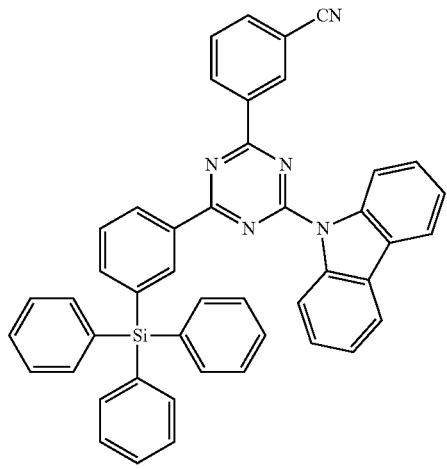
ET05
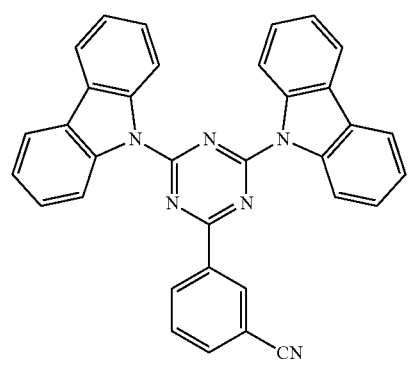
ET06
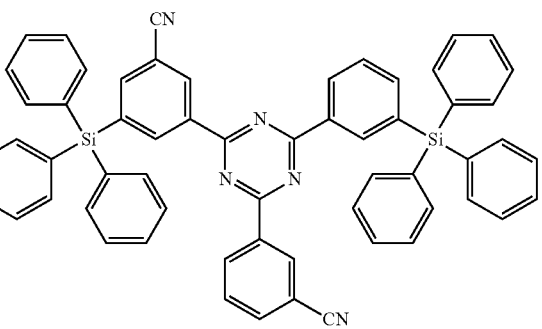
ET07
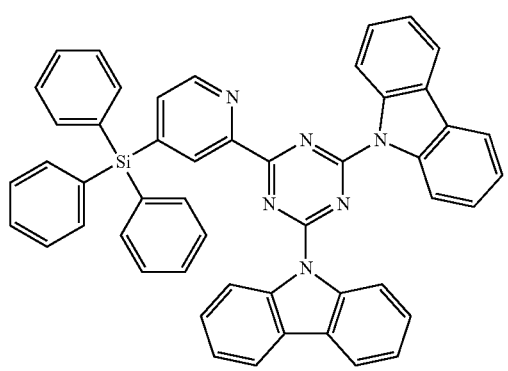
ET08
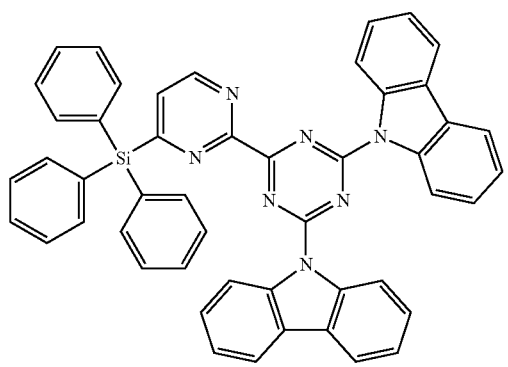
ET09
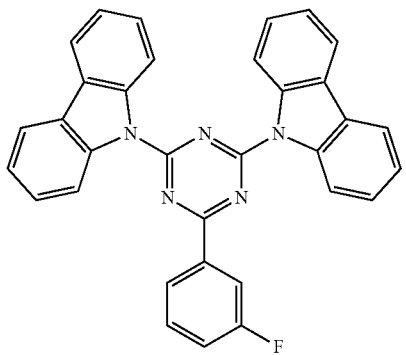

139
-continued
ET10
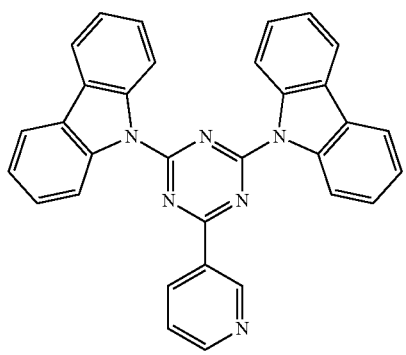
ET11
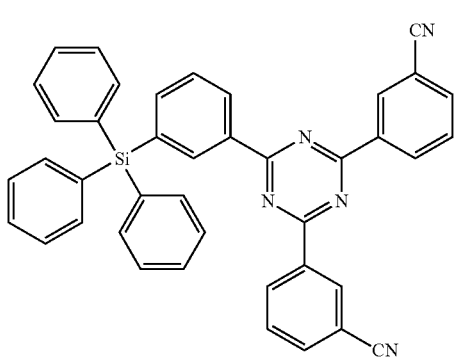
ET12
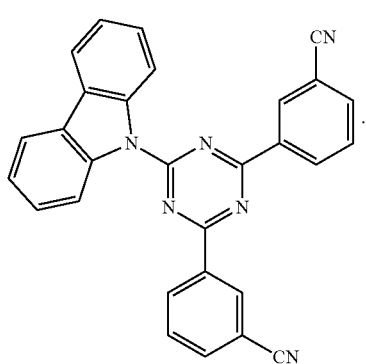
16. The light emitting device of claim 11, wherein the second host comprises at least one among compounds represented by Compound Group 2:
140
Compound Group 2
HT-01
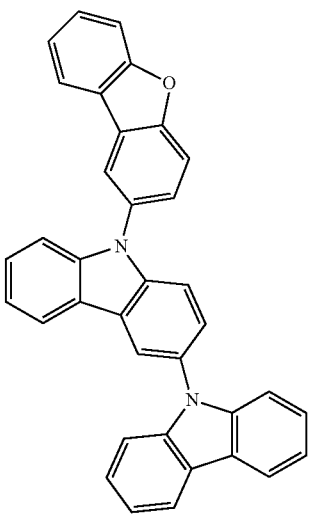
HT-02
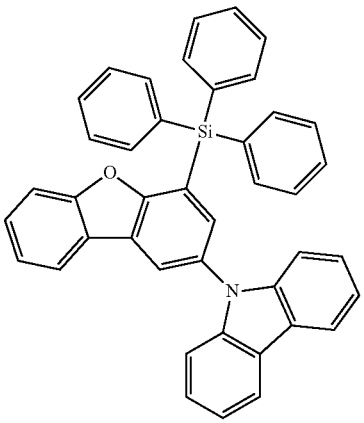
HT-03
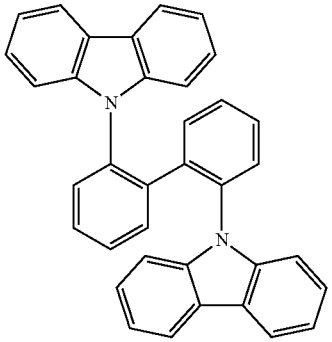

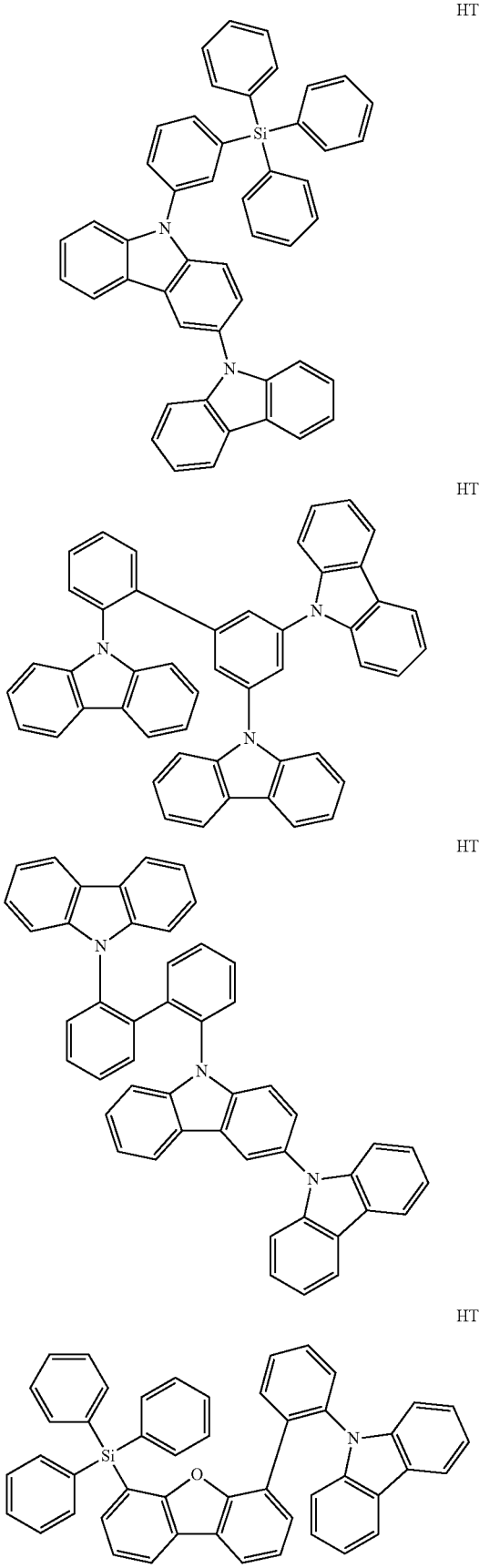
17. The light emitting device of claim 11, wherein the dopant comprises at least one among compounds represented by Compound Group 3:

Compound Group 3
BD01
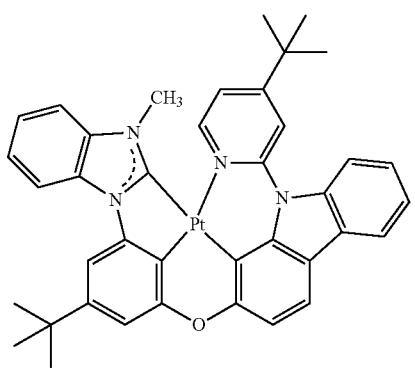
BD02
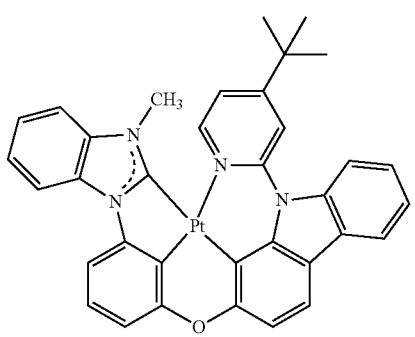
BD03
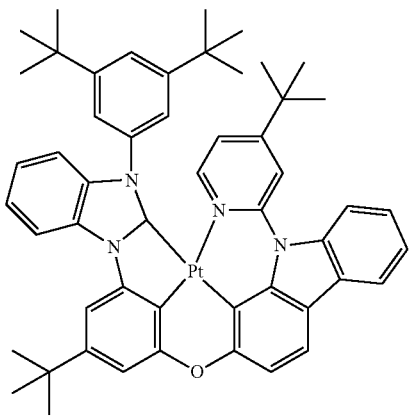
BD04
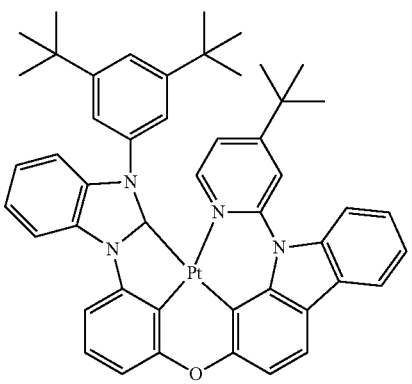
18. The light emitting device of claim 11, wherein the emission layer is to emit blue phosphorescence.
* * * * *

UNITED STATES PATENT AND TRADEMARK OFFICE
CERTIFICATE OF CORRECTION

PATENT NO. : 12,250,873 B2  
APPLICATION NO. : 17/445472  
DATED : March 11, 2025  
INVENTOR(S) : Yoonkyoo Lee et al.

Page 1 of 4

It is certified that error appears in the above-identified patent and that said Letters Patent is hereby corrected as shown below:

In the Claims

In Column 126, Lines 27-38, in Claim 4, Formula 3-1, delete "

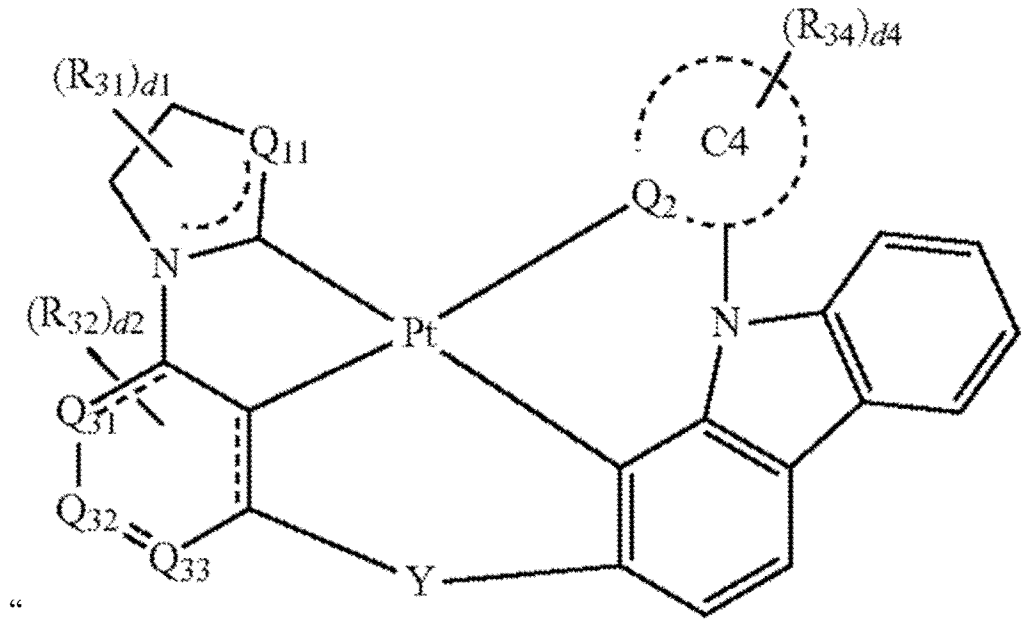

" and

Signed and Sealed this  
Sixteenth Day of September, 2025

Coke Morgan Stewart  
*Acting Director of the United States Patent and Trademark Office*

CERTIFICATE OF CORRECTION (continued)
U.S. Pat. No. 12,250,873 B2 insert -- 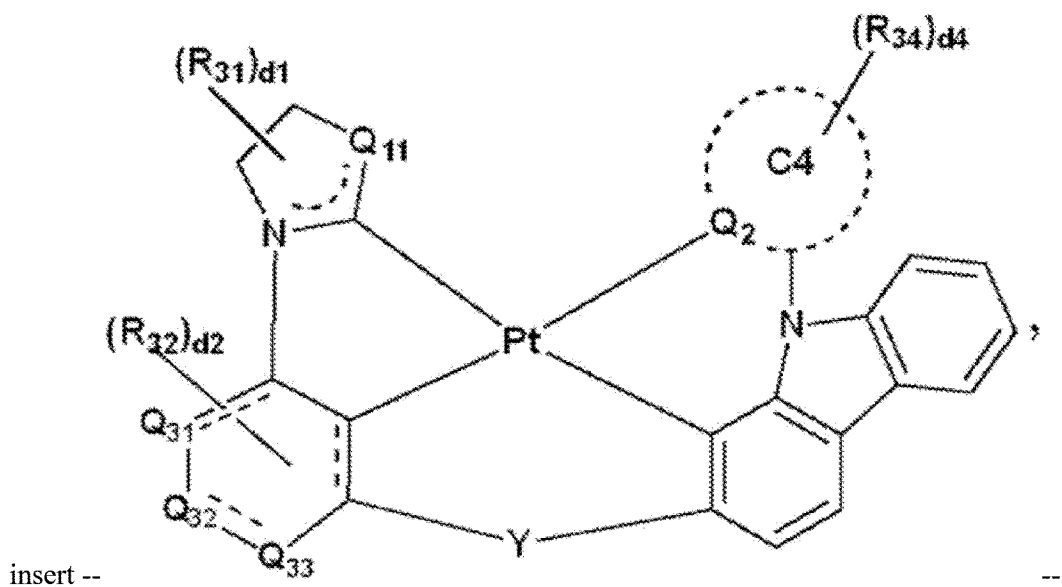 --.

In Column 127, Lines 20-32, in Claim 6, Compound Group 1-ET02, delete

" 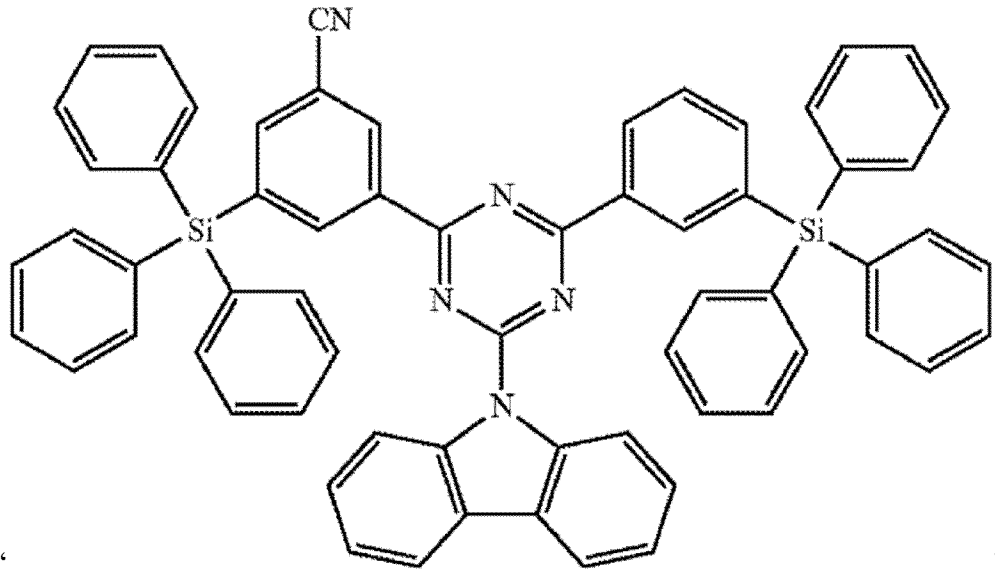 " and

CERTIFICATE OF CORRECTION (continued)
U.S. Pat. No. 12,250,873 B2 insert -- 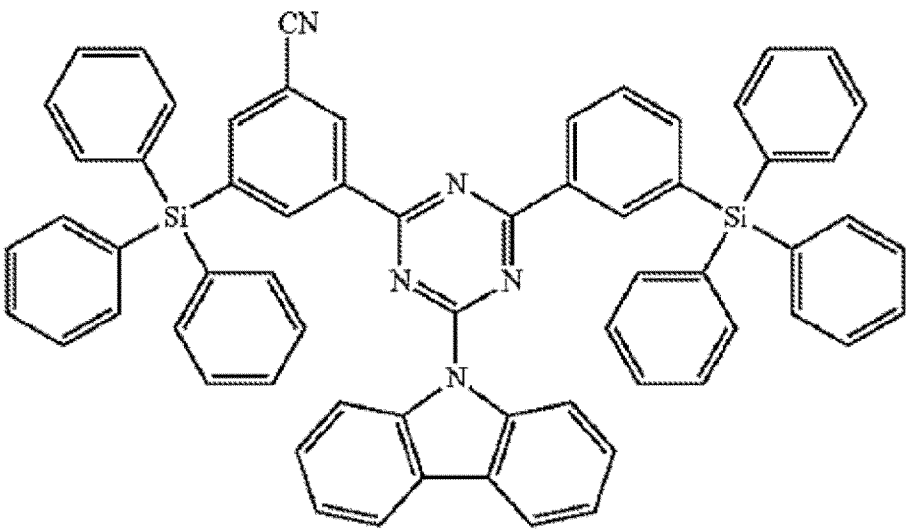 --.

In Column 133, Line 67, in Claim 10, delete "more;" and insert -- more: --.

In Column 134, Line 10, in Claim 10, after "Formula 1" insert -- , --.

In Column 139, Lines 26-38, Claim 15, Compound Group-ET11, delete

" 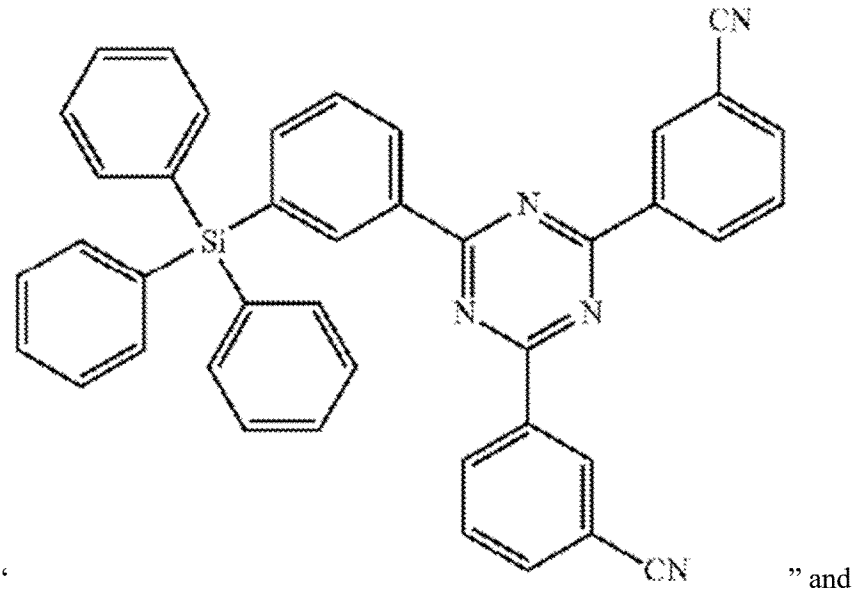 " and

CERTIFICATE OF CORRECTION (continued)
U.S. Pat. No. 12,250,873 B2 insert --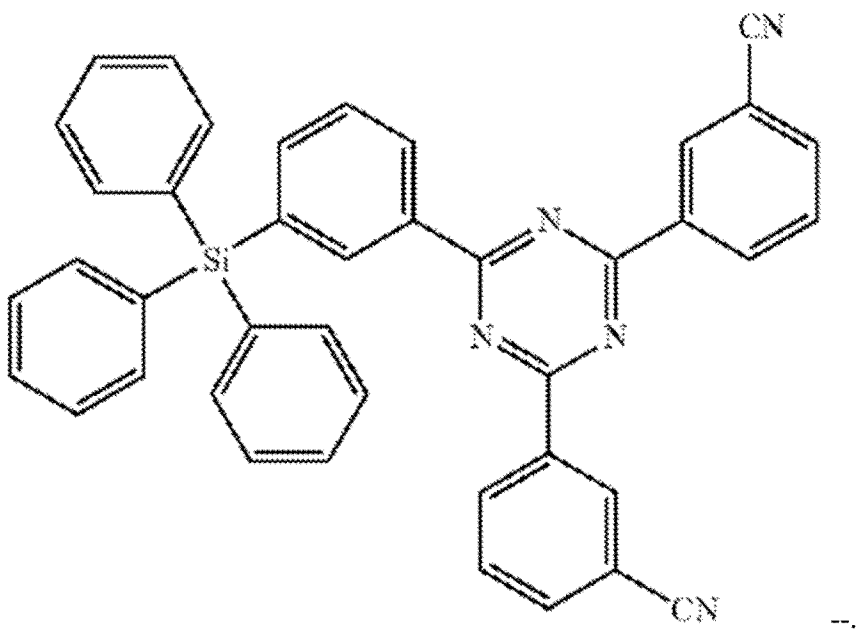--.